(12) United States Patent
Bauer et al.

(10) Patent No.: US 10,460,804 B2
(45) Date of Patent: Oct. 29, 2019

(54) VOLTAGE-CONTROLLED RESISTIVE DEVICES

(71) Applicant: Massachusetts Institute of Technology, Cambridge, MA (US)

(72) Inventors: Uwe Bauer, Cambridge, MA (US); Geoffrey S. D. Beach, Winchester, MA (US)

(73) Assignee: Massachusetts Institute of technology, Cambridge, MA (US)

( * ) Notice: Subject to any disclaimer, the term of this patent is extended or adjusted under 35 U.S.C. 154(b) by 0 days.

(21) Appl. No.: 15/511,006

(22) PCT Filed: Sep. 11, 2015

(86) PCT No.: PCT/US2015/049667
§ 371 (c)(1),
(2) Date: Mar. 13, 2017

(87) PCT Pub. No.: WO2016/040792
PCT Pub. Date: Mar. 17, 2016

(65) Prior Publication Data
US 2017/0249990 A1  Aug. 31, 2017
US 2018/0108412 A9  Apr. 19, 2018

Related U.S. Application Data

(63) Continuation-in-part of application No. PCT/US2015/020736, filed on Mar. 16, 2015, which
(Continued)

(51) Int. Cl.
*G11C 13/06* (2006.01)
*G11C 11/16* (2006.01)
(Continued)

(52) U.S. Cl.
CPC ............ *G11C 13/06* (2013.01); *G11C 11/161* (2013.01); *G11C 11/1675* (2013.01);
(Continued)

(58) Field of Classification Search
CPC ...... H01L 45/1206; H01L 45/08; H01L 43/08
See application file for complete search history.

(56) References Cited

U.S. PATENT DOCUMENTS

2008/0079029 A1  4/2008  Williams
2009/0179245 A1  7/2009  Karg et al.
(Continued)

FOREIGN PATENT DOCUMENTS

DE   102010026098 A1   1/2012
KR   2014-0012025 A    1/2014
(Continued)

OTHER PUBLICATIONS

International Search Report and Written Opinion for Application No. PCT/US2015/020736 dated Jul. 20, 2015.
(Continued)

*Primary Examiner* — Yu-Hsi D Sun
(74) *Attorney, Agent, or Firm* — Smith Baluch LLP

(57) ABSTRACT

Systems, methods, and apparatus are provided for tuning a memristive property of a device. The device (500) includes a layer of a dielectric material (507) disposed over and forming an interface with a layer of an electrically conductive material (506), and a gate electrode (508) disposed over the dielectric material. The dielectric material layer includes at least one ionic species (302) having a high ion mobility. The electrically conductive material is configured such that a potential difference applied to the device can cause the at least one ionic species to migrate reversibly across the
(Continued)

interface into or out of the electrically conductive material layer, to modify the resistive state of the electrically conductive material layer.

25 Claims, 19 Drawing Sheets

Related U.S. Application Data is a continuation-in-part of application No. 14/659,059, filed on Mar. 16, 2015, now abandoned.

(60) Provisional application No. 61/953,689, filed on Mar. 14, 2014, provisional application No. 61/953,677, filed on Mar. 14, 2014, provisional application No. 62/048,830, filed on Sep. 11, 2014.

(51) Int. Cl.
   *H01L 45/00* (2006.01)
   *G11C 19/08* (2006.01)
   *G11C 13/00* (2006.01)
   *B82Y 10/00* (2011.01)

(52) U.S. Cl.
   CPC .......... *G11C 19/0825* (2013.01); *H01L 45/08* (2013.01); *H01L 45/12* (2013.01); *H01L 45/1206* (2013.01); *H01L 45/1226* (2013.01); *H01L 45/146* (2013.01); *B82Y 10/00* (2013.01); *G11C 11/1697* (2013.01); *G11C 13/0007* (2013.01); *G11C 13/0009* (2013.01); *G11C 13/0069* (2013.01); *G11C 2213/15* (2013.01); *G11C 2213/53* (2013.01); *G11C 2213/71* (2013.01); *H01L 45/1253* (2013.01); *H01L 45/14* (2013.01)

(56) References Cited

U.S. PATENT DOCUMENTS

| | | |
|---|---|---|
| 2010/0316831 A1 | 12/2010 | Kubo et al. |
| 2011/0007555 A1 | 1/2011 | Ito |
| 2011/0266605 A1* | 11/2011 | Strukov ............. G11C 13/0002 257/314 |
| 2012/0081774 A1 | 4/2012 | De Paiva Martins et al. |
| 2013/0015542 A1 | 1/2013 | Wang et al. |
| 2013/0328116 A1 | 12/2013 | Chang et al. |
| 2014/0124882 A1 | 5/2014 | Khalili Amiri et al. |
| 2014/0268982 A1 | 9/2014 | Annunziata et al. |
| 2014/0339661 A1 | 11/2014 | Guo |
| 2015/0303313 A1 | 10/2015 | Mallela et al. |
| 2015/0325278 A1 | 11/2015 | Bauer et al. |
| 2017/0084824 A1 | 3/2017 | Bauer et al. |
| 2017/0148982 A1* | 5/2017 | Karpov ................. H01L 45/085 |

FOREIGN PATENT DOCUMENTS

| | | |
|---|---|---|
| WO | WO 2010/074689 A1 | 7/2010 |
| WO | WO 2013/103122 A1 | 7/2013 |

OTHER PUBLICATIONS

International Preliminary Report on Patentability for Application No. PCT/US2015/020736 dated Sep. 22, 2016.
International Search Report and Written Opinion for Application No. PCT/US2015/049667 dated Nov. 27, 2015.
International Preliminary Report on Patentability for Application No. PCT/US2015/049667 dated Mar. 23, 2017.
Graham et al., Resistivity dominated by surface scattering in sub-50 nm Cu wires. Applied Physics Letters. 2010;96(042116):1-3.
Manchon et al., Analysis of oxygen induced anisotropy crossover in Pt/Co/MOx trilayers. Journal of Applied Physics. 2008;104(043914):1-7.
Wu et al., Influence of surface and grain-boundary scattering on the resistivity of copper in reduced dimensions. Applied Physics Letters. Apr. 2004;84(15):2838-40.

* cited by examiner

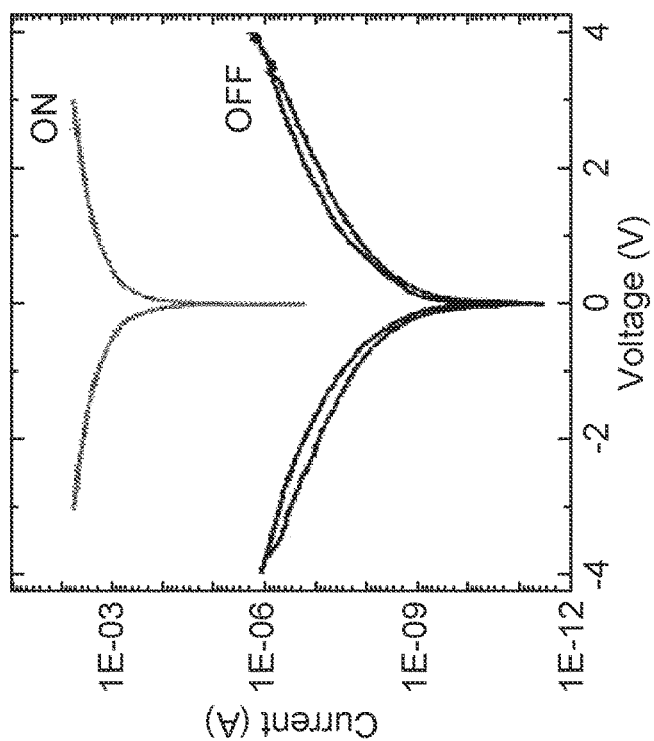
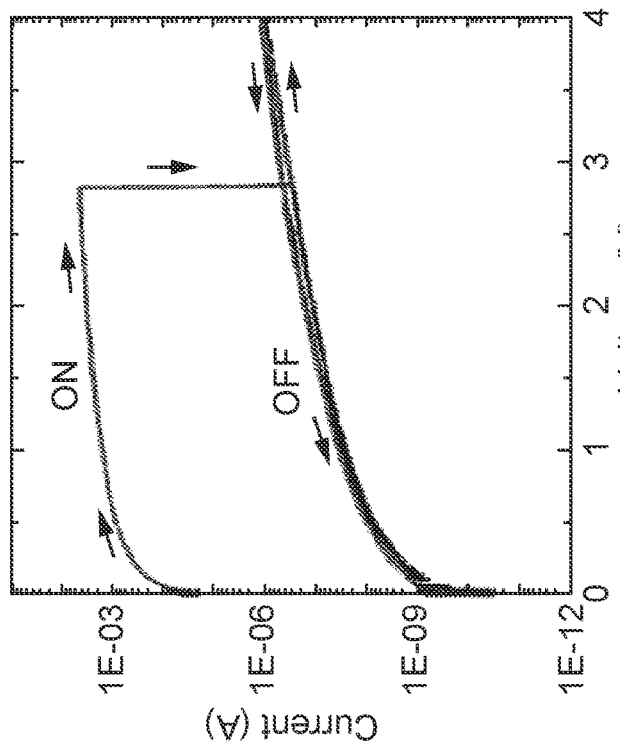
FIG. 13A
FIG. 13B

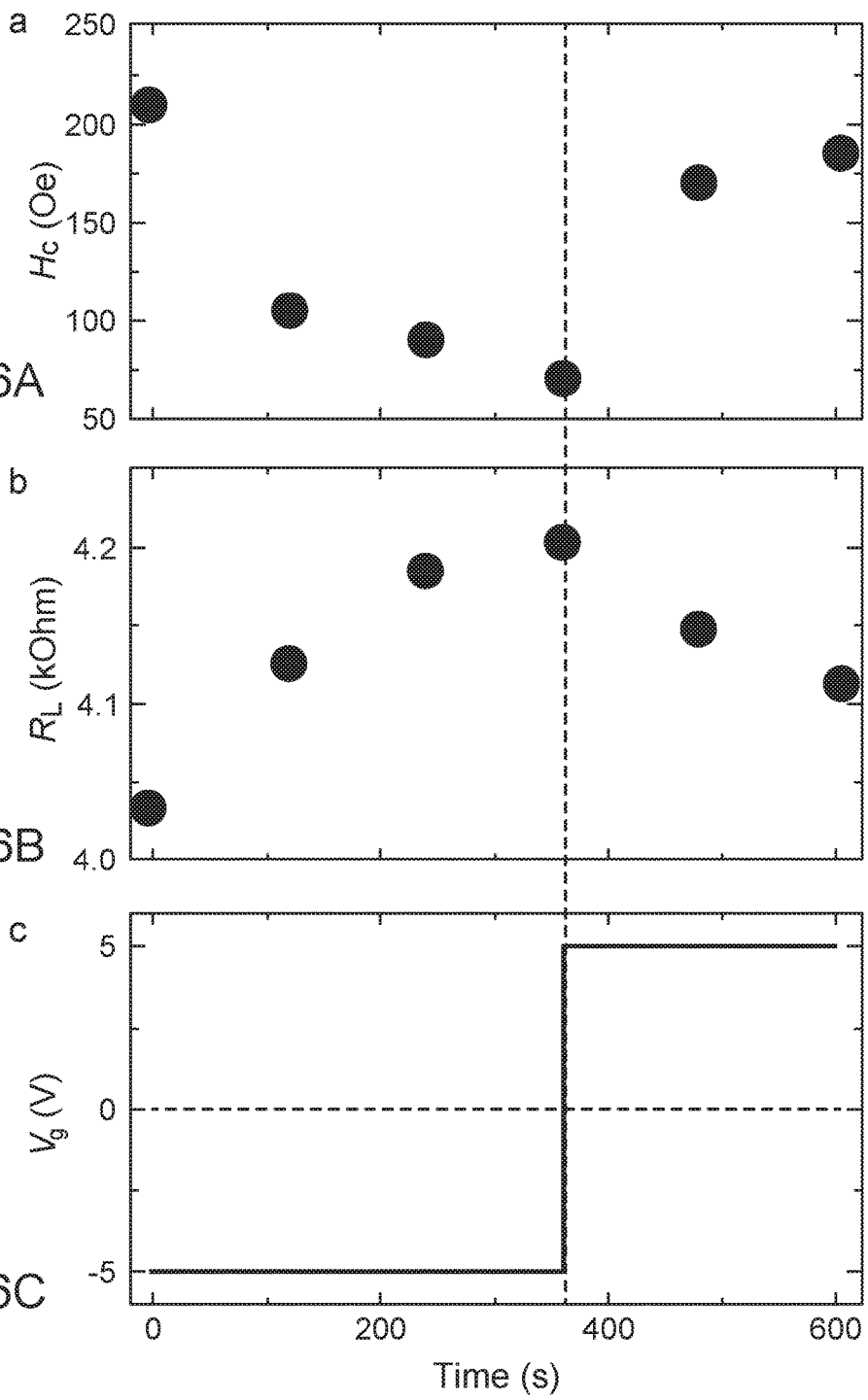

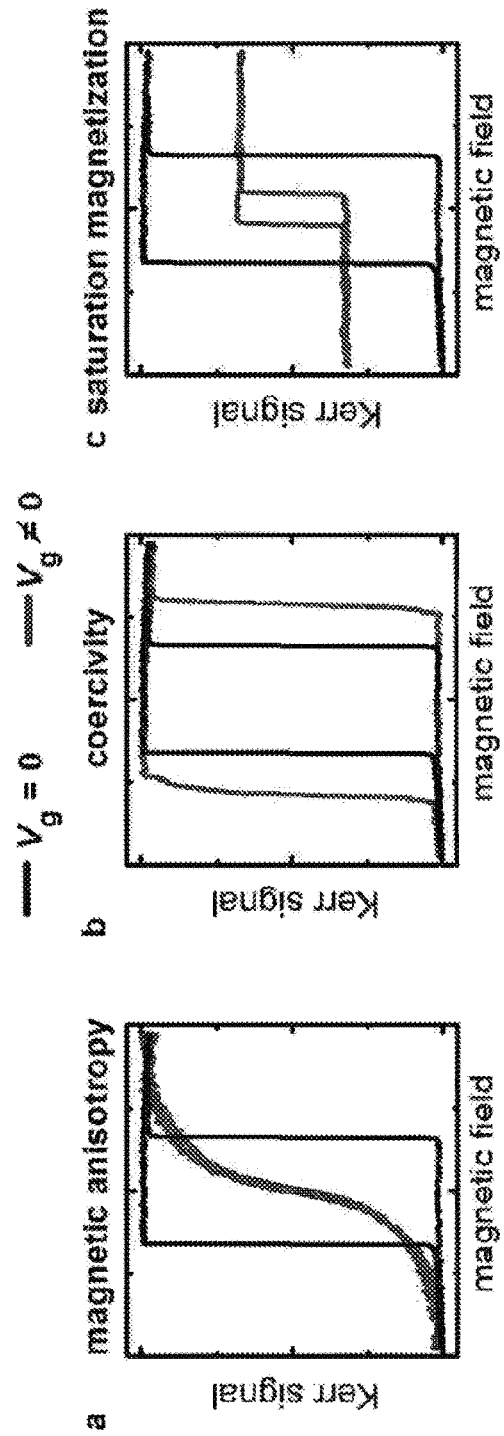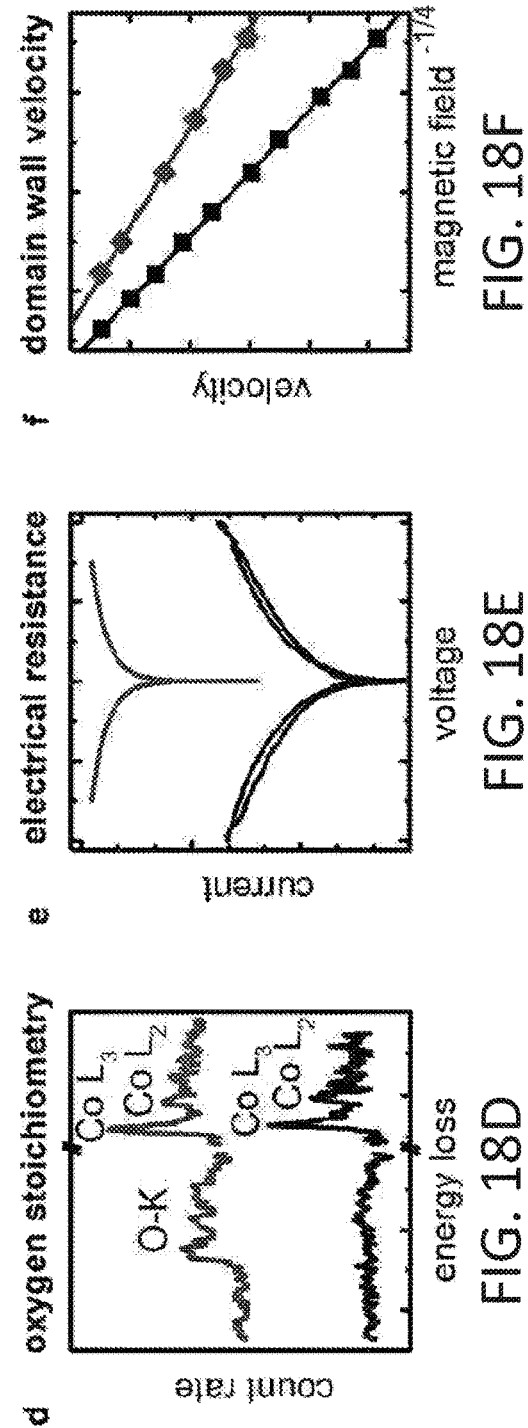
FIG. 18A, FIG. 18B, FIG. 18C, FIG. 18D, FIG. 18E, FIG. 18F

VOLTAGE-CONTROLLED RESISTIVE DEVICES

CROSS-REFERENCES TO RELATED APPLICATIONS

This Application is a national stage filing under 35 U.S.C. § 371 of International Application No. PCT/US2015/049667 filed Sep. 11, 2015, entitled "VOLTAGE-CONTROLLED RESISTIVE DEVICES," which is a continuation-in-part of PCT/US2015/020736 filed Mar. 16, 2015, entitled "VOLTAGE REGULATION OF DEVICE FUNCTIONAL PROPERTIES."

Application PCT/US2015/020736 claims priority under 35 U.S.C. § 119(e) to U.S. Provisional Application Ser. No. 61/953,689, filed on Mar. 14, 2014, entitled "METHODS, MATERIALS AND SYSTEMS FOR VOLTAGE PROGRAMMING MATERIAL PROPERTIES" which is herein incorporated by reference in its entirety.

Application PCT/US2015/049667 is a continuation-in-part of U.S. patent application Ser. No. 14/659,059, filed on Mar. 16, 2015, entitled "VOLTAGE-CONTROLLED SOLID-STATE MAGNETIC DEVICES," which claims the benefit under 35 U.S.C. § 119(e) to U.S. Provisional Application 61/953,677, filed on Mar. 14, 2014, entitled "VOLTAGE-CONTROLLED SOLID-STATE MAGNETIC DEVICES" which are herein incorporated by reference in their entireties.

Application PCT/US2015/049667 claims priority under 35 U.S.C. § 119(e) to U.S. Provisional Application Ser. No. 62/048,830, filed on Sep. 11, 2014, entitled "LATERAL VOLTAGE-CONTROLLED PERSISTENT RESISTIVE SWITCH AND APPLICATIONS AS TUNABLE LATERAL MEMORY RESISTOR DEVICE" which is herein incorporated by reference in its entirety.

GOVERNMENT SUPPORT

This invention was made with Government support under Grant No. DMR-0819762 and EECS-1128439 awarded by the National Science Foundation. The Government has certain rights in the invention.

BACKGROUND

Memristors or "memory resistors" are nanoscale ionic systems that often rely on ion-migration-induced resistance changes in thin oxide films for their nonvolatile memory functionality. Memristive switching devices are of great interest in computer technology due to their potential integration into next generation nonvolatile memories. Memristor technology is nonvolatile, scalable down to less than 10 nm, and offers low-power nanosecond-timescale switching.

SUMMARY

The Inventors have recognized and appreciated that a novel type of memristor would be beneficial. In view of the foregoing, various embodiments are directed generally to methods, apparatus, and systems for providing novel memristive elements and memristive devices based on such memristive elements.

Example methods, apparatus, and systems are described for providing an example memristive element that includes a conductive material layer disposed in the x-y plane, a first electrode coupled proximate to a first end of the conductive material layer, a second electrode coupled proximate to a second end of the conductive material layer, opposite to the first end, a gate dielectric layer disposed over the conductive material layer, and a gate electrode layer disposed over, and in electrical communication with, the gate dielectric material layer. The conductive material layer is configured to reversibly uptake an amount of at least one ionic species. The gate dielectric layer is configured to supply to, or receive from, the conductive material layer, an amount of the at least one ionic species. The gate electrode layer, the gate dielectric layer, and the conductive material layer are configured such that a first potential difference applied in a first direction between the gate electrode layer and the conductive material layer modifies a proportionate amount of the at least one ionic species in a portion of the conductive material layer to generate a first memristive state including a first lateral resistive state between the first electrode and the second electrode, and a second potential difference applied in a second direction between the gate electrode layer and the conductive material layer modifies a proportionate amount of the at least one ionic species in a portion of the conductive material layer to generate a second memristive state comprising a second lateral resistive state between the first electrode and the second electrode that is different from the first lateral resistive state. The memristive element persists in the first memristive state or the second memristive state in response to discontinuance of the first potential difference or the second potential difference, respectively.

In an example, the first memristive state can further include a first vertical resistive state between the conductive material layer and the gate electrode layer, and the second memristive state can further include a second vertical resistive state between the conductive material layer and the gate electrode layer that is different from the first vertical resistive state.

In an example, the conductive material layer can include aluminum, a transition metal, a rare earth metal, or an alloy of any of these materials.

In an example, the gate dielectric layer is a bilayer that includes an ionic species storage layer disposed over an ionic species transporting layer, and the ionic species transporting layer of the bilayer is disposed over the conductive material layer.

In an example, the conductive material layer has a first lateral dimension in the x-direction, and the gate electrode layer has a second lateral dimension in the x-direction that is smaller than the first lateral dimension. The gate dielectric layer can have a third lateral dimension in the x-direction that approximates the second lateral dimension of the gate electrode layer.

In an example, the relative lateral dimensions of the conductive material layer, gate dielectric layer, and the gate electrode layer are configured to tune the first memristive state and the second memristive state.

An example memristive element herein can further include an inert metal underlayer disposed in electrical communication with the conductive material layer. The thickness of the inert metal underlayer relative to the thickness of the conductive material layer can be configured to tune the first memristive state and the second memristive state.

In an example, the thickness in a z-direction of the inert metal underlayer can be configured to cause a greater proportion of current applied between the third electrode and the fourth electrode to flow through the inert metal underlayer, thereby modifying the first lateral resistive state and the second lateral resistive state.

In an example, the thickness in a z-direction of the inert metal underlayer can be configured to cause a smaller proportion of current applied between the third electrode and the fourth electrode to flow through the inert metal underlayer, thereby modifying the first lateral resistive state and the second lateral resistive state.

An example memristive element herein can further include a third electrode coupled to the first end of the conductive material layer and a fourth electrode coupled to the second end of the conductive material layer, such that a current can be applied across the third electrode and the fourth electrode. Such an example configuration allows four-point measurements of the first lateral resistive state and the second lateral resistive state.

In an example, the gate dielectric layer is formed from an oxide, oxynitride, or silicate of a rare earth metal or a transition metal, yttria-stabilized zirconia (YSZ), or a gate oxide hetero structure.

In an example, the conductive material layer can have a longitudinal conformation in the x-y plane, such as but not limited to being formed as a nanostrip.

Example memristive elements herein can be formed as an example multi-bit device. In an example multi-bit device, the gate dielectric layer can include two or more gate dielectric layers disposed over spaced apart respective regions of the conductive material layer, each having a respective lateral dimension in a x-direction that is smaller than a first lateral dimension in the x-direction of the conductive material layer. The gate electrode layer of the multi-bit device can include two or more gate electrode layers, each disposed over, and in electrical communication with, a respective gate dielectric layer of the two or more gate dielectric layers.

In an example, all bits of the example multi-bit device can be addressed simultaneously by probing a resistance state of the conductive material layer.

In an example, each respective lateral dimension of the two or more gate dielectric layers can have a differing value, such that a potential difference applied at each respective gate electrode modifies the first memristive state and the second memristive state at each respective region of the memristive element by a preselected fractional amount.

In an example, the example multi-bit device can further include an inert metal underlayer disposed in electrical communication with a portion of the conductive material layer proximate to at least one gate dielectric layer of the two or more gate dielectric layers. The thickness of the inert metal underlayer can have a predetermined value such that a potential difference applied at each respective gate electrode modifies the first memristive state and the second memristive state at each respective region of the memristive element by a preselected fractional amount.

In an example, the conductive material layer of the example multi-bit device can be disposed over at least one of: an electrically conductive layer, at least one ferromagnetic material layer, at least one oxide dielectric layer, a tunnel barrier layer, and an integrated circuit.

Example methods, apparatus, and systems are described for operating a memristive device. The method can include applying a potential difference at a region of a gate electrode and a conductive material layer of the memristive device, and measuring a lateral resistive state between the first electrode and the second electrode. The memristive device includes a conductive material layer disposed in an x-y plane, a first electrode coupled proximate to a first end of the conductive material layer, a second electrode coupled proximate to a second end of the conductive material layer, opposite to the first end, a gate dielectric layer disposed over the conductive material layer, and a gate electrode layer disposed over, and in electrical communication with, the gate dielectric material layer. The conductive material layer is configured to reversibly uptake an amount of at least one ionic species. The gate dielectric layer is configured to supply to, or receive from, the conductive material layer an amount of the at least one ionic species. The gate electrode layer, the gate dielectric layer, and the conductive material layer are configured such that the measuring indicates a first lateral resistive state in response to applying a first potential difference in a first direction, and the measuring indicates a second lateral resistive state that is different from the first lateral resistive state in response to applying a second potential difference in a second direction that is opposite to the first direction.

In an example, the conductive material layer has a first lateral dimension in a x-y plane, and the gate electrode layer has a second lateral dimension in the x-y plane that is smaller than the first lateral dimension.

In an example, the memristive device can further includes an inert metal underlayer disposed in electrical communication with the conductive material layer.

Example methods, apparatus, and systems also are described for programming information to a memristive device. The method includes applying a potential difference at a region of a gate electrode and a transition metal layer of a memristive device, and measuring a lateral resistive state between the first electrode and the second electrode. The memristive device includes a transition metal layer disposed in an x-y plane and having a first lateral dimension in the x-direction, a first electrode coupled proximate to a first end of the transition metal layer, a second electrode coupled proximate to a second end of the transition metal layer, opposite to the first end, a gate oxide dielectric layer disposed over the transition metal layer, and a gate electrode layer disposed over, and in electrical communication with, the gate oxide dielectric material layer. The gate oxide dielectric layer includes a rare earth oxide or a transition metal oxide, and has a second lateral dimension in the x-direction that is smaller than the first lateral dimension of the transition metal layer. The transition metal layer is configured to reversibly uptake an amount of at least one ionic species. The gate oxide dielectric layer is configured to supply to, or receive from, the conductive material layer an amount of the at least one ionic species. The gate electrode layer, the gate oxide dielectric layer, and the conductive material layer are configured such that the measuring indicates a first vertical resistive state and a first lateral resistive state in response to applying a first potential difference, and the measuring indicates a second vertical resistive state that is different from the first vertical resistive state and a second lateral resistive state that is different from the first lateral resistive state in response to applying a second potential difference in a second direction that is opposite to the first direction.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 13A-13B show example of memristive switching in example memristive devices, according to principles of the present disclosure.

FIGS. 16A-16C show the plots of results of computation of lateral resistive switching

FIGS. 18A-18F show plots of the use of gate voltages for control and programming of properties of example devices, according to principles of the present disclosure.

DETAILED DESCRIPTION

Figure 1A:
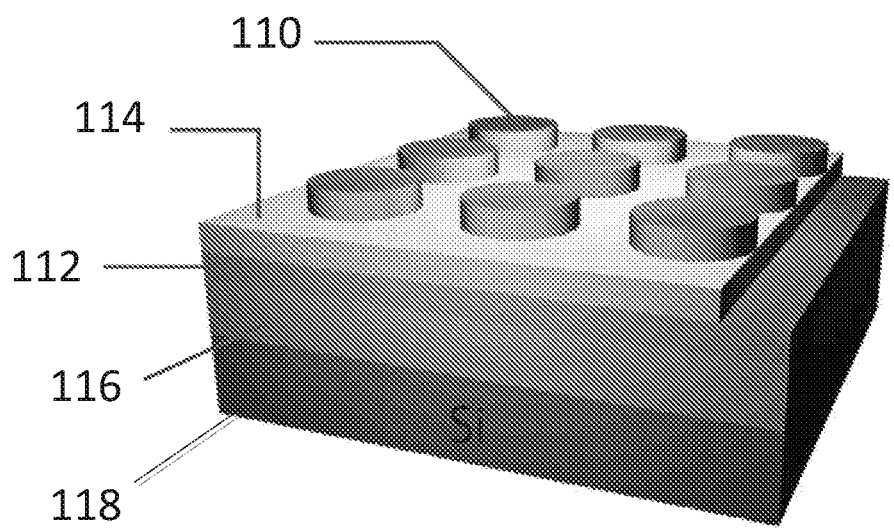
FIGS. 1A-1B show conventional memristive devices, according to principles of the present disclosure.

Following below are more detailed descriptions of various concepts related to, and embodiments of, inventive methods, apparatus, and systems for novel devices based on controlled resistive states. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

As used herein, the term "includes" means includes but is not limited to, the term "including" means including but not limited to. The term "based on" means based at least in part on.

With respect to layers, substrates or other surfaces described herein in connection with various examples of the principles herein, any references to "top" surface and "bottom" surface are used primarily to indicate relative position, alignment and/or orientation of various elements/components with respect to the substrate and each other, and these terms do not necessarily indicate any particular frame of reference (e.g., a gravitational frame of reference). Thus, reference to a "bottom" of a substrate or a layer does not necessarily require that the indicated surface or layer be facing a ground surface. Similarly, terms such as "over," "under," "above," "beneath," "underneath" and the like do not necessarily indicate any particular frame of reference, such as a gravitational frame of reference, but rather are used primarily to indicate relative position, alignment and/or orientation of various elements/components with respect to the substrate or layer (or other surface) and each other. The terms "disposed on" and "disposed over" encompass the meaning of "embedded in," including "partially embedded in." In addition, reference to feature A being "disposed on," "disposed between," or "disposed over" feature B encompasses examples where feature A is in contact with feature B, as well as examples where other layers and/or other components are positioned between feature A and feature B.

The emerging field of nanoionics covers a wide range of phenomena that result from ionic migration in solid-state nanoscale systems. Similar to quantum confinement effects in nanoelectronics, ionic transport is drastically changed when the material dimensions are reduced to 10 s of nanometers. At this length scale, the barriers for ionic transport are greatly reduced and interface effects can become prevalent and dominate the ionic properties of the whole material. These effects can markedly enhance ionic conductivity, turn materials that are ionic insulators in the bulk into good ionic conductors, and significantly reduce the operational temperature of solid-state ionic devices.

The crossover from macroscale to nanoscale systems is characterized by the emergence of interface effects. In nanoscale materials, many physical and chemical properties are influenced by the structure and composition of their interfaces. For instance, in metal/metal-oxide heterostructures, chemical, electronic, magnetic, and mechanical properties can emerge from interfacial oxygen stoichiometry and defect structure. Example systems, methods, apparatus and devices described herein allow the dynamic control of these interface characteristics with an electric field, which can pave the way towards voltage control of these properties in solid-state devices. Example systems, methods, apparatus and devices described herein demonstrate that interfacial chemistry in metal/metal-oxide bilayers can indeed be electrically-gated using all-solid-state devices, operating at low voltage and within the typical operating temperature range of common semiconductor electronics.

Metal/oxide/metal devices are pervasive in solid state ionics and form the common basis of a wide range of applications, from oxygen sensors, to solid oxide fuel cells, and memristive switching memories. Memristive switching memories or memristors are true nanoscale ionic systems and typically rely on ion-migration-induced resistance changes in thin oxide films for their nonvolatile memory functionality.

In nanoscale materials, many functional and structural properties can be determined by the structure and/or composition at the interfaces. If the dimensionality of a material is reduced and it is scaled down from the macroscale to the nanoscale, the structure and composition of interfaces in the material, rather than the bulk portions of the material, can exert much greater influence on functional and/or structural properties.

As a non-limiting example, materials formed with metal/metal-oxide bilayers are of high interest for technological applications due to their wide applicability. Metal/metal-oxide bilayers have a wide range of applications, from catalysts to coatings to semiconductor electronics. For example, in metal/metal-oxide bilayers, physical and chemical properties can depend strongly on oxygen stoichiometry and defect structure at the metal/oxide interface. Some of these properties that can be controlled and modulated by metal/metal-oxide interface include catalytic activity, charge transport, ionic exchange, magnetic properties, electrical properties, thermal conduction, and mechanical behavior.

Example systems, methods, apparatus and devices according to the principles herein provide capabilities to control the oxygen stoichiometry at the metal oxide interface through application of a gate voltage. Through these capabilities, properties such as, but not limited to, catalytic activity, charge transport, ionic exchange, magnetic properties, electrical properties, thermal conduction, and mechanical behavior, can be controlled electrically. The example systems, methods, apparatus and devices herein can be integrate them into solid state devices.

Figure 1B:
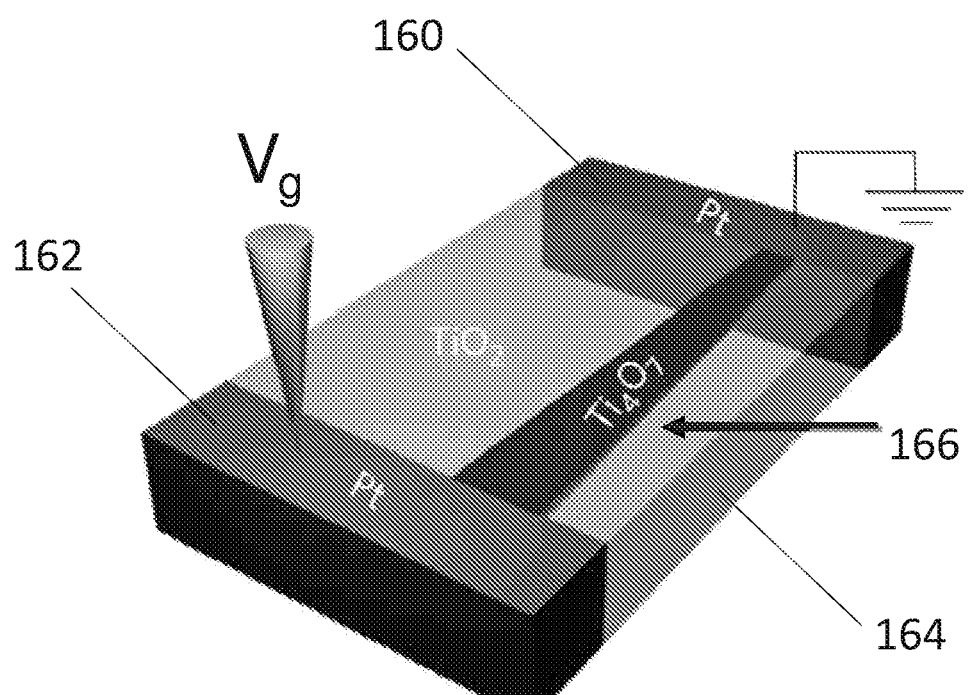

A memristor (memory resistor) is a two terminal device that can remain in either a high resistance state ($R_{high}$) or a low resistance state depending on the history of applied voltage and current. Some existing memristive switching devices are formed from two electrodes separated by a thin insulating layer. FIG. 1A shows an example memristive device that includes a first electrode 110 and a second electrode 112, with an insulating layer 114 disposed between electrodes 110 and 112. Many conventional memristive devices are formed as a vertical stack of a bottom electrode layer formed from platinum (Pt), an insulating layer of titanium dioxide ($TiO_2$), and a top electrode layer formed from platinum (Pt). In the example of FIG. 1A, the memristive device can include a substrate formed from silicon dioxide ($SiO_2$) 116 over silicon (Si) 118. Lateral geometries with two laterally separated electrodes on top of an insulating layer have also been explored. FIG. 1B shows an example of a memristive device with laterally separated electrodes 160 and 162 formed from platinum, and an insulating layer 164 formed from $TiO_2$.

For both of the device geometries in FIGS. 1A and 1B, the resistance state of the device is given by the resistance across the insulating layer. For the memristive switching, application of a voltage (Vg) or current across the insulating layer typically results in the formation of a conductive filament 166 through the insulating layer 164. In this example device, the filament is formed from $Ti_4O_7$. The application of the voltage induces migration of $O^{2-}$ ions and oxygen vacancies within the insulating layer. Application of the voltage in a first direction causes formation of the conducting filament, while application of the voltage in a second direction breaks the conducting filament. Conductive filament formation is a statistical process which is hard to control, difficult to predict, and usually occurs under condition close to dielectric breakdown of the insulating layer. After the filament is established, the resistance state of the device is then controlled by breaking and reestablishing the filament (see FIG. 1B). Many such memristive switching devices are formed using metal electrodes and oxide insulators.

Figure 2A:
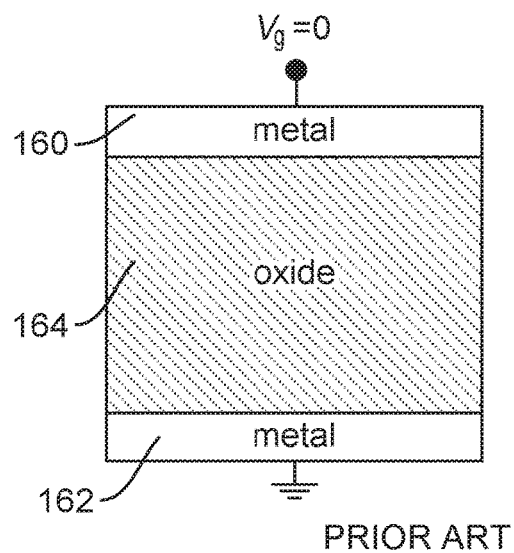
FIGS. 2A-2D show examples of memristive switching in a memristor, according to principles of the present disclosure.
Figure 2B:
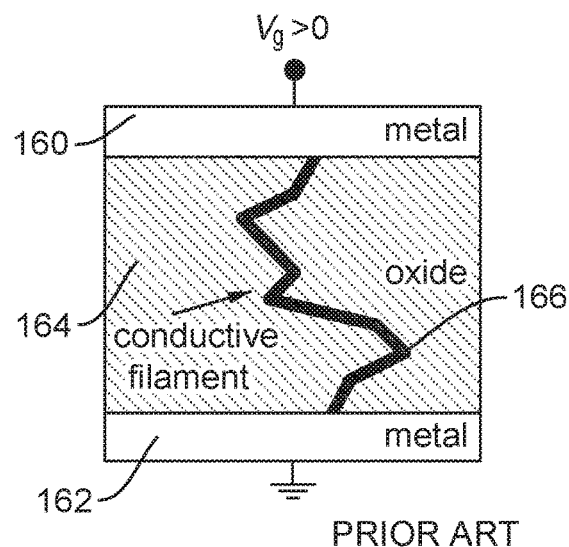
Figure 2C:
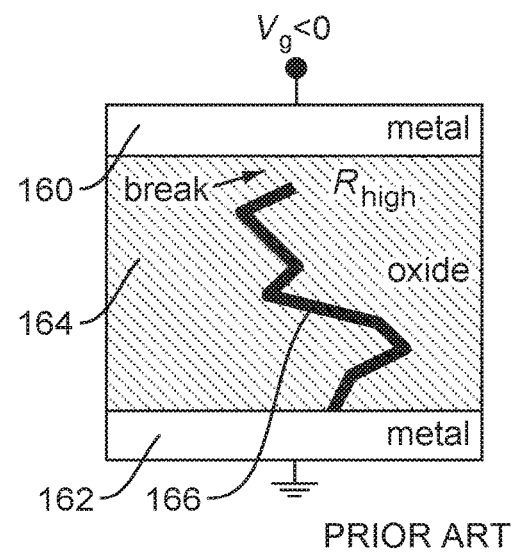
Figure 2D:
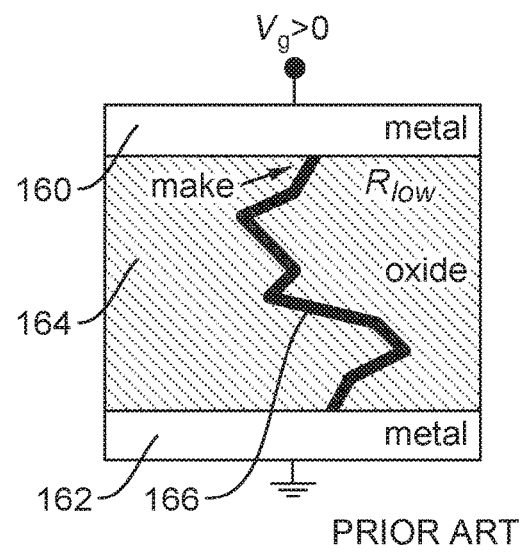

FIGS. 2A-2D show examples of memristive switching in an example device formed as a metal/oxide/metal memristor. A schematic illustration of bipolar memristive switching in the metal/oxide/metal memristor is provided. As shown in FIG. 2A, the example memristive switching device is formed from two metal electrodes 160, 162 separated by an oxide insulator 164. FIG. 2A also shows the example memristive switching device in its virgin state (i.e., prior to the application of a high bias voltage). FIG. 2B shows the conductive filament 166 that can form with application of a high bias voltage (Vg>0). The high bias voltage Vg results in the formation of the conductive filament 166 between the two electrodes 160, 162. This process is also referred to as electroforming. FIGS. 2C-2D show the state of the conductive filament with further cycling of the polarity of the voltage, from negative (Vg<0) to positive (Vg>0). Depending on the bias polarity, the conductive filament 166 can be broken (FIG. 2C) or reestablished (FIG. 2D). This causes switching of the resistance state of the device from high $R_{low}$ to low $R_{high}$ and vice versa (i.e., from low $R_{high}$ to high $R_{low}$). Breaking and reestablishing the conductive filament results in the characteristic hysteretic switching of the resistance state. Memristors can be categorized by their current-voltage characteristics (i.e., as bipolar or unipolar) and active ionic species (anion or cation).

Similar to many existing devices, the memristors of FIGS. 1A-1B and 2A-2D are configured to prevent, or significantly reduce the possibility of, migration of ionic species from the dielectric material layer to an adjacent electrically conductive layer. The migration of ionic species into any portion of an adjacent electrically conductive layer can be a breakdown mechanism of a device, such as a shorting. For example, diffusion barriers may be used in these devices to prevent such ionic species migration. As another example, the electrically conductive material layer can be formed from a conductive material that is not conducive to ionic species migration (such as platinum), or that reduces or prevents the ionic species migration in normal operation (such as noble metals). The electrically conductive layer could also be made of other conducting material that do not strongly interact or react with the mobile ionic species in the dielectric material layer. In some cases, one of the terminals of the device could be replaced with a conductor in close proximity to the device multilayer structure, such as the tip of a scanning probe microscope.

Electric-field-driven ion transport can be exploited in other a range of electrochemical devices, such as oxygen gas sensors and solid oxide fuel cells. At the nanoscale, voltage-induced $O^{2-}$ migration is a mechanism for resistive switching in anionic metal/oxide/metal memristors.

The oxygen anion $O^{2-}$, or equivalently, the positively charged oxygen vacancy $VO^{2+}$, is the mobile ionic species. These devices typically rely on nanoscale metal-oxide insulators. A wide range of metal-oxides have been explored in memristive devices, such as magnesium oxide MgO, titanium oxide TiOx, tantalum oxide TaOx and aluminum oxide AlOx. Memristive switching can originate from defects in the material and not from a particular electronic band structure. Many different oxide materials exhibit memristive switching.

Example systems, methods, apparatus and devices of the instant disclosure exploit voltage-driven oxygen transport to control interfacial properties and phenomena in metal/metal-oxide structures. According to the principles herein, the voltage-gated control of oxygen stoichiometry allow control over not only the magnetic properties of devices, and also is used to switch the vertical and lateral electrical resistance in the devices. As a non-limiting example, the devices can be based on a transition-metal/metal-oxide bilayer structure. The example systems, methods, apparatus and devices demonstrate the broad applicability of solid-state switching of interface oxygen chemistry to control material properties.

Applicants have developed novel devices, and systems, methods and apparatus incorporating such example devices, that exploit the reversible migration of ionic species from a dielectric material layer to an adjacent electrically conductive layer to regulate (and tune) the resistive state of the example devices. An example device herein can provide for control one or both of a vertical resistive state and a lateral resistive state.

In contrast to many existing memristors, including the memristors of FIGS. 1A-1B and 2A-2D, an example memristive switching device according to the principles herein is formed as a three-terminal devices or a device with greater than three terminals. At least two of the terminals can be used to drive a current through an electrically conductive material layer. An electronically insulating dielectric material layer is disposed over and covers at least a portion of the electrically conductive material layer. The dielectric material layer simultaneously acts as a good ionic conductor. At least one gate electrode layer disposed over at least a portion of the dielectric material layer serves as the third terminal of the example memristive switching device.

Figures 3A, 3B, 3C:
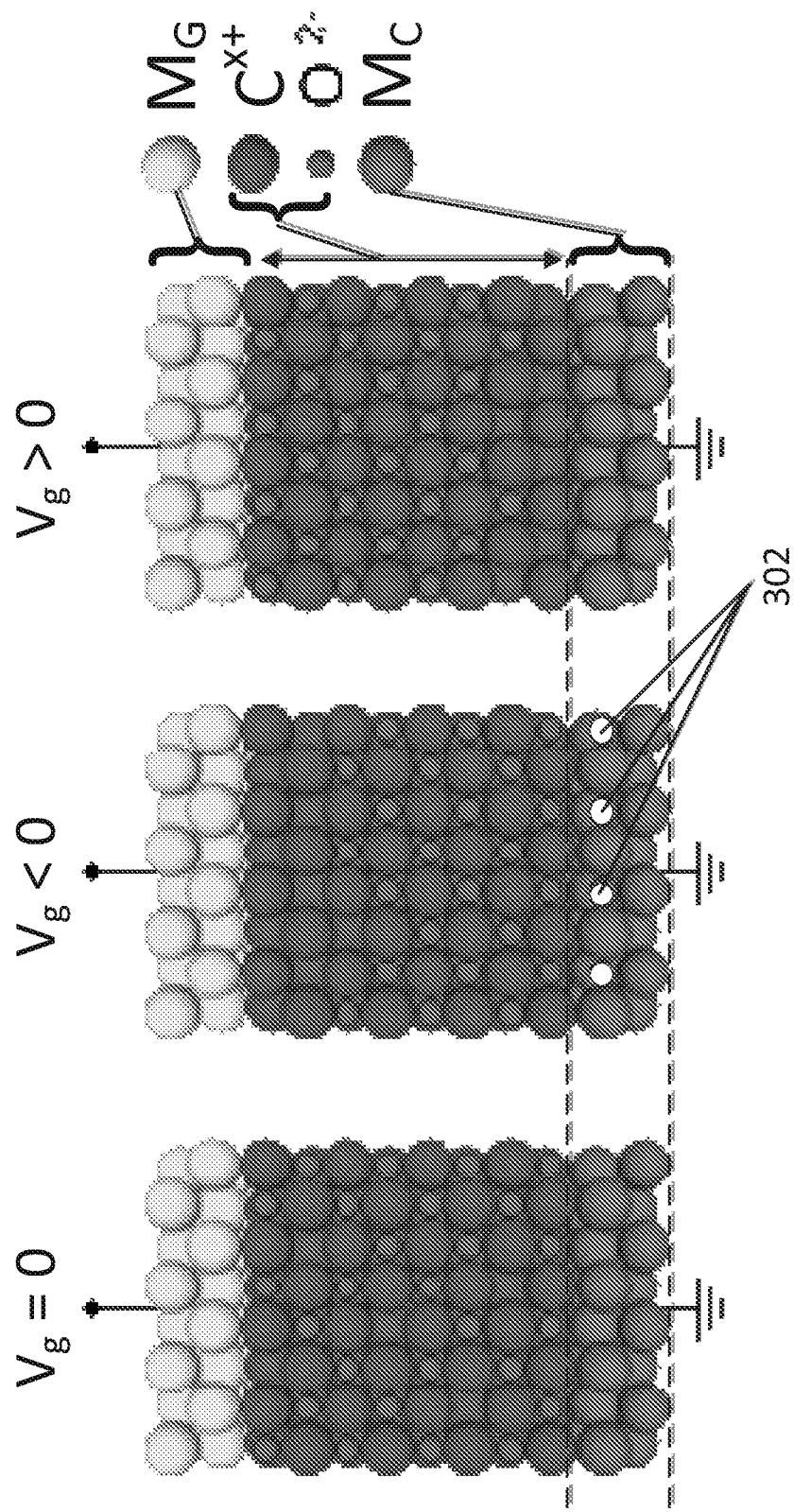
FIGS. 3A-3C show schematic representations of an example device structure, according to principles of the present disclosure.

FIGS. 3A-3C show schematic representations of an example device structure and oxygen ion motion in the device under differing gate voltages (positive and negative gave voltages). The example device of FIG. 3A includes a conductive material layer ($M_C$) that forms an interface with a dielectric material layer. In any example, the conductive material layer ($M_C$) can be formed from a transition metal material, including a ferromagnetic material. As described in greater detail hereinbelow, the conductive material layer can include transition metals, such as but not limited to any one or more of copper, tantalum, tin, tungsten, titanium, tungsten, cobalt, chromium, silver, nickel, iron, nickel, cobalt, samarium, dysprosium, yttrium, or chromium, an alloy of one or more transition metals, or an alloy of one or more rare earth metals, or an alloy that includes at least one transition metal and at least one rare earth metal. The example dielectric material layer in this example includes cations ($C^{x+}$) and oxide ions ($O^{2-}$). The example device includes a gate electrode layer ($M_G$), which can include a noble metal, a transition metal, or any other conductive material as described herein. As shown in FIG. 3B, with a non-zero potential difference applied in a first direction (a negative bias, $V_g<0$), an amount of the ionic species (indicated at 302) migrates into portions of the conductive material layer ($M_C$) proximate to the interface. In this non-limiting example, the ionic species are oxide ions. That is, the negative bias moves oxygen ions towards the conductive material-dielectric oxide interface in this example. As shown in FIG. 3C, with a non-zero potential difference applied in a second direction that is opposite the first direction (a positive bias, $V_g>0$), the oxide ions that had migrated into portions of the conductive material layer ($M_C$) are returned to the dielectric material layer. The positive bias moves ions away from the interface. Accordingly, FIGS. 3A-3C illustrate the reversible migration of the ionic species from a dielectric material layer to the adjacent conductive material layer of an example device.

In an example device according to the principles herein, the conductive material layer is kept sufficiently thin, such that the functional properties of the conductive material in the conductive material-dielectric material bilayer is sensitive to the oxygen stoichiometry at the interface. The dielectric material used in any of the examples herein are a high-k dielectric materials that includes an ionic species having a high vacancy mobility. In the non-limiting example of FIG. 3A-3C, the high-k dielectric material is an oxygen ion conductor with high oxygen vacancy mobility. Application of a gate voltage across the interface results in motion of oxygen ions in the dielectric oxide material layer. This in turn modifies the oxygen stoichiometry at the conductive material-dielectric material interface, and therefore changes properties such as, but not limited to, the resistivity of the conductive material film. For example, as illustrated in FIGS. 3A-3C, under a gate voltage in a first direction, oxygen ions move away from the conductive material-dielectric oxide material interface. Under a gate voltage of an opposite bias, the oxygen ions migrate towards the conductive material-dielectric oxide material interface. According to the example systems, methods, and apparatus herein, the modification of the functional properties of the conductive material film can be tuned by regulating the oxygen stoichiometry at the conductive material-dielectric material interface, by controlling parameters such as but not limited to, the polarity and/or magnitude and/or dwell time of the gate voltage, and/or the mobility of the ionic species.

Figure 4B:
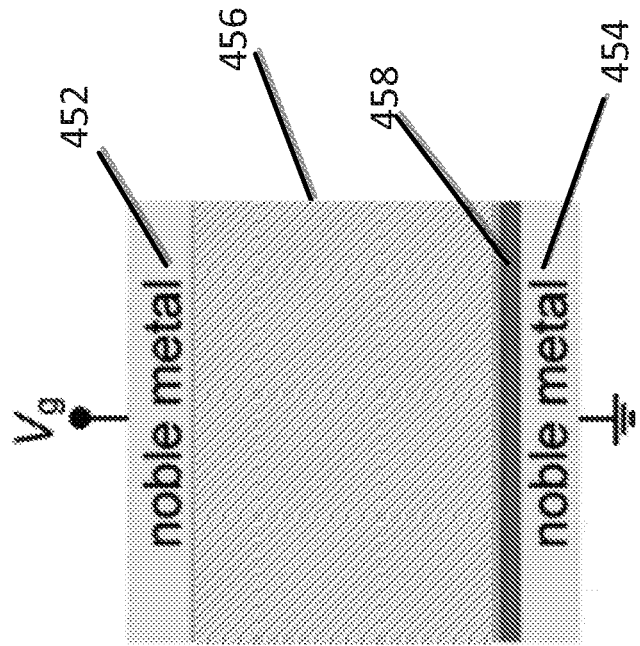
FIG. 4B shows the layer structure of an example magneto-electric device, according to principles of the present disclosure.
Figure 4A:
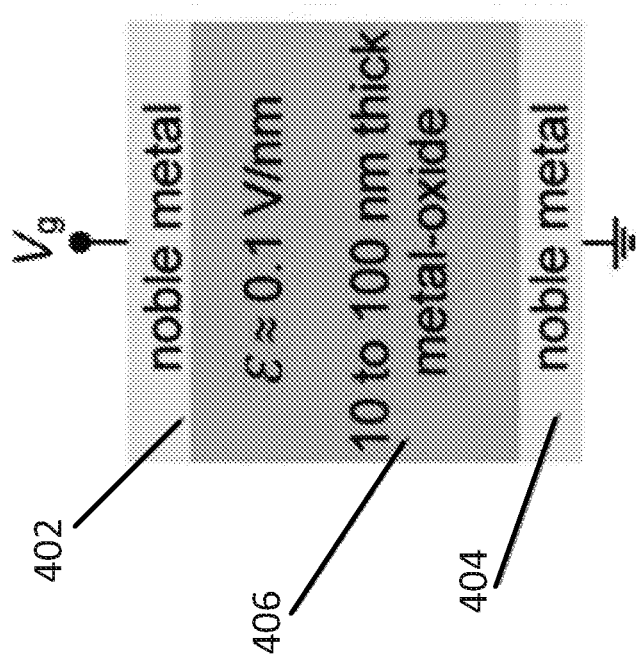
FIG. 4A shows the layer structure of a conventional memristive device, according to principles of the present disclosure.

FIG. 4A shows the layer structure of a conventional memristive device 400, which includes gate electrode 402, bottom electrode 404, and an insulating oxide layer disposed between these two electrodes. The gate electrode 402 and bottom electrode 404 are typically formed from a noble metal or other electrically conductive material that is configured to prevent, or significantly reduce the possibility of migration of ionic species from the insulating oxide layer. The thickness of the insulating oxide layer can range from about 10 nm to about 100 nm. Applied potential difference (Vg) generates electric fields ($\epsilon$) of about 0.1 V/m. As described above, the switching operation of the memristive device of FIG. 4A is based on formation and breaking of a conductive filament.

FIG. 4B shows the layer structure of an example magneto-electric device 450, which includes gate electrode 452, bottom electrode 454, and a dielectric material layer 456 disposed between these two electrodes 452 and 454, and a conductive material layer 458 disposed between the bottom electrode 454 and forms an interface with the dielectric material layer 456. The gate electrode 402 and bottom electrode 404 also can be formed from a noble metal. Conductive material layer 458 is configured to allow migration of a proportionate amount of ionic species from the dielectric material layer 456 to at least a portion of the conductive material layer 458. Examples of such devices are described in U.S. Non-provisional application Ser. No. 14/659,059 and International Application No. PCT/US2015/020736, both filed on Mar. 16, 2015. In various non-limiting examples, the thickness of the insulating oxide layer can range from about 1.0 nm to about 100 nm, or greater. In an example, the conductive material layer 458 can be formed as a thin ferromagnetic (FM) metal layer. The applied potential difference (Vg) can generates electric fields ($\varepsilon$) ranging from about 0.1 V/m to about 1.0 V/m. The magneto-electric effect can be controlled through use of a voltage to cause migration of proportionate amount of ionic species from the dielectric material layer 456 to at least a portion of the conductive material layer 458.

Figure 5A:
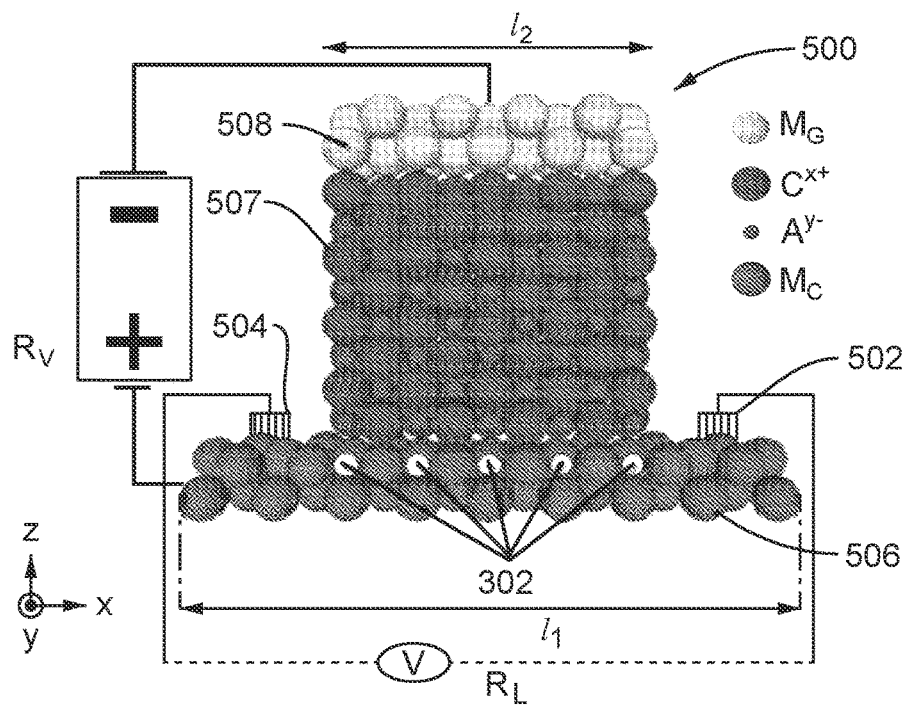
FIGS. 5A-5D show example memristive switching devices, according to principles of the present disclosure.

FIG. 5A shows an example memristive switching device 500 according to the principles herein, formed as a three-terminal device. Terminals 502 and 504 can be used to measure a lateral resistive state across the electrically conductive material ($M_C$) layer 506. In non-limiting examples, terminals 502 and 504 can be used to drive a current through conductive material ($M_C$) layer 506 and/or apply a voltage across conductive material ($M_C$) layer 506. In any example, the conductive material layer ($M_C$) can be formed from a transition metal material, including a ferromagnetic material. As described in greater detail hereinbelow, the conductive material layer can include transition metals, such as but not limited to any one or more of copper, tantalum, tin, tungsten, titanium, tungsten, cobalt, chromium, silver, nickel, iron, nickel, cobalt, samarium, dysprosium, yttrium, or chromium, an alloy of one or more transition metals, or an alloy of one or more rare earth metals, or an alloy that includes at least one transition metal and at least one rare earth metal. The conductive material is at least partially covered by an electronically insulating dielectric material layer 507 which includes cations ($C^{x+}$) and anions ($A^{y-}$). As a non-limiting example, the anions ($A^{y-}$) can be oxide ions ($O^{2-}$). The electronically insulating dielectric material layer also acts as a good ionic conductor. The gate electrode ($M_G$) disposed over the insulating layer provides the third terminal 508 of the device. As shown in FIG. 5A, with a non-zero potential difference applied in a first direction across the conductive material ($M_C$) layer 506 and the gate electrode 508, an amount of the ionic species (indicated at 302) migrates into portions of the conductive material layer ($M_C$) 506. With a non-zero potential difference applied in a second direction (opposite to the first direction) across the conductive material ($M_C$) layer 506 and the gate electrode 508, an amount of the ionic species (indicated at 302) migrates from the conductive material layer ($M_C$) to the dielectric material layer 507. The resulting change in the measured value of lateral resistance of the lateral resistive state ($R_L$) can be probed across a segment of the electrically conductive material ($M_C$) layer using terminals 502 and 504. In various examples, the value of lateral resistance can be measured: (i) across a portion of the electrically conductive material ($M_C$) layer that overlaps with the dielectric material layer, or (ii) across a portion of the electrically conductive material ($M_C$) layer that does not overlap with the dielectric material layer, or (iii) a segment that encompasses both regions (i) and (ii). In some examples, the change in the measured value of vertical resistance of the vertical resistive state ($R_V$) may be of interest, and may be probed across gate electrode and conductive material layer.

As described in greater detail herein, each different resistive state of an example memristive switching device according to the principles herein, including example memristive switching device 500, is achieved through changing an amount of the ionic species that is caused to migrate into, or out of, portions of the conductive material layer, which changes the measured value of resistance of the conductive material layer.

With a voltage applied to the gate electrode, ionic species in the dielectric material layer can be pumped to or away from conductive material layer, resulting in modifications of the interface and even the bulk composition of the conductive material layer. The conductive material layer and dielectric material are chosen such that these modifications in interface and bulk chemistry of the conductive material layer result in significant modifications in the resistance of the conductive material layer. So in the example memristive switching device according to the principles herein, including example memristive switching device 500, it is not the resistance change in the oxide or other form of the dielectric material that is measured to provide the memristive switching. Rather it is the resistance change in the conductive material layer that gives rise to the memristive switching.

As shown in the example of FIG. 5A, the conductive material layer 506 can be formed with a lateral dimension $l_1$ (shown as extending in the x-direction) that is greater than the lateral dimension $l_2$ of the gate electrode 508. In non-limiting example devices, the lateral dimension of the dielectric material layer 507 can be about the same as, or larger than, the lateral dimension $l_2$ of the gate electrode 508. In other non-limiting example devices, the lateral dimension of the dielectric material layer 507 can be smaller than, or about equal to, the lateral dimension $l_1$ of the conductive material layer 506. Similarly to film thickness, the width of the conductive material layer underneath the gate electrode could be used to tune the possible resistance change. That is, the relative values of lateral dimension $l_1$ and lateral dimension $l_2$ can be used as additional parameters to tune the memristive properties of the example memristive switching device. A greater overlap of the conductive material layer and the gate electrode can result in differing values of resistance change than a smaller overlap between the two. Any example memristive switching device can be fabricated to include multiple different memristive elements, two or more of the memristive elements being configured with differing degrees of overlap between the conductive material layer and the gate electrode, to provide an additional tuning capability of the functional properties of the example memristive switching device. Such a device can be a multi-bit device.

In an example where the lateral dimension of the dielectric material layer 507 is smaller than the lateral dimensionl $l_1$ of the conductive material layer 506, the memristive switching device 500 can include an insulating dielectric material having low-mobility ionic species disposed over portions of the conductive material layer 506 that are not in communication with the dielectric material layer 507, to act as a passivation layer. The passivation layer can be of any thickness in the z-direction, including up to the thickness of the dielectric material layer 507. In another example, a thin layer of the dielectric material layer 507 can be disposed of the portions of the conductive material layer that extend beyond the lateral dimension of the gate electrode 508, to act as a passivation layer.

In an example implementation, the switching behavior can be exploited based on a lateral resistance ($R_L$) measured across the conductive material layer 506. In some example implementations, the conductive material layer 506 can also serve as a bottom electrode, or a second conductive material layer can be disposed in electrical communication with the conductive material layer 506 to serve as a bottom electrode. In another example implementation, the switching behavior can be exploited based on a vertical resistance ($R_V$) measured between the gate electrode 508 and a bottom electrode. In yet another example implementation, the switching behavior can be controlled based on both the lateral resistance ($R_L$) measured across the conductive material layer 506, and the vertical resistance ($R_V$) measured between the gate electrode 508 and a bottom electrode.

In operation of any example memristive switching device according to the principles herein, including memristive switching device 500, a first voltage is applied across the gate electrode at a sufficiently high potential (or a lower potential applied for sufficiently long duration) to switch the memristive state of the device (referred to as a "write" function). For example, the first voltage can be applied in a first direction to switch the example memristive device to a first resistive state (which can be designated as a "0" or OFF state), or in a second (opposite) direction to switch the example memristive device to a second resistive state (which can be designated as a "1" or ON state). A lower second voltage (i.e., having smaller magnitude than the first voltage) is applied to measure the memristive state of the device (referred to as a "read" function). In various example implementations, the read or write function can be based on a measure of the lateral resistance ($R_L$), or a measure of the vertical resistance ($R_V$), or a measure of both the lateral resistance ($R_L$) and the vertical resistance ($R_V$). Such an example memristive device according to the principles herein would be configured as a two-state device, having a first resistive state with a first measured value of resistance that is designated as a "0" or OFF state, and a second resistive state with a second measured value of resistance, different from the first measured value of resistance, that is designated as a "1" or ON state.

Any example memristive switching device according to the principles herein, including memristive switching device 500, can be configured to exhibit more than two levels of lateral switching behavior, i.e., three or more different lateral resistive states ($R_L$) that can be measured. For example, a memristive element of the example memristive switching device can be designated as being in a "$L_0$" or OFF state based on a first measured value of lateral resistance, in a first ON state ($L_1$) based on a second measured value of lateral resistance (different from the first measured value of lateral resistance), in a second ON state ($L_2$) based on a third measured value of lateral resistance (different from both the first and second measured values of lateral resistance), up to any number of different designated resistive states ($L_i$, where i>2). Each different resistive state could be correlated with a value of lateral resistance of the conductive material layer of the example memristive switching device (e.g., as part of a calibration of the example memristive switching device). That is, each different discrete depth of migration of the ionic species into the conductive material layer can be correlated to an incremental change in the lateral resistance of the conductive material layer, to derive multiple resistance states from a single memristive switching device. The magnitude and direction of the gate voltage ($V_G$) to be applied to the gate electrode of a memristive element, or the duration of application of a given gate voltage, to "write" a desired state to that memristive element would depend on the history of the memristive element. In an example, to change a memristive element from state $L_1$ to state $L_2$ may involve application of a smaller magnitude of gate voltage ($V_G$) than to change the memristive element from state $L_0$ to state $L_2$. In another example, to change the memristive element from state $L_0$ to state $L_2$ may involve application of the same magnitude of gate voltage ($V_G$) that can be used to change a memristive element from state $L_1$ to state $L_2$, however applying that voltage for a longer duration of time to cause more of the ionic species to migrate into (or out of) the conductive material layer as desired. In an example, to change a memristive element from state $L_2$ to state $L_1$ may involve changing the direction of application of a given gate voltage ($V_G$).

In contrast to conventional memristors, the example memristive switching devices according to the principles herein does not rely on the unpredictable formation of conducting filaments in the insulating layer, but rather provides capabilities to control the modification of the interfacial and bulk chemistry of the conductive material layer. The memristive switching devices according to the principles herein also avoid the damage that typically occurs inside the dielectric layer during filament formation (dielectric breakdown). Accordingly, the example memristive devices according to the principles herein can exhibit markedly enhanced reliability and predictability.

In addition, the example memristive switching device according to the principles herein, including memristive switching device 500, can be configured with differing "read" and "write" paths. For example, where the memristive switching is based on a measure of the lateral resistance, terminals coupled to the conductive material layer (such as terminals 502 and 504) can be used to measure the lateral resistive state in a "read" function, while the voltage is applied across the gate electrode at a sufficiently high potential (or a lower potential applied for sufficiently long duration) to switch the memristive state of the device in a "write" function. In contrast, conventional memristors use the same paths for both "read" and "write" functions.

According to the principles of the instant disclosure, the modification of the resistive properties of the conductive material layer ($M_C$) can be tuned by regulating the oxygen stoichiometry in a portion of the conductive material layer ($M_C$) at the conductive material-dielectric material interface, according to the example systems, methods, and apparatus herein.

Example systems, methods and apparatus are provided herein that facilitate use of a voltage to control the resistive properties of the conductive material layer ($M_C$) in films and devices, including nanodevices. In the context of a resistive memory element, the oxygen stoichiometry at the conductive material-dielectric material interface can be controlled to cause the switching between resistive states.

As a non-limiting example, using the example systems, methods, and apparatus herein, the change of proportionate amount of the at least one ionic species in a portion of the conductive material layer can be used to cause a change of a local resistive state at differing local portions of the example device. In various example devices, the local resistive state that is measured can be a lateral resistive state, or a vertical resistive state, or both vertical and lateral resistive states. Using the example systems, methods, and apparatus herein, the change of proportionate amount of the at least one ionic species in a portion of the conductive material layer can be used to cause a change in magnitude of the lateral resistive state (and in some example, the vertical resistive state).

Figure 5B:
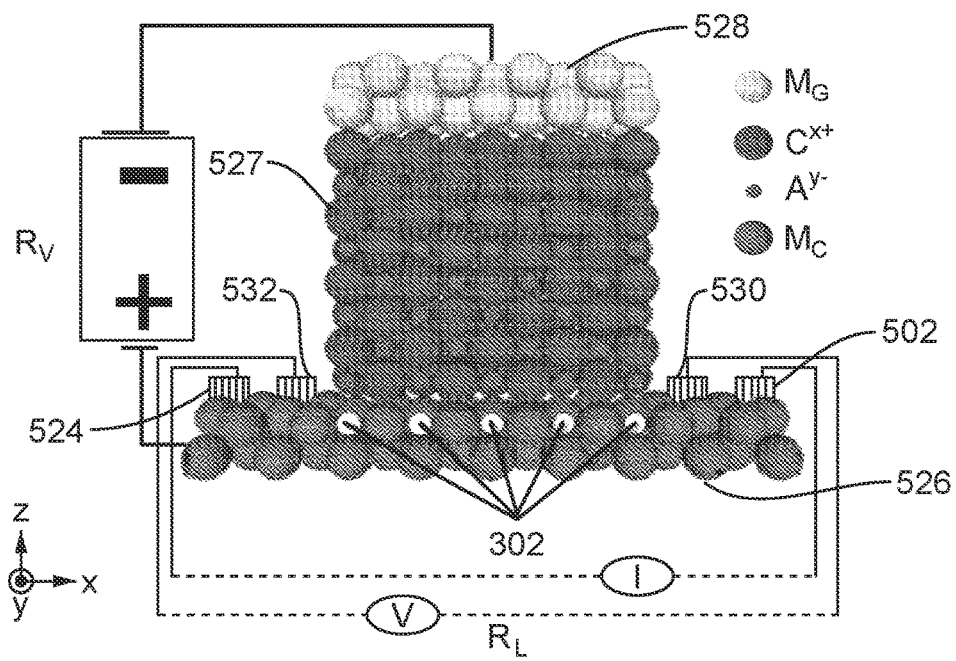

FIG. 5B shows another example memristive switching device according to the principles herein, formed as a multi-terminal device. Any description or variations described hereinabove relative to the example memristive switching device of FIG. 5A also apply to equivalent features and components of the example memristive switching device of FIG. 5B. Terminals 522 and 524 can be used to measure a lateral resistive state across the electrically conductive material ($M_C$) layer 526. In non-limiting examples, terminals 522 and 524 can be used to drive a current through conductive material ($M_C$) layer 526 and/or apply a voltage across conductive material ($M_C$) layer 526. The conductive material is at least partially covered by an electronically insulating dielectric material layer 527 which includes cations ($C^{x+}$) and anions ($A^{y-}$). The electronically insulating dielectric material layer also acts as a good ionic conductor. The gate electrode ($M_G$) disposed over the insulating layer provides the third terminal 528 of the device. In a four-point measurement configuration, terminals 522 and 524 can be used to drive a current through conductive material ($M_C$) layer 526, and terminals 530 and 532 can be used to measure, for example, the voltage across the electrically conductive material ($M_C$) layer, to determine the lateral resistance of the lateral resistive state. As shown in FIG. 5B, with a non-zero potential difference applied in a first direction across the conductive material ($M_C$) layer 526 and the gate electrode 528, an amount of the ionic species (indicated at 302) migrates into the conductive material ($M_C$) layer 526. With a non-zero potential difference applied in a second direction (opposite to the first direction) across the conductive material ($M_C$) layer 526 and the gate electrode 528, an amount of the ionic species (indicated at 302) migrates from the conductive material layer ($M_C$) to the dielectric material layer 527. The resulting change in the measured value of lateral resistance of the lateral resistive state ($R_L$) can be probed across a segment of the electrically conductive material ($M_C$) layer. In various examples, the value of lateral resistance can be measured: (i) across a portion of the electrically conductive material ($M_C$) layer that overlaps with the dielectric material layer, or (ii) across a portion of the electrically conductive material ($M_C$) layer that does not overlap with the dielectric material layer, or (iii) a segment that encompasses both regions (i) and (ii). The resulting change in the measured value of vertical resistance of the vertical resistive state ($R_V$) can be probed across gate electrode and conductive material layer (if of interest). The relative values of lateral dimensions of the gate electrode and conductive material layer can be used as additional parameters to tune the memristive properties (i.e., resistive states ($L_1$)) of the example memristive switching device, as described herein.

In any example memristive device according to the principles herein, the conducting material layer could be formed with two or more differing types of materials to control the change in resistance that can be achieved by applying a voltage. In another example, the conducting material layer could be coupled to an inert metal underlayer that shunts part of the current flowing through the device. The inert metal underlayer can be formed from any electrically conductive material that does not admit migration of the ionic species, such as but not limited to, a noble metal (including ruthenium, rhodium, palladium, silver, osmium, iridium, platinum, and gold). As a non-limiting example, a thin gold layer can be disposed under the conductive (transition metal) material layer. Since the inert metal layer would be essentially immune to voltage-induced electrochemical reactions, the relative thickness of the two layers provides a tool to tune the magnitude of the voltage induced memristive switching effects in these example memristive devices. Using a thicker inert metal layer shunts much of the current through it, and therefore results in smaller resistance changes. With a thinner inert metal layer, much larger resistance changes could be achieved. In an example, the thickness of the inert metal underlayer can be configured to cause a greater proportion of current applied between the electrodes to flow through the inert metal underlayer, and as a result modify the measure value of resistance of the lateral resistive state. In another example, the thickness of the inert metal underlayer can be configured to cause a smaller proportion of current applied between the electrodes to flow through the inert metal underlayer, and as a result modify the measure value of resistance of the lateral resistive state. The underlayer allows continued electrical contact in an example memristive switching device where an applied gate voltage causes sufficient ionic species to migrate into the conductive material layer to cause the bulk of the conductive material layer to change to a largely resistive state, e.g., becoming significantly less conductive or even non-conductive. In any example memristive switching device according to the principles herein, the ionic species can be caused to migrate into the conductive material layer to depths of up to about 10 nm to about 20 nm or more, based on the magnitude, direction, and/or duration of application of the applied gate voltage.

Figure 5C:
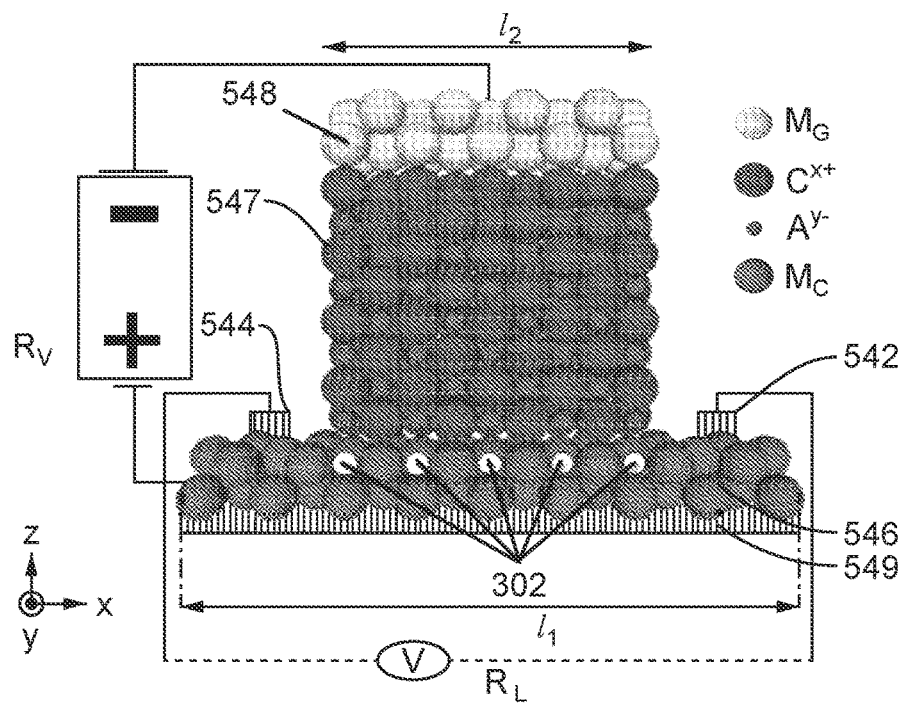

FIG. 5C shows an example memristive switching device according to the principles herein, formed as a three-terminal device that includes an underlayer. Any description or variations described hereinabove relative to the example memristive switching device of FIG. 5A also apply to equivalent features and components of the example memristive switching device of FIG. 5C. Terminals 542 and 544 can be used to measure a lateral resistive state across the electrically conductive material ($M_C$) layer 546. In non-limiting examples, terminals 542 and 544 can be used to drive a current through conductive material ($M_C$) layer 546 and/or apply a voltage across conductive material ($M_C$) layer 546. The conductive material is at least partially covered by an electronically insulating dielectric material layer 547 which includes cations ($C^{x+}$) and anions ($A^{y-}$). The electronically insulating dielectric material layer also acts as a good ionic conductor. The gate electrode ($M_G$) disposed over the insulating layer provides the third terminal 548 of the device. An underlayer 549 is disposed in electrical communication with the conductive material ($M_C$) layer 546. As shown in FIG. 5C, with a non-zero potential difference applied in a first direction across the conductive material ($M_C$) layer 546 and the gate electrode 548, an amount of the ionic species (indicated at 302) migrates into portions of the conductive material layer ($M_C$) proximate to the interface between the dielectric material layer 547 and the conductive material ($M_C$) layer 546. With a non-zero potential difference applied in a second direction (opposite to the first direction) across the conductive material ($M_C$) layer 546 and the gate electrode 548, an amount of the ionic species (indicated at 302) migrates from the conductive material layer ($M_C$) to the dielectric material layer 547. The resulting change in the measured value of lateral resistance of the lateral resistive state ($R_L$) can be probed across a segment of the electrically conductive material ($M_C$) layer. In various examples, the value of lateral resistance can be measured: (i) across a portion of the electrically conductive material ($M_C$) layer that overlaps with the dielectric material layer, or (ii) across a portion of the electrically conductive material ($M_C$) layer that does not overlap with the dielectric material layer, or (iii) a segment that encompasses both regions (i) and (ii). The resulting change in the measured value of vertical resistance of the vertical resistive state ($R_V$) can be probed across gate electrode and conductive material layer (if of interest). The relative thickness of the conductive material layer 546 and the underlayer 549 can be configured to control the resistive states ($L_i$) of the example memristive switching device, as described herein. In addition, the relative values of lateral dimension $l_1$ and lateral dimension $l_2$ can be used as additional parameters to tune the memristive properties (i.e., resistive states ($L_1$)) of the example memristive switching device, as described herein.

Figure 5D:
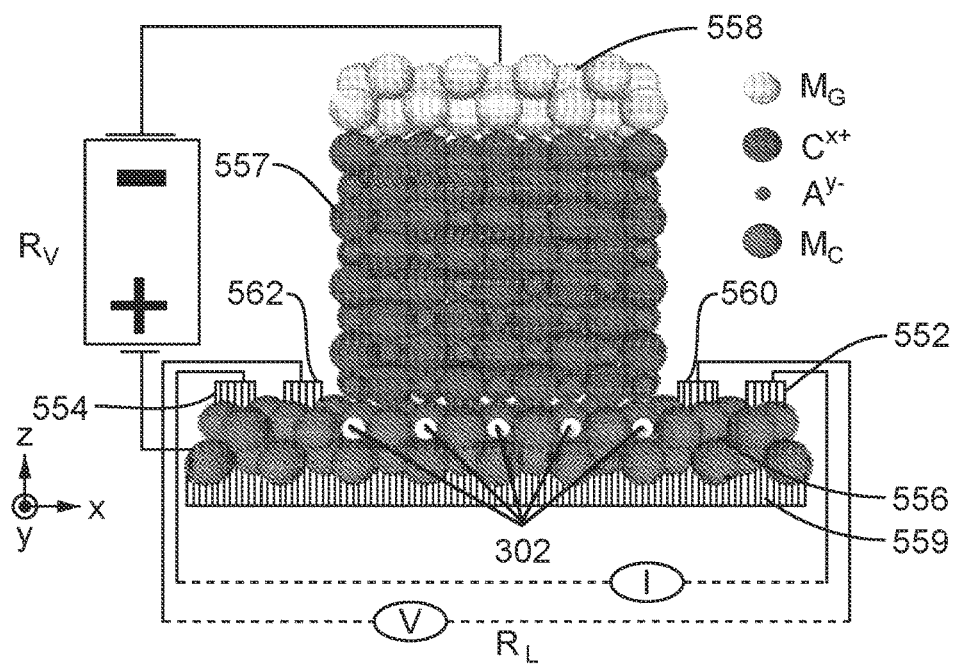

FIG. 5D shows an example memristive switching device according to the principles herein, formed as a multi-terminal device that includes an underlayer. Any description or variations described hereinabove relative to the example memristive switching device of FIG. 5A or FIG. 5C also apply to equivalent features and components of the example memristive switching device of FIG. 5D. Terminals 552 and 554 can be used to measure a lateral resistive state across the electrically conductive material ($M_C$) layer 556. In non-limiting examples, terminals 552 and 554 can be used to drive a current through conductive material ($M_C$) layer 556 and/or apply a voltage across conductive material ($M_C$) layer 556. The conductive material is at least partially covered by an electronically insulating dielectric material layer 557 which includes cations ($C^{x+}$) and anions ($A^{y-}$). The electronically insulating dielectric material layer also acts as a good ionic conductor. The gate electrode ($M_G$) disposed over the insulating layer provides the third terminal 558 of the device. An underlayer 559 is disposed in electrical communication with the conductive material ($M_C$) layer 556. In a four-point measurement configuration, terminals 552 and 554 can be used to drive a current through conductive material ($M_C$) layer 556, and terminals 560 and 562 can be used to measure, for example, the voltage across the electrically conductive material ($M_C$) layer, to determine the lateral resistance of the lateral resistive state. As shown in FIG. 5D, with a non-zero potential difference applied in a first direction across the conductive material ($M_C$) layer 556 and the gate electrode 558, an amount of the ionic species (indicated at 302) migrates into portions of the conductive material layer ($M_C$) proximate to the interface between the dielectric material layer 557 and the conductive material ($M_C$) layer 556. With a non-zero potential difference applied in a second direction (opposite to the first direction) across the conductive material ($M_C$) layer 556 and the gate electrode 558, an amount of the ionic species (indicated at 302) migrates from the conductive material layer ($M_C$) to the dielectric material layer 557. The resulting change in the measured value of lateral resistance of the lateral resistive state ($R_L$) can be probed across a segment of the electrically conductive material ($M_C$) layer. In various examples, the value of lateral resistance can be measured: (i) across a portion of the electrically conductive material ($M_C$) layer that overlaps with the dielectric material layer, or (ii) across a portion of the electrically conductive material ($M_C$) layer that does not overlap with the dielectric material layer, or (iii) a segment that encompasses both regions (i) and (ii). The resulting change in the measured value of vertical resistance of the vertical resistive state ($R_V$) can be probed across gate electrode and conductive material layer (if of interest). The relative thickness of the conductive material layer 556 and the underlayer 559 can be configured to control the resistive states ($L_i$) of the example memristive switching device, as described herein. In addition, the relative values of lateral dimensions of the gate electrode and conductive material layer can be used as additional parameters to tune the memristive properties (i.e., resistive states ($L_i$)) of the example memristive switching device, as described herein.

In any example memristive device according to the principles herein, the value of voltage ($V_G$) that can be applied to change the resistive state of a memristive device or memristive element (i.e., a "write" voltage) can be on the order of about 1V or less, about 2V, about 3V, about 5V, about 7 V, about 8 V, about to 10V, or about 12 V, or higher. The value of voltage that can be applied to measure the resistive state of a memristive device or memristive element (i.e., a "read" voltage) can be on the order of about 1V or less, such as but not limited to about 0.2V or less, about 0.5 V, about 0.8V, about 1V, about 1.2V, about 1.5V or higher.

A plurality of any example memristive switching device according to the principles herein, including any of the example memristive switching devices of FIGS. 5A-5D, can be fabricated as part of a multi-bit device that include multiple different memristive elements. Each of the example memristive switching device forms a memristive element of the multi-bit device. Each memristive element can be separately addressable, such that a voltage and/or a current can be applied to each memristive element separately, and each memristive element can be separately subjected to a "read" or "write" function, as described herein. The materials composition of the layers of two or more of the memristive elements may differ, to allow differing portions of the multi-bit device to exhibit differing types of resistive states. For example, the conductive material layer and/or dielectric material layer may differ between two of the memristive elements. As another example, some of the memristive elements may include an underlayers while others do not. In another example, the relative thickness of the conductive material layer and the underlayer of some of the memristive elements can be configured to control the resistive states ($L_i$) of the example multi-bit device, as described herein. The relative values of lateral dimensions of the gate electrode and conductive material layer also can be used as parameters to tune the memristive properties (i.e., resistive states ($L_i$)), as described herein, of any two or more of the memristive elements of the multi-bit device. Any two or more of the memristive elements of the multi-bit device can be configured with differing degrees of overlap between the conductive material layer and the gate electrode, to provide an additional tuning capability of the functional properties of the example memristive switching device. In addition, each differing discrete depth of migration of the ionic species into the conductive material layer can be correlated to an incremental change in resistance, such that each memristive element (cell) can present multiple differing resistance states from a single cell of the multi-bit device. In an example, the multi-bit device can be configured as a cascade of multiple gate electrodes, each disposed over different distinct regions of a conductive material layer, to allows for multi-bit storage, where all bits could be read out simultaneously by probing the resistance state of the conductive material layer.

In any example memristive device according to the principles herein, the dielectric material-conductive material pair can be a transition metal and a rare earth oxides with high oxygen anion mobility. The voltage driven oxygen ion migration in the rare earth oxide could oxidize the interface and even the bulk of the transition metal in the conductive material layer, and thus significantly modify its conductivity.

In any example memristive device according to the principles herein, the mobile ionic species could also be supplied by gaseous species in atmosphere or from the gate electrode, instead of being entirely present in the insulating layer. If the gate electrode is not inert, a gate voltage could be used to partially dissolve it and transport the materials across the insulating layer.

In any example memristive device according to the principles herein, several gate electrodes can be placed on the same conducting material layer (e.g., a nanostrip or nanowire). Depending on the width and layer structure of the conducting material layer, voltage application to each gate electrode could then be controlled to modify the resistance of the conducting material layer in the respective gate electrode by a certain fraction. Such a cascade of gate electrodes allows for multi-bit storage, where all bits could be read out simultaneously by probing the resistance state of the nanostrip. The description hereinabove of a multi-bit device also applies to an example memristive switching device formed with conductive material layer formed from at least one nanostrip of conductive a material.

In any example device herein, the electrically conductive material layer can have a thickness of about 0.5 nm, about 0.7 nm, about 0.9 nm, about 1 nm, about 1.3 nm, about 1.5 nm, about 1.8 nm, about 2 nm, about 3 nm, about 4 nm, about 5 nm, about 7 nm, about 10 nm, about 12 nm, about 15 an, about 20 nm, about 25 nm, or greater. The dielectric material layer can have a thickness of about 1.0 nm, about 2.0 nm, about 3.0 nm, about 5.0 nm, about 7.0 nm, about 9.0 nm, about 10 nm, about 13 nm, about 15 nm, about 20 nm, about 25 nm, about 30 nm, about 35 nm, about 40 nm, about 50 nm, about 60 nm, about 70 nm, about 80 nm, or greater. References herein to thickness of a layer are to the magnitudes in the z-direction.

The example devices, systems, methods, and apparatus according to the principles herein can be configured as a magnetic recording device, a memristor, a non-volatile memory device, a magnetoresistive random-access memory device, a voltage-controlled magnetic memory, a voltage-tunable magnetic sensor, a voltage-tunable inductor, a voltage-controlled resonant device, a voltage-controlled lateral conductive device, an electrically controllable catalysis device, a voltage controlled optical switch, a responsive window tinting device, or a display device.

The example devices, systems, methods, and apparatus according to the principles herein can be configured as an organic spintronic device, or other organic device.

The example devices, systems, methods, and apparatus according to the principles herein can be used to provide memristors for implementation in applications such as, but not limited to, nanoelectronic memories, computer logic, and neuromorphic/neuromemristive computer architectures. As non-limiting examples, the devices, systems, methods, and apparatus according to the principles herein can be configured to provide non-volatile computer memory and storage, flash drives, including EEPROMs (electrically erasable programmable read-only memory), solid-state drives (SSD), dynamic random-access memory (DRAM), and Static random-access memory (SRAM). The example device elements can be used in applications using different types of memory, such as but not limited to, capacitor, variable capacitor, floating gate transistor, four transistor feedback loop circuit, or magnetic tunnel junction in commercialized DRAM, FeRAM, NOR flash, SRAM or MRAM, technologies. The novel devices, systems, methods, and apparatus according to the principles herein can be used to removable storage devices for mobile devices and smartphones, cameras, tablets, and other portable applications.

An example devices according to the principles herein includes a dielectric material layer disposed in an x-y plane, and an electrically conductive material layer over and forming an interface with the dielectric material layer. The dielectric material layer includes at least one ionic species having a high ion mobility, such that exposure to electromagnetic irradiation and/or temperature changes can cause changes in the mobility of the least one ionic species. The electrically conductive material is configured to reversibly uptake an amount of the at least one ionic species.

In operation, under the directional influence of an applied potential difference in a direction across the interface between the dielectric material layer and the electrically conductive material layer, the at least one ionic species are caused to migrate into (or out of) the portions of the electrically conductive material layer proximate to the interface. That is, the potential difference is applied for a duration of time sufficient to cause a change in the proportionate amount of the at least one ionic species present in the portions of the electrically conductive material layer proximate to the interface. Due to the nanoscale thickness of the electrically conductive material layer, changes to the proportionate composition at the interface can affect the materials properties of the electrically conductive material layer. As a result, changes in the proportionate amount of the at least one ionic species present in the portions of the electrically conductive material layer proximate to the interface can cause changes in the function properties of the example device.

In any example systems, methods, apparatus, and devices according to the principles herein, the functional properties of interest can be the vertical resistance, or the lateral resistance, or both.

According to the principles of the instant disclosure, systems, methods, and apparatus are provided for regulating (i.e., tuning) one or more of the functional properties of the example device, by modifying the mobility of the at least one ionic species in the dielectric material layer, and applying a potential difference to cause the at least one ionic species in the desired direction (into or out of the electrically conductive material layer). Accordingly, the dielectric material layer serves as a reservoir of the ionic species. Migration of the ionic species into or out of the electrically conductive material proximate to the interface facilitates tuning of the materials properties of the electrically conductive material layer. This facilitates tuning of the functional property(ies) of the example device.

As a non-limiting example, the resistive state of the conductive material layer can be regulated based on the systems, methods, and apparatus described herein for controlling and regulating the migration of the ionic species into and out of the conductive material layer. Using the example systems, methods, and apparatus herein, the regulation of the proportionate amount of the at least one ionic species in a portion of the conductive material layer can be used to cause a change between a metastable state of the conductive material layer having a first resistivity and a metastable state of the conductive material layer having a second resistivity. A read-out of the device can be based on a measure of the type of resistive state of the conductive material layer (i.e., whether the first resistive state or the second resistive state). This capability can be exploited to provide memristive devices, including a memory device, by using these differing metastable states to program information. Accordingly, the example systems, methods, and apparatus herein can provide a memory device that is based on use of these two metastable states, i.e., as a "1" (ON) or as a "0" (OFF), for programming information based on any computer logic, logic theory, or stochastic theory.

In an example implementation, the example memristive devices according to the principles herein can be configured based on a three-layer structure (gate electrode/dielectric material layer/conductive material layer). In other example implementations, the example memristive devices can be configured based on more complex layered structures. In an example, the dielectric material layer could be configured with multiple functional layers. In another example, the dielectric material may be a bilayer, where one layer acts to store the mobile ionic species of interest for facilitating the switching behavior, and the second layer transports the ionic species from the storage layer to the conductive material layer.

FIGS. 6A-6F and 7A-7C describe various example layered structures that can be implemented as memristive devices according to the principles herein.

Figure 6A:
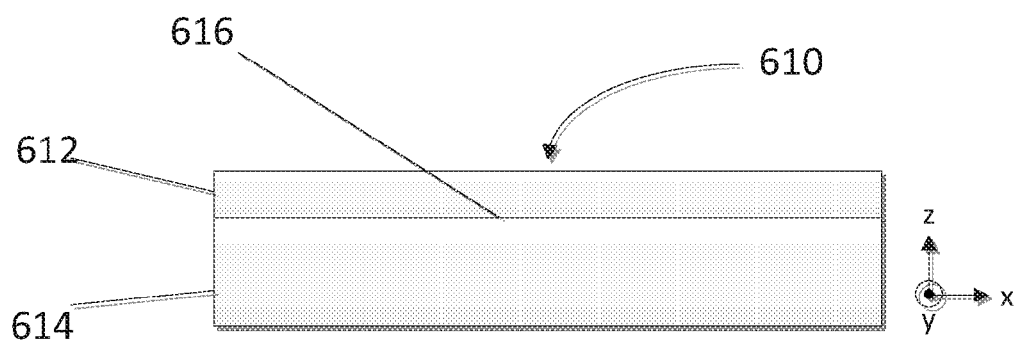
FIGS. 6A-6F show the cross section of example devices that can be implemented as memristive devices, according to principles of the present disclosure.

FIG. 6A shows the cross section of an example device 610 according to the principles of the instant disclosure. The example device 610 includes an electrically conductive material layer 612 (a target layer) and a dielectric material layer 614 disposed in an x-y plane. As shown in FIG. 6A, the electrically conductive material layer 612 is disposed over and forms an interface 16 with the dielectric material layer 614.

Figure 6B:
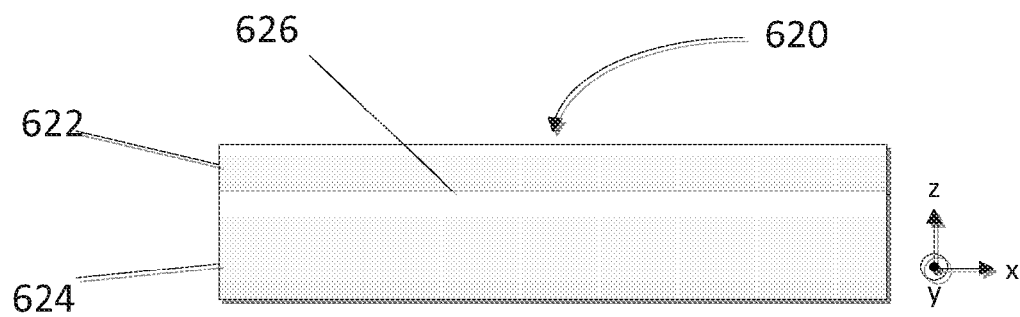

FIG. 6B shows the cross section of another example device 620 according to the principles of the instant disclosure. The example device 620 includes an electrically conductive material layer 622 (a target layer) formed from a transition metal material, and a dielectric material layer 624 disposed in an x-y plane. As shown in FIG. 6B, the electrically conductive material layer 622 is disposed over and forms an interface 626 with the dielectric material layer 624.

Figure 6C:
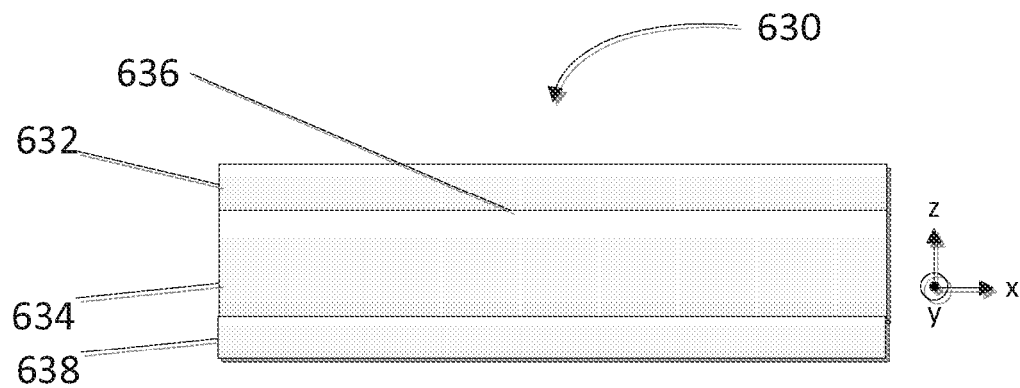

FIG. 6C shows the cross section of another example device 630 according to the principles of the instant disclosure. The example device 630 includes an electrically conductive material layer 632 formed from a transition metal material, and a dielectric material layer 634 disposed in an x-y plane, as a gate oxide dielectric layer. As shown in FIG. 6C, the electrically conductive material layer 632 is disposed over and forms an interface 636 with the dielectric material layer 634. Example device 630 includes a gate electrode layer 638 in electrical communication with the dielectric material layer 634 (as a gate oxide dielectric layer). In an example, device 630 also includes an electrically conductive material layer to serve as an electrical contact to the electrically conductive material layer 632 (which serves as a target layer). In another example, the electrically conductive material layer could be excluded, and an electrical contact could be made to the electrically conductive material layer 632.

Figure 6D:
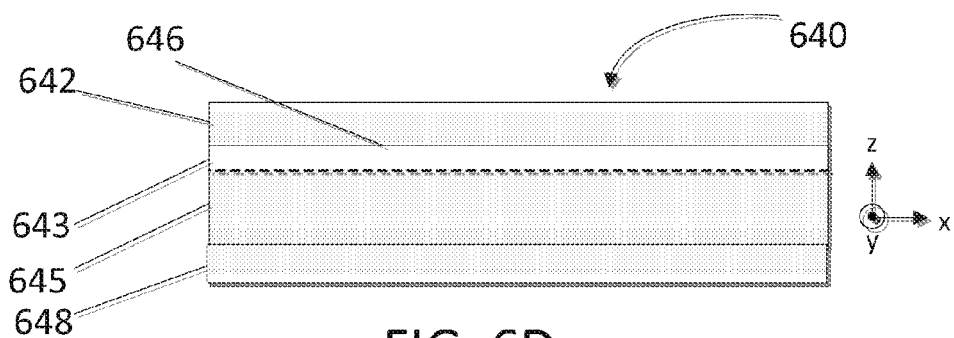

FIG. 6D shows the cross section of another example device 640 according to the principles of the instant disclosure. The example device 640 includes an electrically conductive material layer 642 (a target layer) disposed in an x-y plane, and a dielectric material bilayer that includes as a thinner intermediate dielectric layer 643 and a thicker gate dielectric layer 645. In an example, the thicker gate dielectric layer 45 can be formed as a gate oxide dielectric layer. As shown in FIG. 6D, the electrically conductive material layer 642 is disposed over and forms an interface 646 with the intermediate dielectric layer 43 of the dielectric material bilayer. Example device 640 includes a gate electrode layer 48 in electrical communication with the thicker gate dielectric layer 645. In an example, device 640 also can include another electrically conductive material layer to serve as an electrical contact to the electrically conductive material layer 642 (which serves as a target layer). In this example, the electrically conductive material layer 642 can be formed from a transition metal material. In another example implementation, the electrically conductive material layer could be excluded, and contact could be made to the electrically conductive material layer 642.

Figure 6E:
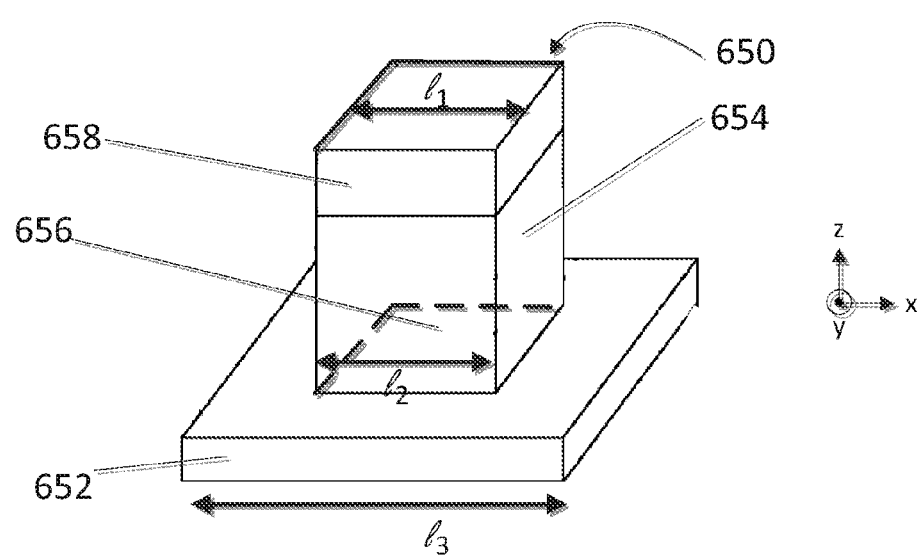

FIG. 6E shows an example device 650 according to the principles of the instant disclosure. The example device 650 includes an electrically conductive material layer 652 formed from a transition metal material disposed in an x-y plane, and a dielectric material layer 654 disposed in an x-y plane, as a gate oxide dielectric layer. As shown in FIG. 6E, the electrically conductive material layer 652 forms an interface 656 with the gate oxide dielectric layer 654. Example device 650 includes a gate electrode layer 658 in electrical communication with the gate oxide dielectric layer 655. As shown in example device 650, the gate oxide dielectric layer 654 and the gate electrode layer 658 can each have a substantially rectangular or square cross-section.

In the non-limiting examples of FIG. 6E, the lateral dimension $l_2$ of the gate oxide dielectric layer is approximately equal to the lateral dimension $l_1$ of the gate electrode layer. In these examples, the lateral dimension $l_3$ of the transition metal material layer is greater than the lateral dimensions $l_1$ and $l_2$. In other non-limiting example devices, the lateral dimension $l_1$ of the gate electrode layer can be smaller than the lateral dimension of the gate oxide dielectric layer $l_2$.

Figure 6F:
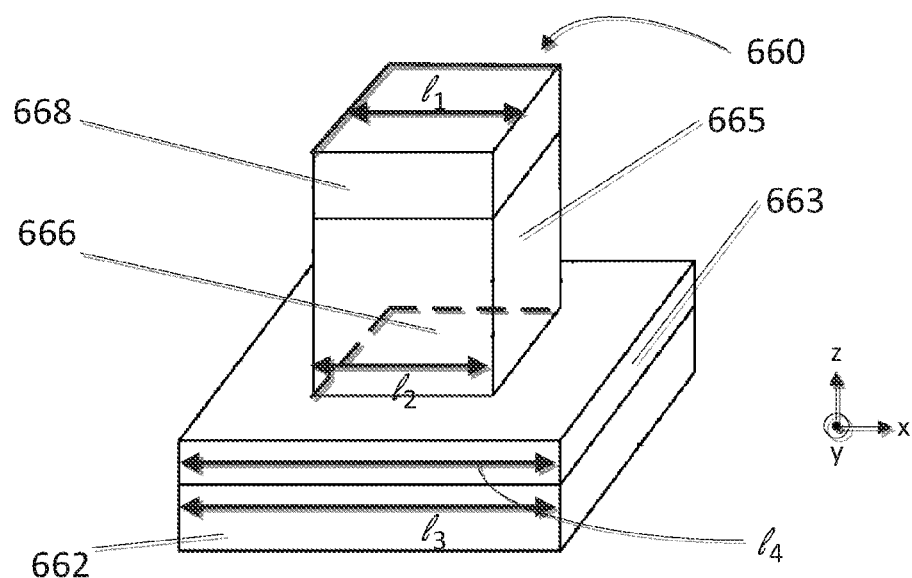

FIG. 6F shows an example device 660 according to the principles of the instant disclosure. The example device 660 includes an electrically conductive material layer 662 formed from a transition metal material disposed in an x-y plane, and a bilayer of dielectric material formed as an intermediate oxide dielectric layer 663 and a gate oxide dielectric layer 665. As shown in FIG. 6F, the electrically conductive material layer 662 forms an interface 666 with the intermediate oxide dielectric layer 663. Example device 660 includes a gate electrode layer 668 in electrical communication with the gate oxide dielectric layer 665.

As shown in the non-limiting examples of FIGS. 6E and 6F, the gate oxide dielectric layer and the gate electrode layer can have a substantially rectangular or square cross-section. In another example, the gate oxide dielectric layer and the gate electrode layer can each be formed with an elliptical, circular, or other polygonal cross-sections, such as but not limited to a hexagonal cross-section. As also shown in the non-limiting examples of FIGS. 6E and 6F, the lateral dimension $l_2$ of the gate oxide dielectric layer is approximately equal to the lateral dimension $l_1$ of the gate electrode layer. In these example, the lateral dimension $l_3$ of the transition metal material layer (and the intermediate oxide dielectric layer $l_4$ in FIG. 6F) are greater than the lateral dimensions $l_1$ and $l_2$. In other non-limiting example devices, the lateral dimension $l_1$ of the gate electrode layer can be smaller than the lateral dimension of the gate oxide dielectric layer $l_2$.

In the non-limiting example of FIG. 6F, the intermediate oxide dielectric layer and the transition metal material layer are shown as having similar lateral dimensions ($l_3 \approx l_4$). In other examples, the intermediate oxide dielectric layer and the transition metal material layer can be configured to have different lateral dimensions ($l_3 \neq l_4$). For example, the example device can be fabricated such that the transition metal material layer has a greater lateral dimension than the intermediate oxide dielectric layer ($l_1 < l_4$).

In various example implementations according to the principles herein, including the example devices of any of FIGS. 6D, and 6F, the gate oxide dielectric layer can be configured with a greater thickness in the z-direction than the intermediate oxide dielectric material layer, by a factor of about 2, about 3, about 5, about 10, or higher. In some examples, the intermediate oxide dielectric layer can be formed from a different dielectric material than the gate oxide dielectric layer.

Figure 7A:
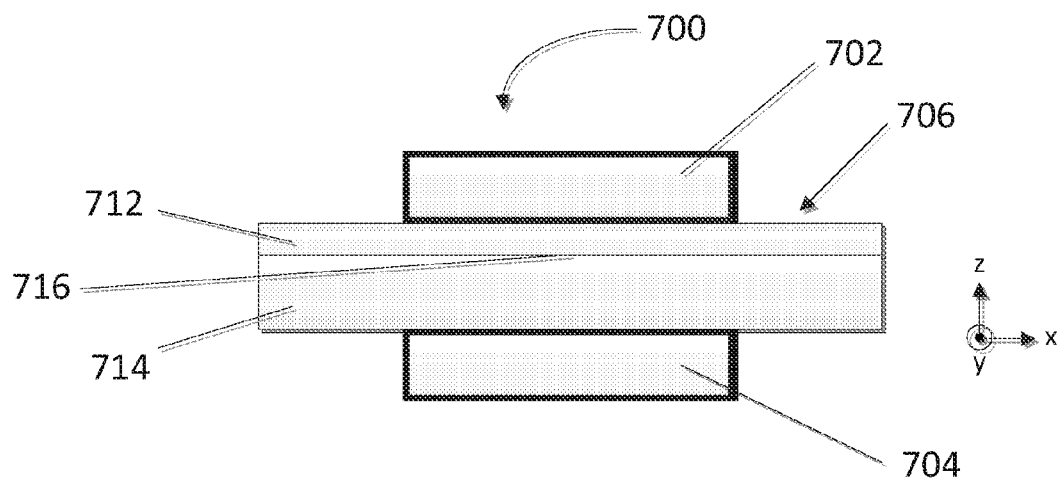
FIGS. 7A and 7B illustrate two different cross-sectional geometries of example two-terminal configurations, according to principles of the present disclosure.
Figure 7B:
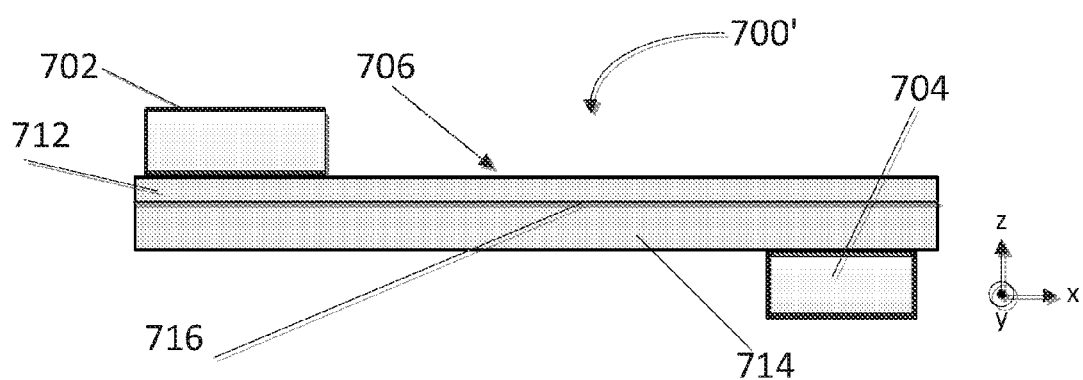
Figure 7C:
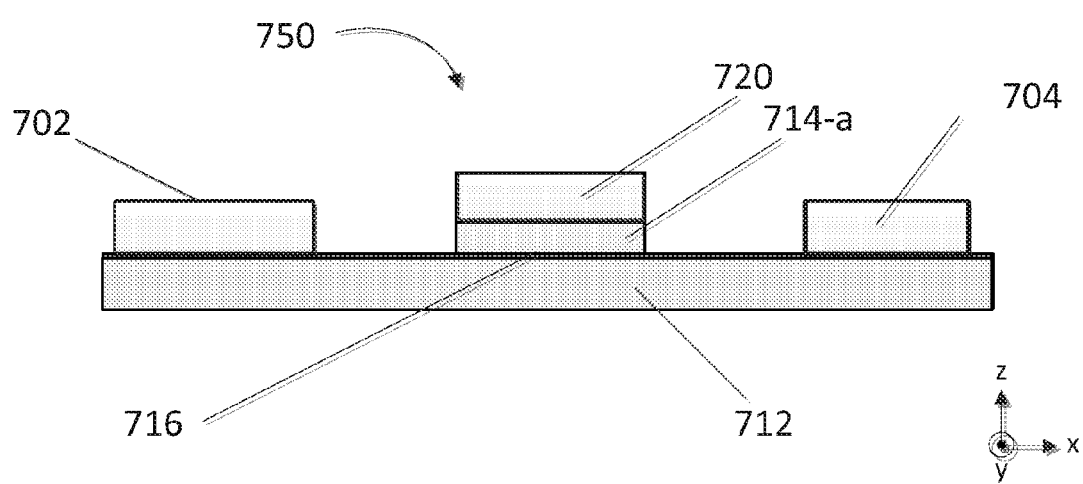
FIG. 7C illustrates an example three-terminal configuration, according to principles of the present disclosure.

In various example implementations according to the principles herein, including the example devices of any of FIGS. 5A through 6F, any of the example devices according to the principles herein may be configured in a two-terminal configuration, a three-terminal configuration (illustrated in FIGS. 7A-7C).

FIGS. 7A and 7B illustrate two different cross-sectional geometries of non-limiting example two-terminal configurations 700 and 700'. Both FIGS. 7A and 7B show example two-terminal configuration that include electrically conductive contacts 702 and 704 coupled in electrical communication with opposite sides of example device 706 in the z-direction. In accordance with the principles described herein, example devices 706 include an electrically conductive material layer 712 that forms an interface 716 with a dielectric material layer 714. In the example two-terminal configuration 700 of FIG. 7A, the electrically conductive contacts 702 and 704 are disposed to overlap each other. In the example two-terminal configuration 700' of FIG. 7B, the electrically conductive contacts 702 and 704 are disposed to have no overlap.

FIG. 7C illustrates a non-limiting example three-terminal configuration 750. The example three-terminal configuration includes electrically conductive contacts 702 and 704 coupled in electrical communication with electrically conductive material layer 712. One side of the dielectric material layer 714-a forms an interface 716 with the electrically conductive material layer 712. A gate electrode 720 is disposed over the other side of the dielectric material layer 714-a. In this example according to the principles herein, the example device 706 includes a dielectric material layer 714-a that forms an interface 716 with only a portion of the electrically conductive material layer 712. In the example of FIG. 7C, electrically conductive contacts 702 and 704 are disposed on the same side of electrically conductive material layer 712. In another example according to the principles herein, electrically conductive contacts 702 and 704 can be disposed on opposite sides of electrically conductive material layer 712.

In various example devices and configurations according to the principles herein, including the example devices of any of FIGS. 5A through 6F or the device configurations of any of FIGS. 7A through 7C, the dielectric material layer is formed from a dielectric material that includes at least one ionic species having a high ion mobility. The dielectric material of the dielectric material layer is configured to be tunable, such that exposure to electromagnetic radiation and/or temperature changes can cause changes in the mobility of the least one ionic species. In an example implementation, the mobility of the at least one ionic species can be tuned (i.e., regulated) by increasing or decreasing the amount of electromagnetic radiation impinging on, or otherwise coupled to, the example device. A laser and/or another source of electromagnetic radiation can be used to provide the electromagnetic radiation. In another example implementation, the mobility of the at least one ionic species can be tuned (i.e., regulated) by increasing the temperature (heating) or decreasing the temperature (cooling) of a portion of the example device. As non-limiting examples, the changes in temperature can be achieved using a heating element, a thermoelectric element, and/or a laser beam.

As non-limiting examples, the at least one ionic species can be at least one of: an anion including oxygen and an anion including hydrogen. The at least one ionic species can be, but is not limited to, an oxide, an oxynitride, a nitride, or a silicate.

As non-limiting examples, the dielectric material can be based on at least one of: gadolinium, hafnium, terbium, zirconium, yttrium, tantalum, titanium, aluminum, silicon, germanium, gallium, indium, tin, antimony, tellurium, barium, bismuth, titanium, vanadium, chromium, manganese, cobalt, nickel, copper, zinc, niobium, molybdenum, palladium, cadmium, strontium, tantalum, niobium, cerium, praesydium, or tungsten, or any combination thereof. For example, the dielectric material can be an oxide, an oxynitride, a nitride, or a silicate of any of these materials. As other non-limiting examples, the dielectric material can be aluminum oxide ($AlO_x$), bismuth zinc niobate, hafnium oxide ($AlO_x$), barium strontium titanate, tantalum oxide, or gadolinium oxide ($GdO_x$). In any example herein, the dielectric material can be $Gd_2O_3$ or $SrTiO_3$.

In any example herein, the dielectric material can be formed from any dielectric material or electrolyte having high ion mobility that is considered for application, e.g., in fuel cells or electrochemical metallization memory cells. For example, dielectric material layer can be formed from any of the high ionic mobility materials known in the art, and listed, e.g., in R. Waser et al., *Advanced Materials*, vol. 21, pp. 2632-2663 (2009), or W. Lu et al., Materials Research Society Bulletin, vol. 37, pp. 124-130 (2012), each of which is incorporated herein for the disclosure of the dielectric materials and/or electrolytes.

In any example herein, the dielectric material can be formed to have an amorphous structure, or a semi-crystalline structure, since such structures can facilitate higher mobility of ion vacancies.

In any example herein, the dielectric material can be formed from an organic material having high mobility ionic species, including any applicable polymeric material. As non-limiting examples, an example device that includes an organic dielectric can be used to provide an organic memory, an organic spintronic device, an organic magnetic recording device, an organic memristor, an organic non-volatile memory device, an organic magnetoresistive random-access memory device, an organic voltage-controlled magnetic memory, an organic voltage-tunable magnetic sensor, an organic voltage-controlled lateral conductive device, an organic electrically controllable catalysis device, an organic voltage controlled optical switch, an organic responsive window tinting device, or an organic display device.

In various example devices and configurations according to the principles herein, including the example devices of any of FIGS. 5A through 6F or the device configurations of any of FIGS. 7A through 7C, the electrically conductive material layer of the active region of the device is formed from an electrically conductive material that is configured to reversibly uptake an amount of the at least one ionic species. The electrically conductive material layer can include aluminum, a transition metal, a rare earth metal, and/or an alloy of any of these conductive materials. As non-limiting examples, the electrically conductive material layer can include copper, tantalum, tin, tungsten, titanium, tungsten, cobalt, chromium, silver, nickel, iron, nickel, cobalt, samarium, dysprosium, yttrium, chromium. In various examples, the alloy can be an alloy of one or more transition metals, or an alloy of one or more rare earth metals, or an alloy that includes at least one transition metal and at least one rare earth metal. The alloy can be a binary or ternary system of any of these conductive materials. In an example where the electrically conductive material layer is ferromagnetic, the ferromagnetic material can include iron, nickel, cobalt, samarium, dysprosium, yttrium, chromium, or an alloy of at least one of iron, nickel, cobalt, and samarium. In an example, the ferromagnetic material can also include a non-magnetic element, such as but not limited to boron. Non-limiting examples of such ferromagnetic materials are a ferromagnetic alloy including any one or more of cobalt (Co), nickel (Ni), iron (Fe), as well as at least one of boron (B), carbon (C), copper (Cu), hafnium (Hf), palladium (Pd), platinum (Pt), rhenium (Re), rhodium (Rh), or ruthenium (Ru). For example, the ferromagnetic material can be formed as cobalt-iron-boron.

In an example, the electrically conductive material layer can also be a bilayer or multilayer of several of any of the metals and/or alloys described hereinabove. One or more functional properties of the target layer (whether in the layer or at its interface with the dielectric layer) can depend on the relative thicknesses of the layers. As a non-limiting example, the conductive material layer can be a metal bilayer of a transition metal (such as but not limited to iron, nickel, cobalt, and samarium) and a noble metal (such as but not limited to gold). The resistive properties at the interface of the metal bilayer can be controlled by using a voltage to regulate the oxide content (i.e., the oxidation or reduction) of the transition metal of the metal bilayer.

In various example devices and configurations according to the principles herein, including the example devices of any of FIGS. 5A through 6F or the device configurations of any of FIGS. 7A through 7C, the example electrically conductive contact herein can be formed from gold, platinum copper, tantalum, tin, tungsten, titanium, tungsten, cobalt, chromium, silver, nickel, rhuthenium or aluminum, or a binary or ternary system of any of these conductive materials.

The electrically conductive material layer of the example devices and configurations according to the principles herein are configured for reversible uptake of an amount of the at least one ionic species. That is, the electrically conductive material layer is configured to be oxidizable, or reducible, or otherwise capable of reversibly coupling with the at least one ionic species. The dielectric material layer serves as a reservoir of the ionic species. The amount of the higher-mobility ionic species in the dielectric material layer can be changed (increased or decreased) by regulating the temperature and/or electromagnetic radiation exposure of the dielectric material. The direction of the applied potential difference across the interface between the electrically conductive material layer and the dielectric material layer causes the mobile ionic species to migrate into (or out of) the portions of the electrically conductive material layer proximate to the interface. The magnitude of the potential difference drives the ionic species into the electrically conductive material layer at interface, such that the state of electrically conductive material layer changes proximate to the interface to change the properties of the electrically conductive material. For example, the mobile ionic species can be driven to a depth of up to about 0.1 nm, about 0.3 nm, about 0.5 nm, about 0.8 nm, about 1 nm, about 1.2 nm, or more, into the electrically conductive material layer (as measured from the interface). This change in the state of electrically conductive material layer results in a change in the functional property of the example device.

The example devices and configurations according to the principles herein are capable of retaining the change of the functional property even after discontinuance of the application of the potential difference, the irradiating, and/or the temperature regulating. That is, the changed state of electrically conductive material layer (from the presence of the at least one ionic species) is a metastable state that persists for a period of time even after discontinuance of the applied potential difference. This metastable state can persist for a (persistence) period of time up to about 10 nanoseconds, about 100 nanoseconds, about 500 nanoseconds, about 1 microsecond, about 500 microseconds, about 1 millisecond, about 100 milliseconds, about 500 milliseconds, about 1 second, about 5 seconds, about 10 seconds, about 30 seconds, about 60 seconds, about 3 minutes, about 5 minutes, about 10 minutes, about 30 minutes, about 60 minutes, for several hours, for several days, or longer (including substantially longer periods of time, such as weeks, or years, which might be desirable for data storage applications). Once the ionic species are driven into the electrically conductive material layer under an applied potential difference in a first direction, this changed state of the electrically conductive material layer (a first state) persists in the metastable state (for the duration of its persistence period) unless a potential difference having opposite polarity (i.e., in an opposite direction) is applied. A first, non-zero amount of the ionic species is present in the electrically conductive material layer (e.g., as quantified by proportion or concentration) in this first metastable state. When a potential difference of an opposite polarity is applied, the at least one ionic species migrate out of the electrically conductive material layer, back to the dielectric material layer. This results in a smaller amount of the ionic species remaining in the electrically conductive material layer (as quantified by proportion or concentration), to provide a second metastable state. The overall example device has different functional properties depending on whether the electrically conductive material layer is in the first metastable state or in the second metastable state.

Example systems, methods, and apparatus are provided for selectively and locally "programming" different functional properties into different spatial regions of an example device, configured in any applicable configuration. For example, the reversible metastable change in state of the electrically conductive material layer can be "programmed" at different local spatial regions of an example device. Through discrete local application of the potential difference, and either (i) exposure to the electromagnetic radiation, or (ii) local temperature regulation, or both (i) and (ii), differing regions of the example device can be caused to exhibit different functional properties. Accordingly, example systems, methods, and apparatus are provided for locally and controllably modifying the state of electrically conductive material layer, thereby reversibly, locally and controllably changing the functional properties of the example device. This example provides for direct "writing" of the functional properties at different portions of the example devices.

Example systems, methods, and apparatus are also provided for tuning the functional properties. An example apparatus includes a regulating element coupled to a spatial region of any example device or configuration according to the principles herein, including the example devices of any of FIGS. 5A through 6F or the device configurations of any of FIGS. 7A through 7C. The example regulating element includes a voltage applying element and at least one of a temperature regulating element and a source of electromagnetic radiation. The voltage applying element is configured to apply a potential difference in a direction across the interface between the dielectric material layer and the electrically conductive material layer. The temperature regulating element is configured to regulate a temperature of the spatial region of the example device. The source of electromagnetic radiation is configured to irradiate at least a portion of the spatial region of the example device. The regulating element is configured to irradiate and/or regulate the temperature of the spatial region of the example device (to activate mobile ionic species in the dielectric material layer), and to regulate the applied potential difference for a duration of time sufficient to modify a proportionate amount of the at least one ionic species in a portion of the electrically conductive material layer proximate to the interface, thereby causing a change of the functional property of the device. Using the regulating element, the desired functional property change can be "programmed" into selected regions of example device by controlling the metastable state of the electrically conductive material layer at that spatial region. As described herein, the change of the functional properties can be retained (for the lifetime of the metastable state) after discontinuance of applying the potential difference, and the irradiating and/or the temperature regulation.

In various example implementations, the voltage applying element can be configured to apply a sufficiently high potential difference of a magnitude of 50 millivolts or less, about 0.1 V, about 0.3 V, about 0.5 V, about 0.7 V, about 1.0 V, about 1.5, about 2.0 V, about 3.0 V, about 5.0 V, about 7.0 V, about 10 V, about 20 V, about 50 V, about 100 V, or greater. As described herein, the polarity of the potential difference depends on the type of metastable state sought, the existing state of the device at the time the potential difference is applied, and the device layer structure.

The direction of ionic motion is determined by the charge of the ionic species and the polarity of the applied voltage. Properties of the electrically conductive material layer depend on the chemical composition and defect structure at the interface formed with the dielectric material layer, accumulation or depletion of the mobile ionic species at this interface can significantly modify the properties of the target material layer. Also, motion of the mobile ionic species into a portion of the target layer, beyond the immediate interface region, facilitates the modification of the chemical composition and defect structure of parts of the target material layer. This allows access to additional material properties that might not be directly sensitive to the interface.

In various example implementations, the temperature regulating element can be a heating element, a thermoelectric element, or a laser beam. The heating element may be configured as a resistive element coupled to the spatial region of the device. The thermoelectric element can be thin-film thermoelectric, such as but not limited to a $Bi_2Te_3$-based film or a $CoSb_3$-based skutterudite material.

In an example implementation wherein the temperature regulating element is configured to heat the spatial region of the device, the heating is applied to heat the region to a threshold temperature value of about 22° C., about 25° C., about 30° C., about 50° C., about 70° C., about 100° C., about 120° C., about 150° C., about 170° C., about 200° C., about 250° C., about 300° C., or about 350° C., or higher. In an example, the threshold temperature value is set to be within the range of allowable operating temperatures of an example device.

Example, systems, methods, and apparatus are also provided for tuning the functional properties using an apparatus that includes a plurality of separately addressable regulating elements. Each regulating element can be coupled to a different, respective spatial region of an example device. In this example, each regulating element is configured to regulate a potential difference and either (i) the temperature, or (ii) the electromagnetic radiation exposure, or both (i) and (ii), at each different, respective spatial region of the device, thereby causing a modification in proportionate amount of the at least one ionic species in the portion of the electrically conductive material layer proximate to the interface at each different, respective spatial region of the example device.

Example, systems, methods, and apparatus are also provided for tuning the functional properties of an example device that includes a plurality of device elements (also referred to herein as an active element) in an array, using an apparatus that includes a plurality of regulating elements. A device element can be configured as any of the example device or configuration according to the principles herein, including the example devices of any of FIGS. 5A through 6F or the device configurations of any of FIGS. 7A through 7C. Each of the regulating elements can be coupled to a respective one or more of the device elements. Each regulating element is configured to regulate the potential difference and either (i) the temperature, or (ii) the electromagnetic radiation exposure, or both (i) and (ii), at each of the respective one or more of the device elements, thereby causing a modification in proportionate amount of the ionic species in a portion of the electromagnetic material layer proximate to the interface of the respective device element.

In any example herein, the example device could be configured as a flexible device or a substantially rigid device. In an example device, the target layer and/or the dielectric material layer could be formed of a flexible material. In an example, the example flexible device could include a flexible substrate, and the target layer and dielectric material layer could be disposed over at least a portion of the flexible substrate. In another example, the example device could be configured with a combination of flexible regions and more rigid regions. In any example herein, one or both of the target layer and dielectric material layer could be grown, using any deposition technique and tool in the art, on a large area substrate that includes flexible and rigid regions.

Non-limiting examples of flexible substrates include thin wood or paper, vinyl, leather, or other fabric (including artwork or other works on canvas), a polymer or polymeric material. Non-limiting examples of applicable polymers or polymeric materials include, but are not limited to, a polyimide, a polyethylene terephthalate (PET), a silicone, or a polyeurethane. Other non-limiting examples of applicable polymers or polymeric materials include plastics, elastomers, thermoplastic elastomers, elastoplastics, thermostats, thermoplastics, acrylates, acetal polymers, biodegradable polymers, cellulosic polymers, fluoropolymers, nylons, polyacrylonitrile polymers, polyamide-imide polymers, polyarylates, polybenzimidazole, polybutylene, polycarbonate, polyesters, polyetherimide, polyethylene, polyethylene copolymers and modified polyethylenes, polyketones, poly (methyl methacrylate, polymethylpentene, polyphenylene oxides and polyphenylene sulfides, polyphthalamide, polypropylene, polyurethanes, styrenic resins, sulphone based resins, vinyl-based resins, or any combinations of these materials.

Figure 8A:
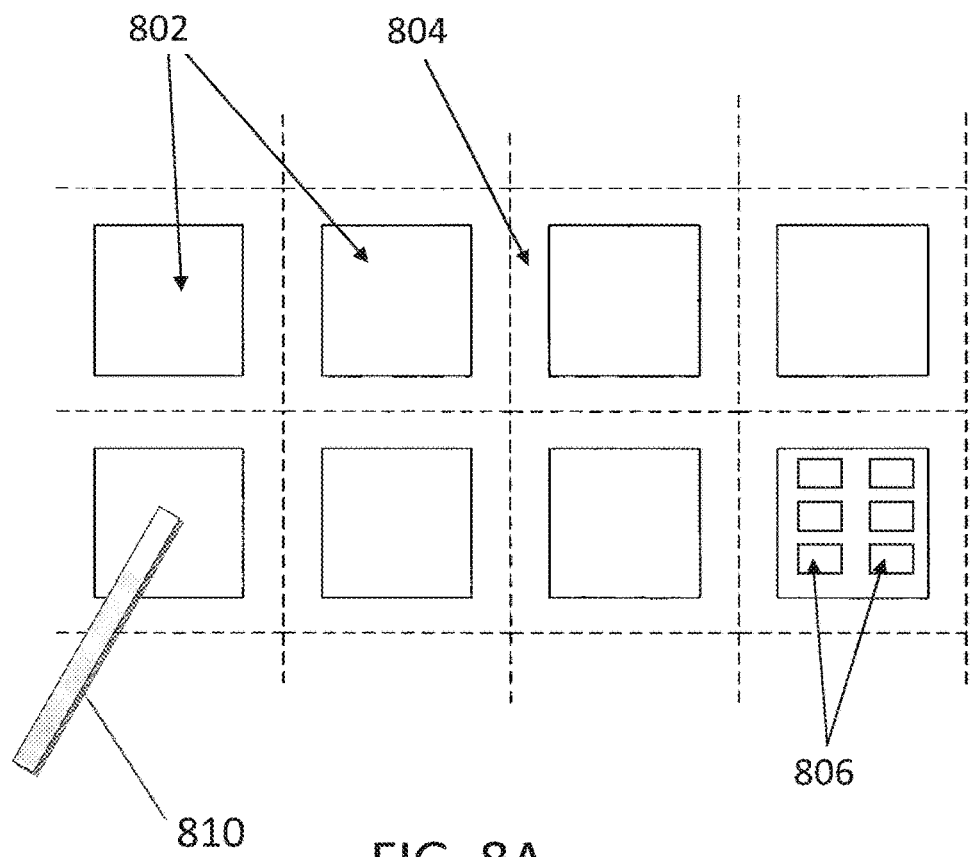
FIGS. 8A and 8B illustrate example two-dimensional arrays, according to principles of the present disclosure.
Figure 8B:
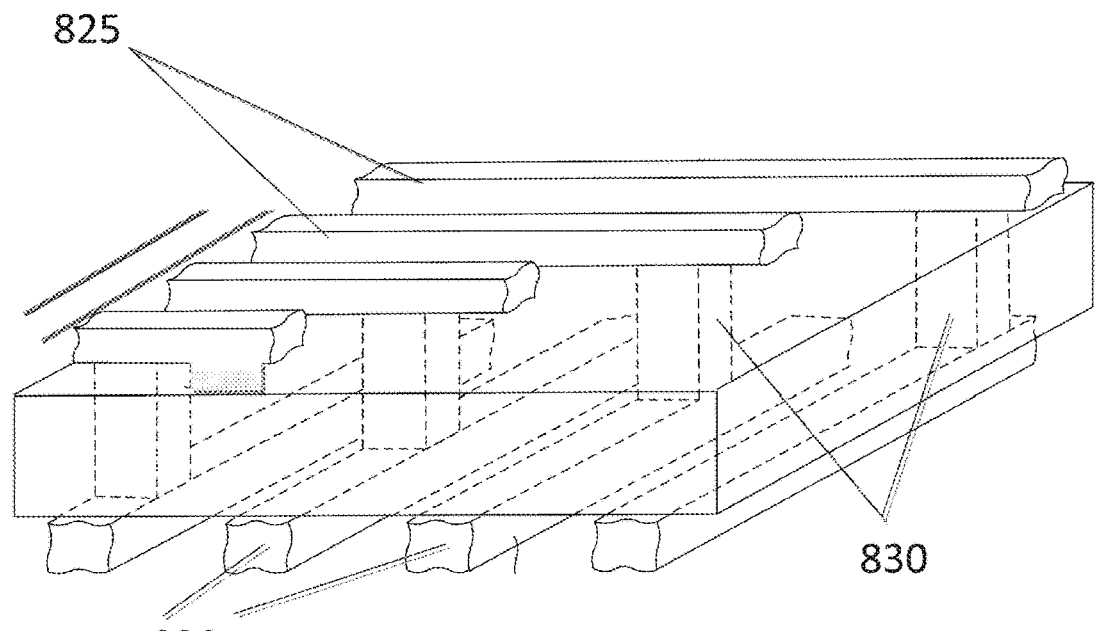
Figure 9:
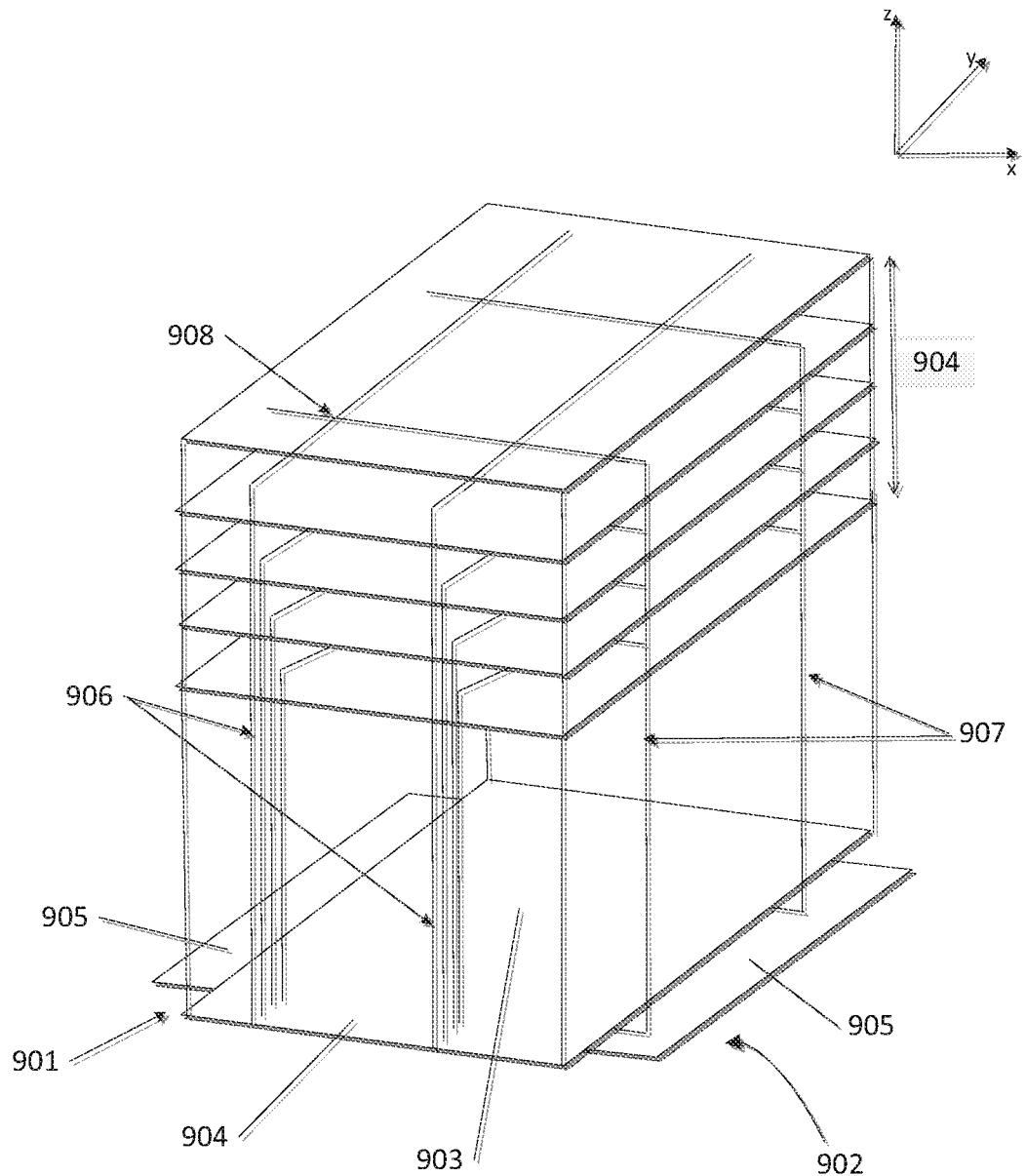
FIG. 9 illustrates an example three-dimensional, multi-layer array, according to principles of the present disclosure.

An example array of device elements according to the principles herein can be a configured as a two-dimensional array (illustrated in FIGS. 8A and 8B) or a three-dimensional, multi-layer array (illustrated in FIG. 9). Device elements of the 2-D or 3-D array can be separately addressable. The device elements can be configured as any of the example devices or configurations herein, including the example devices of any of FIGS. 5A through 6F, or the device configurations of any of FIGS. 7A through 7C. The example systems and apparatus of FIGS. 8A, 8B, and 9, include components and circuits for "writing" (e.g., setting a device component to a first metastable state or a second metastable state) or "reading" from device elements of the example arrays. The read operations may vary depending on the type of application, and can involve, e.g., detecting resistive state of a portion of a device element, sensing the charge of a particular device element, or passing current through the device element.

FIG. 8A shows an example 2-D array of device elements according to the principles herein. The example 2-D array includes a plurality of device elements 802 disposed in separately addressable regions. The example 2-D array can include at least one interstitial region 804 that is devoid of device elements 802. As shown in FIG. 8A, the 2-D array can also include one or more components 806, such as but not limited to at least one processing unit, a power source, power circuitry, one or more sensors (such as but not limited to at least one temperature sensor and/or at least one electromagnetic radiation sensor), at least one wireless communication component, or other integrated circuit (CMOS) components. In some examples, the power source can be a wireless power source. FIG. 8A also illustrates a regulating element 810 that can be coupled to the spatial region of a device element. The regulating element 810 can be configured according to any example herein.

FIG. 8B illustrates an example 2-D array of device elements, configured in a cross-bar geometry. The example 2-D crossbar array composed of a lower layer of approximately parallel cross-bar wires 820 that are overlain by an upper layer of approximately parallel cross-bar wires 825. The parallel cross-bar wires of the upper layer 825 can be oriented roughly perpendicular, in orientation, to the parallel cross-bar wires of the lower layer 820. In another example, although the orientation angle between the upper and lower parallel cross-bar wires may vary. The two layers of cross-bar wires form a lattice, or crossbar, in which each cross-bar wires of the upper layer 825 overlies all of the cross-bar wires of the lower layer 820. The device elements 830 are disposed between an upper layer cross-bar wire 825 and a lower layer cross-bar wire 820, formed between the crossing nanowires at the overlap intersection of the two layers of cross-bar wires. Consequently, each cross-bar wire 825 in the upper layer is connected to every cross-bar wire 820 in the lower layer through a device element and vice versa. Each device element 830 is separately addressable through the selection of the respective upper layer cross-bar wire 825 and lower layer cross-bar wire 820. That is, lower cross-bar wires 820 and upper cross-bar wires 825, can be used to uniquely address, including applying voltages to read data and/or to write data (i.e., set to a first metastable state or a second metastable state) to the device elements. Portions of the cross-bar wires 820, 825 between the device elements can also be configured to serve as conductive lines to the device elements, and as portions of the regulating elements.

FIG. 9 shows an example 3-D, multi-layer array of device elements according to the principles herein. The 3-D multi-layer array is configured as a base 902, a multi-layer arrangement of 2-D arrays 904 disposed over the base, and conductive lines 906, 907 leading from the base to provide electrical communication with each layer of the multilayer structure. At least one device element and regulating element are positioned at the intersections 908 in each 2D array on each layer. Conductive lines 906 can be driven independently using the external applied voltage in each layer. The base 902 includes a wiring area 903 (including CMOS circuitry), and contact areas 904 and 905 for the conductive lines. The multi-layer arrangement of 2-D arrays 902 can include any number of layers (i.e., greater or fewer than four layers). The base 902 includes circuitry and other components for providing instructions for writing (e.g., setting a device component to a first metastable state or a second metastable state) or reading from the 2-D arrays 904 with outside sources. The read operations may vary depending on the types of device, and can involve, e.g., sensing the charge of a particular device element, passing current through the device element, and detecting resistive state. For example, an external voltage can be applied to respective device element(s) using conductive lines 906 and 907. In some examples, wiring area 903 can include a column control circuit including a column switch and/or a row control circuit including a row decoder. The base can be integrated with (CMOS) circuitry for selectively address device elements, providing input/output functions, buffering, logic, or other functionality. For example, the CMOS circuitry can be configured to selectively address, including applying the potential to, the targeted device element(s). The CMOS circuitry can be used to effect the applying the read and write voltages to the conductive lines as described herein.

In the example of FIG. 9, conductive lines 907 are illustrated as being coupled in common in the layers. In other examples, conductive lines 907 may be driven independently in two or more layer using the external applied voltage. The CMOS circuitry can be configured to selectively address (including applying external voltages to) ones of the device elements (the targeted device elements) using the conductive lines 906, 907.

In various example devices and configurations according to the principles herein, including the example devices of any of FIGS. 5A through 6F or the device configurations of any of FIGS. 7A through 9, the electrically conductive material layer can be formed as a nanostrip disposed in the x-y plane. A nanostrip can be configured as a portion of the electrically conductive material layer that is formed as a longitudinal structure. For example, the nanostrip can be configured to have a rectangular cross-section. The nanostrip can have a length to width aspect ratio of at least about 3:2 (i.e., length/width≈1.5), or higher. For example, the aspect ratio can be about 5:1, about 10:1, about 100:1, about 1000:1, or higher. The nanostrip can have a width on the order of nanometers, such as but not limited to about 3 nm, about 5 nm, 0 nm, about 25 nm, or about 50 nm. The thickness of the nanostrip in the z-direction can be less than the width of the nanostrip. In an example, the electrically conductive material layer can include two or more nanostrips.

Figure 10:
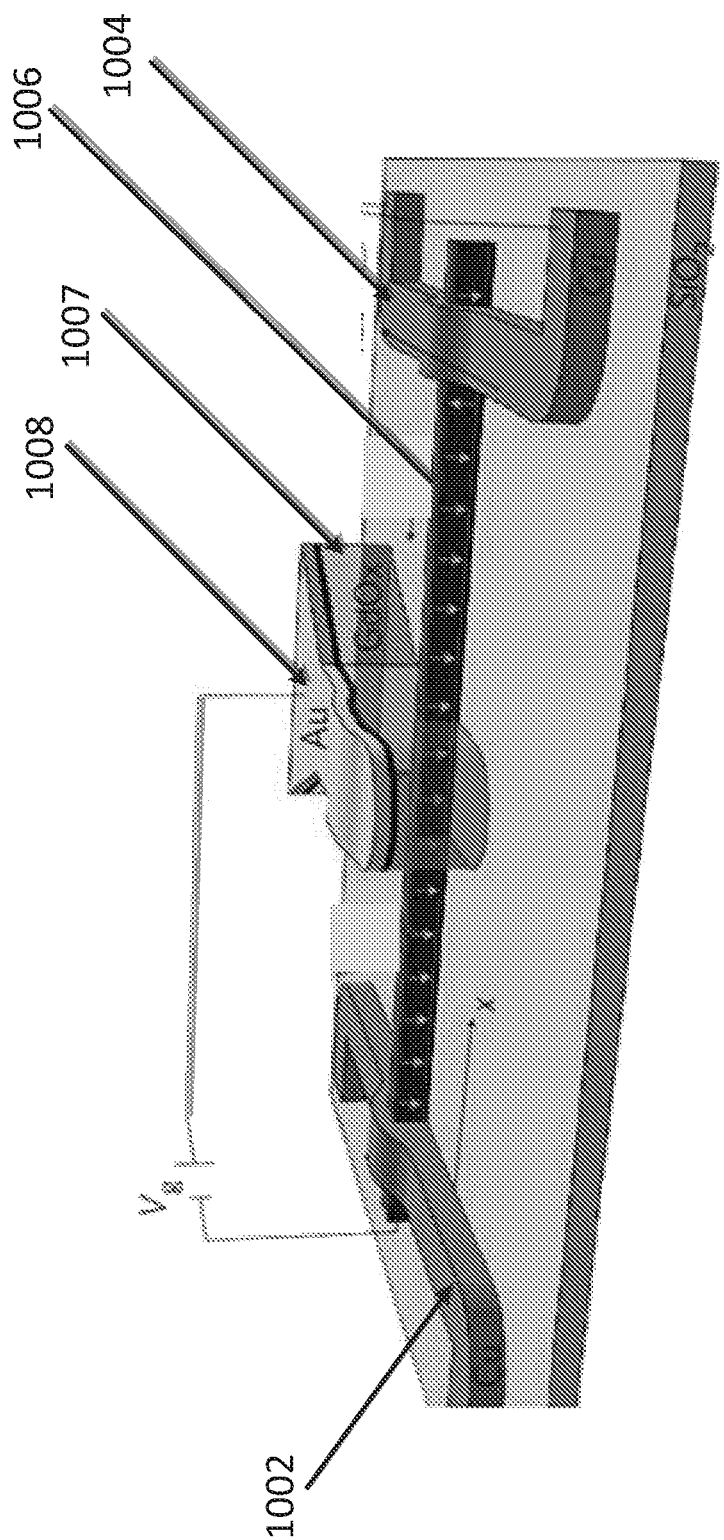
FIG. 10 shows an example memristive device including a nanostrip, according to principles of the present disclosure.

FIG. 10 shows an example memristive device based on a conductive material layer formed as at least one nanstrip. Terminals 1002 and 1004 can used to drive a current through the electrically conductive material layer 1006. The conductive material is at least partially covered by an electronically insulating dielectric material layer 1007 which includes ionic species (cations ($C^{x+}$) and anions ($A^{y-}$). As a non-limiting example, the anions ($A^{y-}$) can be oxide ions ($O^{2-}$). The electronically insulating dielectric material layer also acts as a good ionic conductor. The gate electrode disposed over the insulating layer provides the third terminal 1008 of the device. As shown in FIG. 10, with a non-zero potential difference applied in a first direction across the conductive material layer 1006 and the gate electrode 1008, an amount of the ionic species migrates into portions of the conductive material layer proximate to the interface between the dielectric material layer 1007 and the conductive material layer 1006. The resulting change in the measured value of vertical resistance of the vertical resistive state ($R_V$) can be probed across gate electrode and conductive material layer. The resulting change in the measured value of lateral resistance of the lateral resistive state ($R_L$) can be probed across a segment of the electrically conductive material layer. In various examples, the value of lateral resistance can be measured: (i) across a portion of the electrically conductive material layer that overlaps with the dielectric material layer, or (ii) across a portion of the electrically conductive material layer that does not overlap with the dielectric material layer, or (iii) a segment that encompasses both regions (i) and (ii).

In an example implementation, the example device of FIG. 10 can be formed as a multi-bit device, with multiple gate electrodes forming multiple separately addressable sites to apply at least one of a bias (write) voltage or a read voltage (for determining vertical resistance $R_V$). In another example implementation, the example device can be formed with more than two terminals in electrical communication with the nanostrip to provide for multiple differing probes of the lateral resistance $R_L$ at separately addressable sites.

In any example system, method, apparatus or device according to the principles herein, at least one of a conductive contact or a gate electrode can be formed as a mask. For example, a shadowed mask can be used as electrodes for providing electrical contact to the example device.

Example methods are also provided for tuning the functional properties of an example device. An example method includes (i) irradiating a portion of the example device using electromagnetic radiation, and/or (ii) change the temperature of the portion of the device. The example method includes applying a potential difference in a direction across the dielectric material layer and the electrically conductive material layer for a duration of time sufficient to cause a change in the proportionate amount of the at least one ionic species in a portion of the electrically conductive material layer proximate to the interface. As described herein, this causes a type of property change of the device. The type of property change can be at least one of: magnetic anisotropy property, a magnetic permeability property, a saturation magnetization property, an optical property, a magneto-optical property, an electrical property (including a resistive state), a mechanical property, an d a thermal property of a portion of the device. As described herein, the example device retains the type of property change after discontinuance of the irradiating, and/or the temperature change, of the device.

In various examples, the duration of time for applying the potential difference can be about 1.0 nanosecond, about 10 nanoseconds, about 20 nanoseconds, about 50 nanoseconds, about 100 nanoseconds, about 1 microsecond, about 500 microseconds, about 1 millisecond, about 100 milliseconds, about 500 milliseconds, about second, about 5 seconds, about 10 seconds, about 30 seconds, about 60 seconds, about 3 minutes, about 5 minutes, about 10 minutes, about 30 minutes, about 60 minutes, or longer (including substantially longer periods of time).

In various examples, changing the temperature can include heating the portion of the device to a temperature above a threshold temperature value. The threshold temperature value can be about 22° C., about 25° C., about 30° C., about 50° C., about 70° C., about 100° C., about 120° C., about 150° C., about 170° C., about 200° C., about 250° C., about 300° C., or about 350° C., or higher.

In various examples, the magnitude of the potential difference can be 50 millivolts or less, about 0.1 V, about 0.3 V, about 0.5 V, about 0.7 V, about 1V, about 2 V, about 3V, about 5 V, about 7 V, about 10V, or greater.

According to the principles herein, example methods are also provided for controlling materials properties of a multi-layer device design. In this example, the material property is a resistance state of the conductive material layer of the device. In a non-limiting example, the device design can include three layers and the device can function as a two terminal device. The main part of the multilayer structure can be made of the bilayer of the target material layer (the electrically conductive material layer) whose properties are to be electrically regulated, and a functional material layer (dielectric material layer) that includes the mobile ionic species, i.e., the ionic species that can move between the functional material and the target material in an electric field (from the applied potential difference. The dielectric layer acts as an electrical insulator to block the flow of electrons across the interface between the electrically conductive material layer (target material layer) and the dielectric material layer (functional material layer). The layer of target material is typically thin such that its properties are strongly influenced by the chemical composition of its interface with the functional material layer. In an example device configuration, the target layer can be disposed over and in electrical communication with a first conductive contact layer, the functional layer is disposed over and forms an interface with the target layer, and a second conductive contact layer can be disposed over and in electrical communication with the functional layer. The conductive contact layers are configured to act as the two terminals in this example device configuration. Example implementations herein provide a device having a layer structure for the device. The example devices may also include one or more layers, in addition to those discussed herein) to optimize parameters such as, but not limited to, performance and functionality.

In an example implementation, a sufficiently high voltage is applied between the two terminals of the multilayer structure. The resulting electric field acts to move the mobile ionic species in the functional layer towards (or away) from the interface with the target material (depending on the direction of the electric field). The direction of ionic motion is determined by the charge of the ionic species and the polarity of the applied voltage. Since the properties of the target material strongly depend on the chemical composition and defect structure at the interface with the functional layer, accumulation or depletion of the mobile ionic species at this interface can significantly modify the properties of the target material layer. Also, motion of the mobile ionic species into a portion of the target layer, beyond the immediate interface region, facilitates the modification of the chemical composition and defect structure of parts of the target material layer. This allows access to additional material properties that might not be directly sensitive to the interface. In an example implementation of a multilayer device structure, the target layer could be a non-noble metal and the functional material could be a metal-oxide with high oxygen ion mobility.

In a non-limiting example implementation, the example device includes an electrically conductive material layer forming an interface with a dielectric material layer, to provide a metal/metal-oxide bilayer. Such example devices can be of great commercial and technological interest, since they can be used widely in industries such as the microelectronics and the chemical industry. According to example systems, methods, and apparatus herein, regulation of ionic species at the interface of metal/metal-oxide bilayers in such example device can be caused to regulate functional properties as varied as catalytic activity, charge and spin transport, ionic exchange, mechanical behavior, thermal conductivity, electrical properties, and magnetism. These properties depend sensitively on the oxygen stoichiometry and defect structure at the metal/metal-oxide interface. Voltage application between the two terminals of the example device structure facilitates regulation of the oxygen stoichiometry at the metal/metal-oxide interface, thereby providing control over a wide variety of material properties and device functional properties.

According to the principles herein, an example device can be operated at temperatures above room temperature to speed up the motion of the mobile ionic species and increase the speed at which the properties of the target material can be regulated electrically (using the applied voltage). The higher ionic mobility at elevated temperature also facilitates reduction of the voltage applied to the two terminals of the example device. The temperature range in which the example device is operated can be chosen such that the elevated temperature alone does not result in permanent modifications of the material properties of the electrically conductive material layer. The applied voltage provides directionality to the ionic motion (through its polarity), and the elevated temperature supplies thermal energy to the system to activate the motion of the mobile ionic species of the dielectric material layer.

Example systems, methods, and apparatus according to the principles herein also provide several ways to spatially control the extent of the change to the properties of the target layer, thereby controlling the functional properties of the example device. In an example, the spatial extent of one or more of the electrical contact terminals of the example device is patterned in a configuration that provides spatial control over the extent of application of the applied voltage. The electric field from the applied voltage can be caused to act on the portion of the dielectric material layer within the extent of the electrical contact terminal to drive the mobile ionic species into or out of the target layer. In other examples, the change to the properties of the target layer can be regulated through local control of the voltage and/or temperature of the example device. In a first example, the example device can include means to apply a voltage globally across two conductive contacts (terminals) of the device, and means to regulate the temperature at local spatial regions of the example device. As a non-limiting example, a focused laser beam can be used to supply the thermal energy at local spatial regions of the example device to activate motion of the mobile ionic species in the dielectric material layer. In a first example, the example device can include means to heat substantially the entire example device and meant to apply a voltage at local spatial regions of the example device. As a non-limiting example, the voltage can be supplied using a conductive tip in close proximity to the dielectric material layer (such as but not limited to a tip from a scanning probe microscope). Any combination of local temperature regulation (such as heating) and local voltage application could be used to control the device functional properties, according to the principles herein. In another example, the properties of the target layer can be regulated using electromagnetic irradiation. For example, optical exposure with optical stimulation using electromagnetic radiation can be used to cause changes in the optical functional properties of a device (such as, but not limited to, light transmission characteristics for responsive window tinting or outdoor displays). The optical exposure can be applied to local spatial regions of the example device, or to larger areas of or substantially the entire device. The voltage can be applied to the example device while local spatial regions are irradiated with electromagnetic radiation. In another example, local optical exposure can be coupled with temperature regulation to cause changes in the optical functional properties. For example, the larger areas of or substantially the entire device can be heated to activate the mobile ionic species, and optical exposure can be made to local spatial regions of the example device. The voltage can be applied to the example device while local spatial regions are irradiated with electromagnetic radiation and/or subjected to temperature regulation.

Example systems, methods and apparatus are also provided to electrically control the properties of a thin layer of target material with high spatial resolution. As example apparatus can be implemented to create complex patterns of variations of material properties across a spatially extended area of the example device, thereby generating a device having complex functional properties. The example apparatus can include one or more regulating elements that can be configured to scan across the example device and locally to perform at least one of applying a voltage, regulating temperature, or irradiating using electromagnetic radiation. Thus, the one or more regulating elements can be operated similarly to a "write head" to spatially program the desired materials properties (i.e., introduce the desired metastable state in different spatially distinct regions of the example device). In an example, the spatial resolution of such an example apparatus could be determined by the minimum area at which voltage and/or thermal energy and/or electromagnetic irradiation is supplied to the example device structure using the at least one regulating element. In an example implementation, the apparatus can be configured such that the at least one regulating element scans across the different spatial regions of the example device, to program the desired pattern of variations of metastable state into distinct different spatial regions of the example device. In another example, the apparatus can be configured such that the example device is moved (displaced) relative to a substantially stationary (or limited displacement range) regulating element(s), to program the desired pattern of variations of metastable state into distinct different spatial regions of the example device. In example apparatus where both the at least one regulating element and the example device are configured for displacement, the at least one regulating element could be configured to scan only in one or more directions while the example device is driven (displaced) in a different direction. For example, the at least one regulating element and the example device could be moved in different, perpendicular directions. In these example apparatus, the at least one regulating elements function similarly to the "write head" of a property printer.

Example systems, methods and apparatus herein provided for control of the displacement of the one or more regulating elements and/or the example device using manual control, or control by a control device including at least one processing unit.

Non-limiting examples of control devices include a computing device (such as, but not limited to, a computer, a laptop, a notebook), a smartphone (such as, but not limited to, an IPHONE® (Apple Inc., Cupertino, Calif.), a BlackBerry® (Blackberry Limited, Waterloo, Ontario, Canada), or an Android™-based smartphone), a tablet, a slate, an electronic-reader (e-reader), a digital assistant, or other electronic reader or hand-held, portable, or wearable computing device, or any other equivalent device, or a game system (such as but not limited to an XBOX® (Microsoft, Redmond, Wash.), a Wii® (Nintendo of America Inc., Redmond, Wash.), or a PLAYSTATION® (Sony Computer Entertainment America Inc., San Diego, Calif.)).

Example systems, methods and apparatus provide a graphical user interface configured to allow a user to use property design files, translated into a tool path for controlling the patterning of the metastable states to the example device (like the write head of a property printer). For example, the property design files can be digital files. An example digital property design files can include processor-executable instructions, to be executed by a processing unit, to cause an example apparatus to effect a displacement of the one or more regulating elements and/or the example device, to program the desired pattern of variations of metastable state into the different spatial regions of the example device. An example property design files can include processor-executable instructions, to be executed by a processing unit, to cause an example apparatus to effect the actuation of the one or more regulating elements relative to one or more distinct spatial regions of the example device, to program the desired pattern of variations of metastable state into the different spatial regions of the example device. Execution of the processor-executable instructions of the example property design file would cause the desired positioning of the at least one regulating element and also determine the local dose of one or more of the voltage, thermal energy, and electromagnetic irradiation, to generate the desired pattern of metastable states.

An example property design file can include a two-dimensional (2-D) map of the desired pattern of metastable states for the desired target material properties (and hence device functional properties). This example property design file can include processor-executable instructions, to be executed by a processing unit, to cause an example apparatus to effect a displacement of the one or more regulating elements and/or the example device, to transfer the desired pattern of metastable states to the target material layer. An example graphical user interface can be configured to allow a user to use the 2-D map of the property design files, translated into a tool path for controlling the patterning of the metastable states to the example device (like the write head of a property printer). Execution of the processor-executable instructions of the example property design file would cause the desired positioning of the at least one regulating element and also determine the local dose of one or more of the voltage, thermal energy, and electromagnetic irradiation, to generate the desired pattern of metastable states.

Non-limiting examples of processor-executable instructions include software and firmware.

Example systems, methods and apparatus herein provided for use of a reusable mask, or single use mask, that can be coupled to a portion of a surface of the example device, to selectively couple the one or more regulating elements relative to one or more distinct spatial regions of the example device. For example, an apparatus could be configured such that only exposed parts of the example device area can be subjected to at least one of a voltage, thermal energy, and electromagnet irradiation. Such an example apparatus could allow provide faster throughput at reduced cost. As a non-limiting example, an apparatus could be configured such that a voltage could be applied globally across portions of the example device, and use a high-power lamp (such as but not limited to an infrared lamp) with an opaque mask that to expose selected parts of the example device to electromagnetic radiation. The heat from the electromagnetic radiation can cause local heating of the dielectric material layer, activate the mobile ionic species and to generate the desired metastable state (as described herein), i.e., modify the materials properties only in those exposed areas.

Example systems, methods and apparatus herein provided a platform that provides a pathway to electrically gate a wide variety of key materials in electronics devices. The ability to electrically gate these materials (i.e., using voltage as a parameter to tune metastable properties) facilitates the programming of the patterns of materials properties in the electronic devices, according to the principles of any example system, method and apparatus herein. The example platforms described herein can be used to provide a wide variety of completely new and previously unimaginable electronic devices and applications. Non-limiting examples of envisioned applications of the example systems, methods and apparatus herein include electrically-controllable catalysts for the chemical industry, voltage-controlled optical switches for the optical communications industry, voltage-controlled low power memories for the microelectronics industry, voltage-tunable sensors, and voltage-controlled lateral conductive devices. According to the principles of the example systems, methods and apparatus herein, the capability to pattern material properties over large areas and with high spatial resolution can be exploited to produce low-cost sensors, electronic devices, and lab-on-a-chip systems that might otherwise require many complex and expensive fabrication steps to pattern materials into the desired spatial configuration. Since the material properties changes achievable using the example systems, methods and apparatus occur in response to application of the regulating tools of voltage, temperature regulation, or optical stimulation, or some combination of these regulating tools, environmentally-responsive materials can be designed and developed using these techniques.

Example systems, methods and apparatus are provided for tuning the functional properties of an example device based on use of a spacer layer. In this example, the device includes a dielectric material layer disposed in an x-y plane, a spacer layer disposed over and forming a first interface with the dielectric material layer, and a target layer disposed over and forming a second interface with the spacer layer. The layer structure of such an example device could be described relative to the layer structure of and of FIGS. 6C through 6F. Relative to FIG. 6C or 6E, the electrically conductive material layers could be formed as a bilayer of a target layer and a spacer layer. Relative to FIG. 6D or 6F, the electrically conductive material layers could be formed as a bilayer of a target layer and a spacer layer. The target layer and/or the spacer layer can be configured to reversibly uptake an amount of at least one ionic species that migrates from the dielectric material. The spacer layer can be formed from a transition metal, a rare earth metal, a noble metal, or any combination thereof. The interaction between the target layer and the spacer layer can create hybrid species at the interface that affect the interfacial properties of the target layer. The hybrid states can affect the device functional properties, for example, by modifying the initial state of the interfacial properties of the target layer. For example, the spacer layer can affect ionic transport to the target layer, and can also changes interface properties (to derive a different baseline of properties). This provides additional capabilities for tuning the functional properties of the example device, since the offset of the initial state of a device can cause the device to function in differing functional regimes. The regulating elements can be used to apply a potential difference and/or irradiate and/or regulate the temperature of the spatial region of the device, for a duration of time sufficient to modify a proportionate amount of the at least one ionic species in a portion of the target layer, thereby causing a change of the functional property of the device.

In an example device, the spacer layer is configured through selection of the type of metal material(s) used, the thickness of the spacer layer (in the z-direction), and the conformation of the layer (i.e., the spacer layer being formed as a discontinuous layer, or a continuous layer). In different examples, the spacer layer can have thicknesses ranging from about 0.2 nm, about 0.3 nm, about 0.5 nm, about 0.8 nm, about 1 nm, about 1.3 nm, about 1.5 nm, about 1.8 nm, about 2 nm, about 3 nm or thicker.

For example, an amount of a spacer at the interface between the dielectric material and a transition metal layer can be used to modify the electrical properties of the example device. The type and thickness of the spacer can be tuned to change the starting point at which an apparatus can exert electrical control of the memristive device properties. While a thin spacer layer facilitates operation of the example device in a first functional range, a thicker spacer layer can facilitates operation of the example device in a second functional range that may or may not overlap with the first functional range.

The spacer layer is made sufficiently thin, or formed as a discontinuous layer, that allows the at least one ionic species to reversibly reach portions of the target layer when a potential difference is applied to the device. In an example, the spacer layer can be made of the same type of material as the cation of the dielectric (e.g., a rare earth metal or a transition metal), or a different type of material (including a transition metal, a rare earth metal, or a noble metal). In an example where the spacer layer is formed from a metal that does not support reversible migration of the ionic species, such as but not limited to copper, silver, or gold, the spacer layer can be formed as a discontinuous or "dusting" layer, causing areas of a target layer to be exposed, to allow the ionic species to reach portion of the target layer.

Example systems, methods and apparatus are provided for tuning the functional properties of an example device based on regulation of optical properties of portions of the example device near the interface between an electrically conductive material layer and a dielectric layer. In an example implementation, the device (or device element) can be an optical plasmonic device. In an example device, the electrically conductive material layer can be formed from a transition metal material (such as but not limited to a 1 nm cobalt thin film), and the dielectric material layer forming an interface can be, but is not limited to, a gadolinium oxide material. The example device includes a layer of a noble metal, such as but not limited to silver gold, platinum, palladium (or any alloy thereof) disposed on the other surface of the transition metal material layer. The noble metal layer facilitates an efficient excitation of plasmonic waves at the noble metal-air interface. The reflectivity spectrum of the example optical plasmonic device can be controlled by the oxidation state of the transition metal material layer proximate to the interface. The plasmonic waves at the dielectric/ferromagnetic material interface also can likewise be controlled by regulating the oxidation state of the ferromagnetic layer proximate to the interface. For example, the plasmonic and magneto-plasmonic resonances and reflectivity characteristics at the dielectric-metal interface differs between the state corresponding to a completely oxidized ferromagnetic material layer and the state corresponding to a partially metallic ferromagnetic material layer. Typically, the plasmonic resonances in magnetic materials are weak and broad. By contrast, if the ferromagnetic material layer includes a larger proportionate amount of the ionic species (e.g., is completely oxidized), then portions of the ferromagnetic material layer become dielectric, thereby changing the nature of the modified ferromagnetic material layer/noble metal interface. This causes portions of the example device to exhibit the sharper plasmonic resonance and different reflectivity characteristics of the noble metal. According to the example systems, methods and apparatus herein, the patterning of the metastable state of the ferromagnetic material layer proximate to the interface can be used to control the local reflectivity of different portions of the example optical plasmonic device. The example systems, methods, and apparatus according to principles described herein also apply to this example implementation.

The functional properties of an example optical device can be tuned by using a spacer layer disposed between the target layer and the dielectric material layer. For example, the spacer layer can be configured to tune the surface properties of the underlying target layer, which cause the optical device to exhibit a different set of baseline of properties. Non-limiting example of such a functional property can be an optical modulation, a photonic property, a plasmonic resonance, a reflectivity, or a magneto-optical property of the target layer and/or spacer layer. By controlling the progression of the migration of the ionic species into portions of the target layer and/or the spacer layer according to the principles described herein, the functional property of the device can be tuned. The migration of the ionic species converts portions of the target layer and/or spacer layer from a metal material to a dielectric material, thereby modifying the optical properties. As a result, the optical properties of the device can be tuned reversibly.

For example, the presence of a spacer layer can modify the type of collective plasmonic resonance properties of the bilayer of the target layer and the spacer layer. Where a device without a spacer layer may exhibit a sharper plasmonic resonance, a device with a spacer layer may exhibit a broader plasmonic resonance. Typically, the plasmonic resonances in magnetic materials are weak and broad, while the plasmonic resonance in a noble metal is sharp. An example device can include a bilayer of a ferromagnetic spacer layer and a noble metal target layer. If the spacer layer is completely oxidized, then the spacer layer itself acts as a dielectric material. With substantially complete oxidation of the spacer layer, the interface between the target layer and the spacer layer exhibits sharp plasmonic resonance and different reflectivity characteristics. By controlling the progression of the migration of the ionic species into portions of the target layer and/or the spacer layer according to the principles described herein, the optical property (including plasmonic resonance) of the device can be tuned. For example, the plasmonic resonance property of the example device can be tuned reversibly from a broader plasmonic resonance to a sharper plasmonic resonance based on the proportionate amount of the ionic species that is caused to migrate into portions of the target layer and/or the spacer layer using the systems, methods, and apparatus according to the principles described herein. This is based on the presence of the ionic species converting portions of the target layer and/or spacer layer from a metal material to a dielectric material, thereby modifying the optical properties. As a result, the optical properties of the device can be tuned reversibly.

An example device having a noble metal layer over a transparent dielectric material layer may exhibit a sharper plasmonic resonance. An example device with a spacer layer of a thin transition metal layer between the noble metal layer and the transparent dielectric material layer may exhibit a broader plasmonic resonance. As non-limiting examples, the thin transition metal layer can be a cobalt layer and the noble metal layer can be a gold layer. By controlling the progression of the migration of the ionic species into portions of the thin transition metal spacer layer, the plasmonic resonance can be tuned. The presence of the ionic species converts portions of the transition metal spacer layer from a metal material into a dielectric material, causing the sharper plasmonic resonance of the noble metal layer to re-appear. Since the migration of the ionic species can be controlled reversibly, the example device can be controllably cycled between the differing plasmonic resonance properties.

Example systems, methods and apparatus are provided for tuning the functional properties of an example device based on regulation of magneto-optical properties of portions of the example device near the interface between an electrically conductive material layer and a dielectric layer. In an example device, the electrically conductive material layer can be formed from a bi-layer of a spacer layer including at least one rare earth metal material and a target layer including at least one ferromagnetic transition metal material. Non-limiting examples of applicable rare earth metals include gadolinium, terbium, dysprosium, holmium, or neodymium. Non-limiting examples of applicable rare earth metals include iron, cobalt, and nickel. In an example device, the electrically conductive material layer can be formed from an alloy including at least one rare earth metal material and at least one ferromagnetic transition metal material. The rare-earth/magnetic-transition-metal electrically conductive material alloy or bi-layer can exhibit a significant magneto-optical Kerr effect. The magneto-optical Kerr effect is the change in the polarization and ellipticity of electromagnetic radiation that is reflected from the electrically conductive layer. The rare-earth/transition metal ferromagnet multilayers and alloys exhibit large magneto-optical constants, while transition metal ferromagnetic materials exhibit relatively smaller magneto-optical constants. Therefore, the magneto-optical Kerr rotation and ellipticity of light reflected at the dielectric/metal interface can be substantially different between the device state where the rare earth metal layer includes a large proportionate amount of the ionic species (e.g, the rare earth metal is completely oxidized) compared to the device state where the rare earth metal layer includes a much smaller proportionate amount, or none, of the ionic species (e.g, the rare earth metal remains unoxidized). Thus, the optical functional properties of the example device, such as but not limited to the state of rotation of the polarization of electromagnetic radiation reflected from the example device, can be controlled based on regulating the migration of the ionic species into portions of the target layer and/or spacer layer according to the principles herein. By regulating the migration of the ionic species into portions of the electrically conductive material layer according to the principles herein, the magneto-optical properties of the example device can be changed and regulated. An example device can be configured to implement this magneto-optical effect, to allow for the control of the polarization of light, for use in such applications as optical signal transmission and modulation in photonics. Other non-limiting example implementations of device include optical switching, optical filter applications, on-chip application, electromagnetic radiation polarization rotation, and polarizers. For example, an example device can be used to rotate the polarization of electromagnetic radiation so that the polarization of electromagnetic radiation can, or cannot, get through a polarizer component coupled to the example device, thereby providing an optical switch. A non-limiting example device can include a dielectric layer formed from gadolinium oxide, forming an interface with a gadolinium metal spacer layer, which forms an interface with a cobalt target layer. The spacer layer and/or the target layer can have a thickness in the range of about 0.5 nm, about 1.0 nm, about 1.5 nm, about 2.0 nm, about 2.5 nm, about 3.0 nm, about 3.5 nm, about 4.0 nm, or greater.

Example systems, methods, apparatus herein provide example devices that exhibit bistable nonpolar memristive switching. After electroforming, the resistance of the example devices can be electrically switched by about 5 orders of magnitude. This switching behavior is observed to correlate with voltage-driven motion of the migration front of the ionic species into a portion of the conductive material layer. For example, the switching behavior is observed to correlate with voltage-driven motion of the oxidation front and suggests a memristive switching mechanism based on oxygen anions.

As described hereinabove, the use of the example memristive devices can be based on reversible switching of the resistance across the dielectric material layer ($R_V$), or reversible switching of the lateral resistance in the conductive material layer. As non-limiting examples, the memristive device can be based on reversible switching of the vertical resistance across the oxide layer ($R_V$) and/or the reversible switching of the lateral resistance a conductive material layer formed from a transition metal material. The integration of this novel resistive switching mechanism into transition metal nanowire and nanostrip devices show potential for applications as novel micro and nanoscale electrical switches.

The example systems, methods, apparatus and devices according to the principles herein exhibit two distinct memristive switching mechanisms with changes in resistance of up to 5 orders in magnitude, also exhibit unprecedentedly strong voltage effects on memristive properties.

In a non-limiting example implementation, a memristive device can be formed from deposition of continuous thin films of Ta(4 nm)/Pt(3 nm)/Co(0.9 nm)/GdOx(33 nm) on a Si(100) substrate. The dielectric material layer is formed from a GdOx layer. The conductive material layer is formed from Co. On top of the dielectric GdOx layer, a 100 μm diameter Gd(2 nm)/Au(12 nm) gate electrodes can be deposited. Layer thicknesses can be controlled by controlling the deposition rate of each material.

In an example, example devices can be deposited based on conductive materials layers formed from nanostrips of conductive materials (such as shown in FIG. 10). As described hereinabove, the strips can be formed as nanowires. As a non-limiting example, nanostrips that are 500 nm wide, 50 μm long can be patterned to form the example devices. The example device can be formed with layered structure Ta(4 nm)/Pt(3 nm)/Co(0.9 nm)/GdOx(3 nm). The dielectric material layer is formed from a GdOx layer. The conductive material layer is formed from Co. Sets of 50 nm thick Cu contacts can be deposited on the nanostrip, one spaced 50 μm apart and the other spaced 40 μm apart to provide multiple contact. These contacts provide the 4 terminals required to probing the resistance of the nanowire. Next, the nanostrip is covered by 30 nm GdOx. On top of the GdOx layer, 30 μm wide Ta(2 nm)/Au(12 nm) gate electrodes were deposited at the center of the nanowire. The aim of this device structure is to avoid an open GdOx edge right underneath the electrode perimeter, such that the oxygen stoichiometry can be modified uniformly across the entire electrode.

The electrical properties of the continuous thin film samples are probed at RT, in the dark and under medium vacuum conditions to reduce the influence of illumination and atmospheric oxygen on device characteristics. Mechanical microprobes are used to contact the Au top electrodes and the Ta/Pt/Co bottom electrode which is common to the devices. Current-voltage characteristics are measured.

The resistance of the example nanostrip samples is measured in ambient atmosphere and in a four (4) terminal geometry. For resistance measurements the four (4) Cu electrodes are contacted with mechanical microprobes and sense currents of −5 µA to −+5 µA are applied through the two outer electrodes. The two inner electrodes are used to measure the voltage drop along the nanostrip, resulting from the sense current and the resistance was extracted from linear fits of voltage versus sense current. In order to control the oxygen stoichiometry at the Co/GdOx interface, gate voltages Vg were applied between the Ta/Au top electrode and the transition metal nanowire at 120° C. and for each device state, the nanowire resistance was extracted as described above. In all cases, positive bias refers to the top Au electrode being positive with respect to the Ta/Pt/Co bottom electrode.

Polar MOKE measurements are made on the nanowire samples, using a 532 nm diode laser attenuated to 1 mW. The laser is focused to a ~3 µm diameter probe spot and positioned by a high resolution scanning stage with integrated temperature control.

Example implementation of the voltage control of vertical resistance is as follows. The electrical properties of Ta(4 nm)/Pt(3 nm)/Co(0.9 nm)/GdOx(33 nm) with 100 µm wide Gd(2 nm)/Au(12 nm) gate electrodes are measured to demonstrate the link between memristive switching and the magneto-ionic effect. Here, voltages Vg and currents $I_V$ are applied and measured between the top and bottom electrode of the metal/oxide/metal devices and the resistance state of a device then refers to the resistance across the oxide layer, i.e., the vertical resistance $R_V$ of the device.

In the virgin state, the devices show high vertical resistance RV of ~100 GOhm at a voltage of $I_V$.

Figure 11A:
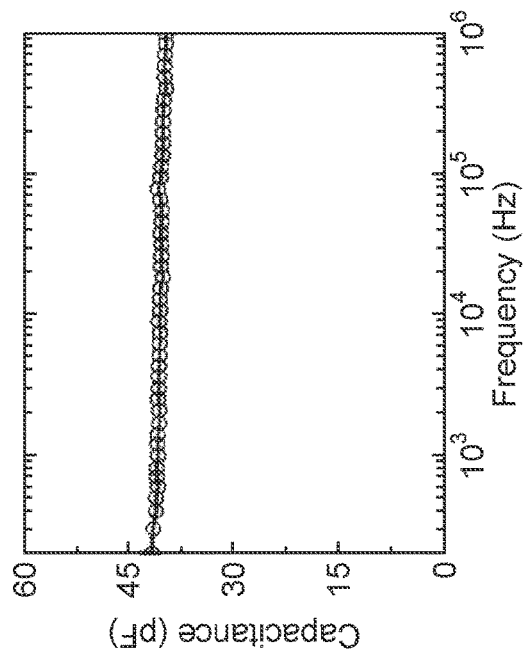
FIGS. 11A-11B show plots of measurements of an example memristive device, according to principles of the present disclosure.
Figure 11B:
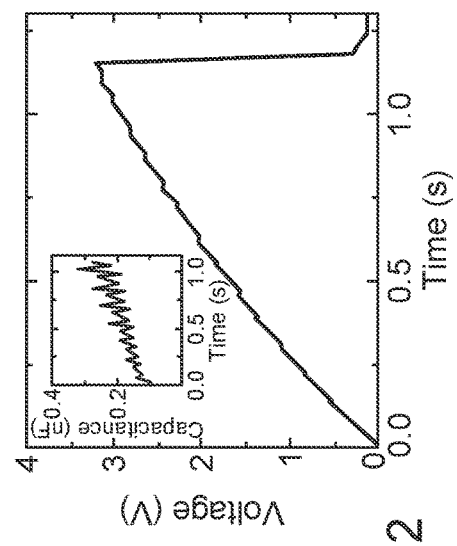

FIGS. 11A-11B show a plot of the results of the measurements of the electrical characterization of an example device in an unprogrammed state (i.e., prior to application of a voltage). FIG. 11A shows cyclical voltammetry curve measured at a voltage scan rate of 0.4V/s. FIG. 11B shows capacitance frequency characteristic measured at zero bias with an AC amplitude of 0.3V on Ta(4 nm)/Pt(3 nm)/Co(0.9 nm)/GdOx(33 nm) with 100 µm wide Gd(2 nm)/Au(12 nm) gate electrodes. The cyclical voltammetry measurements are performed in a voltage range of ±2 V, and show nearly rectangular curves indicating the devices behave like ideal passive capacitors. The rounded corners are likely the result of power loss during charge and discharge of the capacitor due to series resistance originating from the electrical contacts and electrodes. The rapid rise in current above ±1.5 V also indicates the emergence of ionic processes in the GdOx layer, above that voltage. The device capacitance C can be determined geometrically from Eq. 1 and from a fit to the data plotted in FIG. 11A using Eq. 2, as follows:

$$C = \varepsilon_0 \varepsilon_r F / d_{GdOx} \qquad \text{Eq. 1}$$

$$C = I_V / dV_g / dt \qquad \text{Eq. 2}$$

Here, $\varepsilon_0$ is the permittivity of free space, $\varepsilon_r$ is the dielectric constant of GdOx, which typically is ~16. Symbol F is the electrode area, and $d_{GdOx}$ is the thickness of the GdOx layer. In Eq. 2, dVg/dt corresponds to the voltage scan rate of ~0.4V/s. With both equations the device capacitance is computed as similar values of ~35 pF.

These computation results are in good agreement with the capacitance measurements performed in FIG. 11B, which yield capacitance C≈40 pF across the entire frequency range from 200 Hz to 1 MHz. The flat frequency dependence of C confirms the nearly ideal capacitor behavior at low bias voltages. These results are consistent with a conclusion that, at low bias voltages, the voltage-induced changes can be attributed to magnetic properties to electron accumulation/depletion in the Co electrode.

To use the metal/oxide/metal capacitor structures into programmable memristive switching devices initially involves electroforming step, involving either sweeping Vg to high bias voltages or applying constant current stress (CCS). These methods can be used to turn the nearly insulating virgin devices into a memristive memory with a high resistance state (OFF-state, or "0") and a low resistance state (ON-state, or "1").

Figure 12:
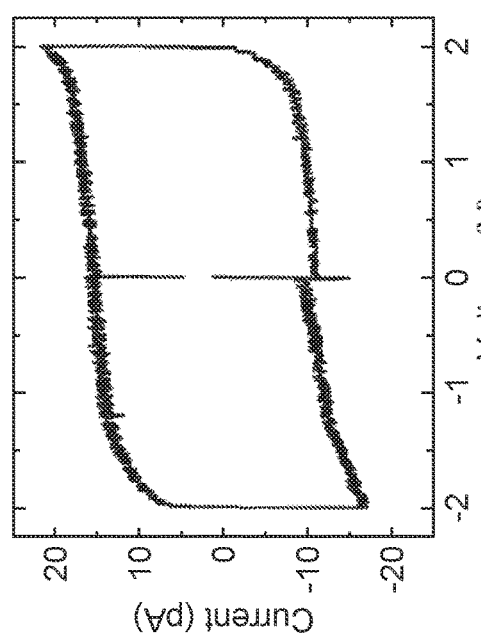
FIG. 12 shows a plot of measurements of electroforming of an example memristive device via constant current stress (CCS), according to principles of the present disclosure.

FIG. 12 shows electroforming of an example device formed as a Pt/Co/GdOx/Gd/Au capacitor under CCS. The voltage across a Ta(4 nm)/Pt(3 nm)/Co(0.9 nm)/GdOx(33 nm)/Gd(2 nm)/Au(12 nm) capacitor is monitored over time, while a constant currents stress of 500 pA is applied. The inset shows the device capacitance derived from the slope of voltage versus time in the main figure. A current stress of 500 pA is applied and the voltage across the device is monitored over time. We find that the voltage increases continuously over time until it reaches a critical value of ~3V after ~1.1 s. Above this critical value, the voltage required to sustain the constant current of 500 pA suddenly drops, indicating the formation of a conducting path through the GdOx layer. The device has now been electroformed and is in its low resistance or ON state.

In electroforming via CCS, the current is kept constant and therefore changes in the slope dVg/dt correspond to changes in device capacitance (see Eq. 2). The capacitance during CCS is plotted in the inset of FIG. 12 and increases steadily while the voltage approaches its critical value. This increase in capacitance can be attributed to charge trapping and defect formation/migration in the oxide layer, which typically precedes the formation of a conductive path through the oxide layer.

Alternatively, the example memristive devices can be electroformed by sweeping Vg from 0 to +12 V or 0 to −12 V while the compliance current is set to IV=10 mA. While this method results in switchable devices, the power dissipated during electroforming can be much higher in the voltage sweeping method than in the CCS method. The CCS method can be used to keep device degradation to a minimum.

FIGS. 13A-13B shows example memristive switching in example devices based on a Pt/Co/GdOx/Gd/Au layer structure. FIG. 13A shows the current-voltage characteristic showing transition from low resistance ON state to high resistance OFF state (RESET) during a positive voltage sweep. FIG. 13B shows the current-voltage characteristic of ON and OFF states. The Ta(4 nm)/Pt(3 nm)/Co(0.9 nm)/GdOx(33 nm)/Gd(2 nm)/Au(12 nm) devices were initially electroformed under constant current stress of 500 pA. After electroforming, the Pt/Co/GdOx/Gd/Au devices are in their low resistance ON state and exhibit reliable resistive switching. In the ON state, a sweep of Vg beyond a so called RESET voltage of typically 2 V to 5 V results in an abrupt drop in the current through the device, corresponding to a transition from the low resistance ON state to the high resistance OFF state (see FIG. 13A). Similarly, in the OFF state, a sweep of Vg beyond the so called SET voltage of 7 V to 10V results in an abrupt increase in the current and thus a transition from the OFF back to the ON state (not shown here). At Vg=1 V, the resistance in the OFF state is $R_V \approx 50$ MOhm whereas in the ON state $R_V \approx 500$ Ohm, implying resistance switching by 5 orders in magnitude (see FIG. 13B).

Although the SET and RESET processes occur reliably under positive bias. Sweeping Vg to negative bias during the SET and RESET process can also switch the device between the ON and OFF state. Various combinations of bias polarities during SET/RESET, i.e., positive/positive, negative/negative, negative/positive and positive/negative, can give rise to resistive switching in the example memristive devices herein. This polarity independence of the switching characteristics suggests that the memristive switching observed in the memristive devices according to the principles herein are of the bistable nonpolar type.

The formation of conductive filaments in the oxide layer can be due to the combined effect of Joule heating and electric field. In nonpolar switching, electroforming is typically explained in a two-step process. A purely electronic effect establishes a hot electronic filament and the resulting high current densities then drive changes in material composition through heat-assisted ionic motion. The RESET switch results from thermal rupture of the conducting filament, similar to a fuse, and is likely driven by heat assisted ionic motion in the concentration gradient around the filament.

In the non-limiting example Pt/Co/GdOx/Gd/Au memristive devices according to the principles herein, there is the unique benefit of a thin ferromagnetic layer between the oxide and the bottom electrode. With its sensitivity to interface chemistry and structure (i.e., the magneto-ionic effect) the ferromagnetic layer almost acts as a sense layer that allows identification of voltage-induced modifications of interface composition and chemistry. Therefore, combining the results of the magneto-ionic switching measurements with the results of the memristive switching measurements, provides additional insight into the microscopic mechanisms behind nonpolar switching.

In various example memristive devices according to the principles herein, oxygen anion migration provides for magneto-ionic coupling in Pt/Co/GdOx/Gd/Au devices, consistent with oxygen anions giving rise to memristive switching in these devices.

The evolution of the resistive properties during electroforming of any example memristive device described herein, using positive or negative bias, is as follows. Under positive bias, modifications of the resistive properties are measured before the device switches to the low resistance ON state. This indicates that filaments first nucleate at the conductive material (Co) layer and then grow towards the Gd/Au top electrode. Moreover, the spatially extended nature of the modifications in resistive properties suggests that modifications of the oxide composition and therefore the interface oxygen stoichiometry are not limited to individual, localized filaments but likely occur across the whole electrode area. This result is very different from the simple model of local filament growth which is usually employed to explain electroforming in conventional memristor devices. Results also indicate that no changes in resistive properties occur during SET and RESET of the memristive devices, indicating that filament rupture can occurs far away from the conductive material (Co) layer. The structural and chemical sensitivity of transition metal thin films can therefore indeed provide an additional window into the microscopic processes that give rise to memristive switching.

Figure 14A:
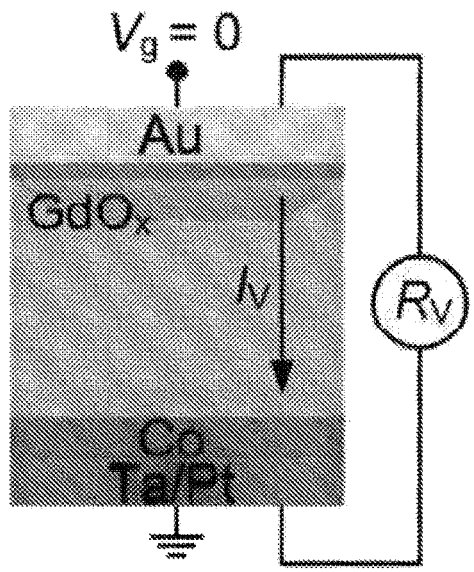
FIGS. 14A-14D show schematics of memristive switching mechanism in example memristive devices, according to principles of the present disclosure.
Figure 14B:
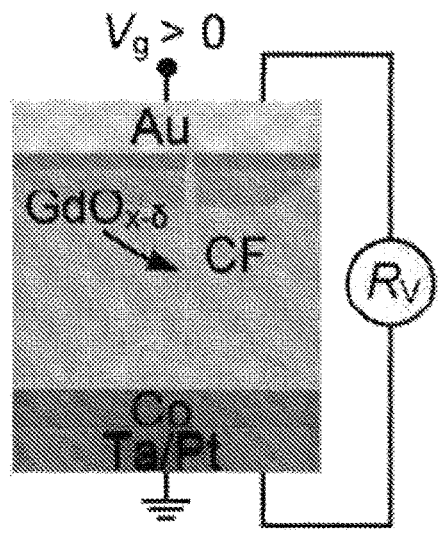
Figure 14C:
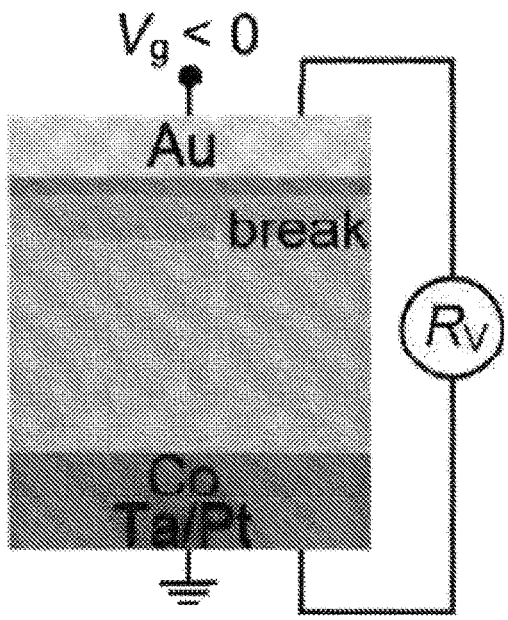

FIGS. 14A-14B show schematics of memristive switching mechanism in an example memristive device based on a Ta(4 nm)/Pt(3 nm)/Co(0.9 nm)/GdOx(33 nm)/Gd(2 nm)/Au (12 nm) device structure. FIG. 14A shows a virgin device in its insulating state. FIG. 14B shows the result after electroforming at positive voltage Vg, where a conductive filament (CF) made of oxygen deficient GdOx (GdOx-δ) connects the two electrodes and switches the device to the ON state. After electroforming, the filament can be broken (RESET to OFF state) and reestablished (SET to ON state) by applying a positive or negative bias voltage. FIG. 14C shows the result with application of a positive bias voltage (Vg>0). FIG. 14C shows the result with application of a negative bias voltage (Vg<0). The $R_V$ is the vertical resistance and $I_V$ is the current flowing vertically through the device.

FIGS. 14A-14B provide a simple model for memristive switching in Pt/Co/GdOx/Gd/Au devices. During electroforming at positive Vg (FIG. 14B), the Gd/Au electrode likely acts as a source for oxygen vacancies. In the applied bias, the oxygen vacancies are driven through the GdOx layer, towards the Pt/Co electrode and accumulate at the Co/GdOx interface. Due to oxygen vacancy accumulation an oxygen deficient and therefore conductive GdOx phase forms at the Co/GdOx interface and grows towards the Gd/Au electrode, such that eventually a conducting filament connects the electrodes and the device switches to the ON state. As the magnetic results suggest, the oxygen deficient GdOx phase likely forms across the whole electrode area but extended filaments grow only in certain locations, likely where their growth is aided by the availability of a high diffusion path.

Figure 14D:
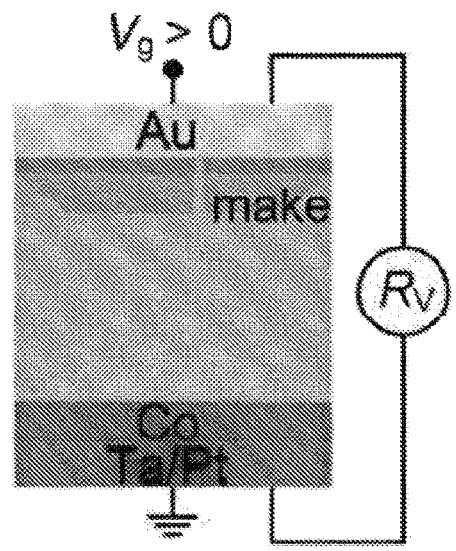

In FIG. 14C, filament rupture is induced during the RESET process, which switches the device to the OFF state. Due to the growth direction of the filament, rupture likely occurs in proximity to the Gd/Au electrode, where the filament diameter is expected to be smaller than closer to the Pt/Co electrode. The filament can then be reestablished by application of positive Vg. (see FIG. 14D). This SET process transitions the device back to the low resistance ON state.

This switching mechanism indicates that, in the example memristive devices according to the principles herein, magneto-ionic switching occurs during the slow electroforming step rather than during the fast SET and RESET steps of the memristor. In memristive switching, electroforming is considered undesirable because it is slow, unpredictable, and potentially destructive to the device. Electroforming in conventional memristive switching includes growth of a filament, and therefore ionic motion, across the whole thickness of the oxide. In magneto-ionic switching, ions need to be displaced only by atomic distances from the electrode interface, which should allow for switching times similar to the fast SET and RESET steps in memristive switching.

Example implementation of the voltage control of lateral resistance is as follows. In ultra-thin metal films and wires, electron scattering at surfaces and interfaces can contribute significantly to the overall resistivity. Modifying in interface chemistry and structure can result in changes in resistivity. The ability to electrically control the oxygen stoichiometry at the Co/GdOx interface provides the ability to tune the lateral resistance $R_L$ in a memristive device based on a Ta(4 nm)/Pt(3 nm)/Co(0.9 nm)/GdOx(3 nm) multilayer structure. In this example, the conductive material layer is formed as a nanostrip.

Figures 15A, 15B, 15C, 15D:
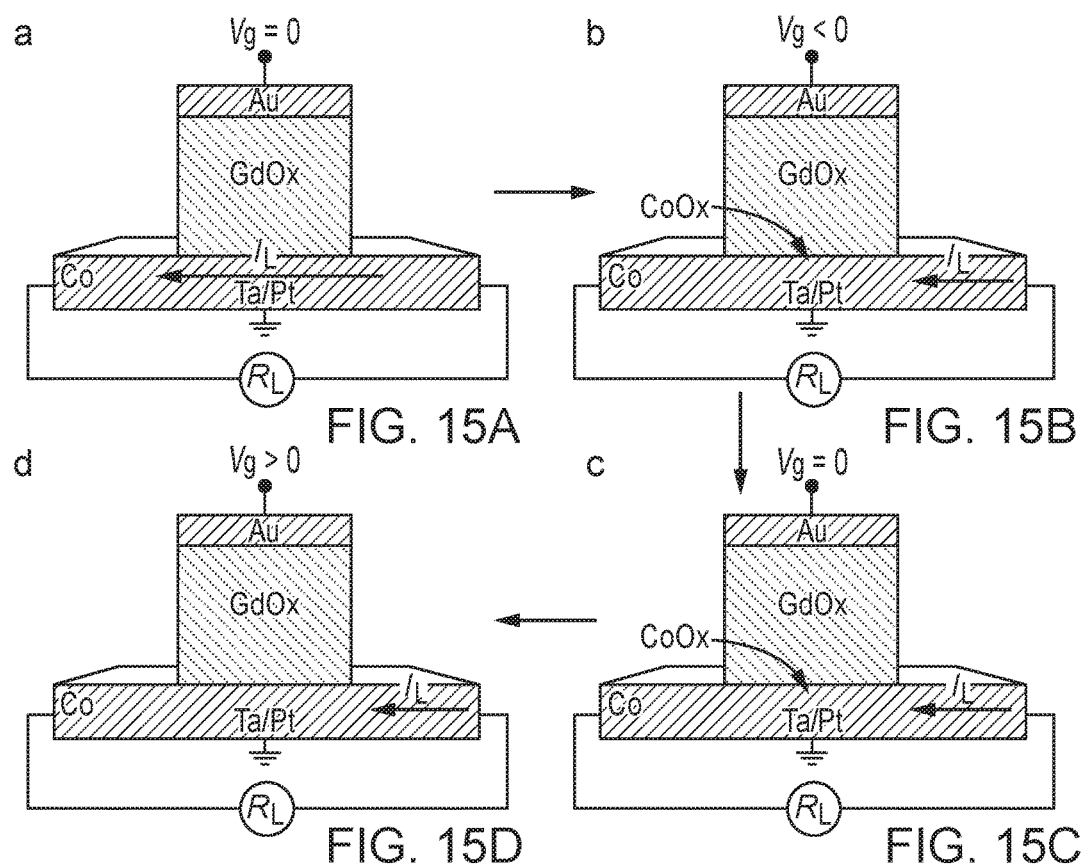
FIGS. 15A-15D schematically show an example of lateral resistive switching in an example memristive device, according to principles of the present disclosure.

FIGS. 15A-15D schematically show an example of lateral resistive switching in a nanoscale memristive device formed with a nanostrip. FIG. 15A shows the example Ta/Pt/Co nanostrip device in the virgin state (i.e., prior to electroforming. FIGS. 15B-15D show a schematic of the example nanostrip device after sequential application of a negative bias voltage Vg<0 (see FIG. 15B), no bias voltage Vg=0 (see FIG. 15C), and a positive voltage Vg>0 (see FIG. 15D), to the GdOx/Ta/Au gate electrode. In each device state, the lateral resistance $R_L$ is measured based on the voltage necessary to drive the current h through the nanowire. At Vg<0, the oxidation front migrates into the Co layer and oxidizes Co to cobalt oxide (CoOx). These modifications are retained at zero bias voltage (see FIG. 15C) but can be reversed at Vg>0 (see FIG. 15D). In each device state, the lateral resistance $R_L$ is measured based on the voltage to drive the current $I_L$ through the nanostrip. Under a negative bias voltage Vg<0, oxygen anions are expected to migrate towards the Co/GdOx interface, such that under extended bias application, the Co layer itself is oxidized (see FIG. 15B). At Vg<0, the oxidation front migrates into the Co layer and oxidizes Co to cobalt oxide (CoOx). Due to the insulating properties of Co oxide (CoOx), migration of the oxidation front into the Co layer reduces the effective cross section of the metal nanostrip and increase its resistance. Similar to magneto-ionic coupling, retention of the resistance modifications is expected in zero bias (see FIG. 15C). These modifications are retained at zero bias but can be reversed at Vg>O. As shown in FIG. 15D, a positive bias reverses the effect. In order to verify this behavior experimentally, 50 μm long and 500 nm wide Ta(4 nm)/Pt(3 nm)/Co(0.9 nm)/GdOx(3 nm) nanowires were covered with a 30 μm wide GdOx(30 nm)/Ta(2 nm)/Au (12 nm) gate electrode, to control by voltage the oxygen stoichiometry at the Co/GdOx interface. The lateral resistance RL of the nanowire is then measured with the four terminal technique and simultaneously magnetic hysteresis loops are acquired from the nanowire, to confirm via magneto-ionic coupling that voltage-induced changes to oxygen stoichiometry occur.

In each device state of FIG. 15B-15D, the lateral resistance $R_L$ is measured based on the voltage necessary to drive the current $I_L$ through the nanowire.

FIGS. 16A-16C show the plots of results of computation of lateral resistive switching and magnetic property modifications. FIG. 16A-16B show the evolution of the coercivity Hc, and lateral resistance $R_L$, respectively, under bias voltage at 120° C. for a 500 nm wide and 50 μm long Ta(4 nm)/Pt(3 nm)/Co(0.9 nm)/GdOx(3 nm) nanowire with a GdOx(30 nm)/Ta(2 nm)/Au(12 nm) gate electrode. Error bars are smaller than the data point size. FIG. 16C shows the bias voltage applied. The evolution of the resistance RL and coercivity Hc is measured during sequential application of Vg=−5 V for 6 minutes and Vg=+5 V for 4 minutes. Every 2 minutes the gate voltage is momentarily removed to facilitate measurements of RL and Hc. Under negative bias we observe a gradual reduction of Hc from 210 Oe to 70 Oe, which is then reversed under positive bias (FIG. 8 6(a)).

FIGS. 16A-16C show that, at the same time $R_L$ increases by ~4% under negative bias and then returns close to its initial value under positive bias (see FIG. 16B). The resistance modifications are nonvolatile and remain at zero bias. This behavior is consistent with the projection that oxidation of the Co/GdOx interface and the Co layer itself should result in a measurable increase in wire resistance. Using typical bulk values for the resistivity of Co, Pt, and Ta of 60, 100, and 2000 nΩm respectively, and treating the three layers as a set of three parallel resistors, it is determined that a 4% increase in resistance corresponds to a reduction of the Co metal thickness by ~0.2 nm or 20%. Under negative bias, a gradual reduction of Hc from 210 Oe to 70 Oe is measured, which is then reversed under positive bias (FIG. 16A). This confirms that the oxidation front migrates towards/away from the bottom electrode under negative/positive bias, respectively.

In an example, the ionic species may migrate uniformly into the conductive material layer, resulting in a substantially uniform reduction in thickness of the conductive portion of the conductive material layer, thereby resulting in the higher resistance lateral resistive state. In another example, the ionic species may penetrate the conductive material film primarily along fast diffusion paths, such as grain boundaries, and therefore mainly affect electron scattering at grain boundaries, thereby resulting in the higher resistance lateral resistive state. In another example, the observed increase in resistance of the lateral resistive state can result from some combination of these effects.

In the example of FIGS. 16A-16C, the voltage-induced effects on $R_L$ are relatively small, but this is largely due to the presence of the thick Ta and Pt layers which are unaffected by Vg. Since the purpose of the Ta/Pt layer is to establish the correct magnetic properties, which are irrelevant for resistive switching, much larger changes in $R_L$ could readily be achieved by simply removing those layers. Such modifications, and any other modification for device optimization, are within the scope of this disclosure.

Example systems, methods, and apparatus herein provide bistable nonpolar memristive switching in the memristive devices that also demonstrate a magneto-ionic effect. In a non-limiting examples, the memristive devices can be based on Pt/Co/GdOx/Au multilayers. After electroforming, these example memristive devices can be electrically switched between a high and low resistance state, separated by 5 orders of magnitude in resistance. The observed switching behavior is consistent with observations of voltage-driven motion of the oxidation front and suggests that ionic species migration, such as but not limited to oxygen anions as the mobile species, is responsible for memristive switching.

The example memristive devices exhibit a unique combination of voltage-induced changes to electrical resistance and magnetic properties and also provide a new tool to investigate the microscopic processes responsible for memristive switching. With its high sensitivity to interface chemistry and structure, the thin conductive material layer could be used as a sense layer, providing otherwise hard to access information about structural and chemical changes at the electrode interfaces. As non-limiting examples, the memristive device can include a conductive material layer formed from a thin ferromagnetic layer, sandwiched between an oxide dielectric layer and electrodes.

Bistable switching of the lateral resistance in a nanostrip (or nanowire) device is also demonstrated. Comparison of magnetic and electrical properties reveals that this effect is likely due to voltage-driven modification of the Co/GdOx interface and likely oxidation of the Co layer itself. This lateral resistive switching mechanism provides a novel approach to realize micro and nanoscale electrical switches.

The example systems, methods, and apparatus herein provide memristive devices that exhibit two distinct memristive switching effects in addition to unprecedentedly strong magneto-ionic effects in the same device structure. The parameters that can be control by voltage in these devices include magnetic anisotropy, coercivity, saturation magnetization, DW motion, lateral electrical resistance, vertical electrical resistance and chemical composition. This multifunctionality indicates the impact and potential of solid state switching of oxygen stoichiometry as a route towards voltage programmable nano materials.

Figures 17A, 17B, 17C, 17D:
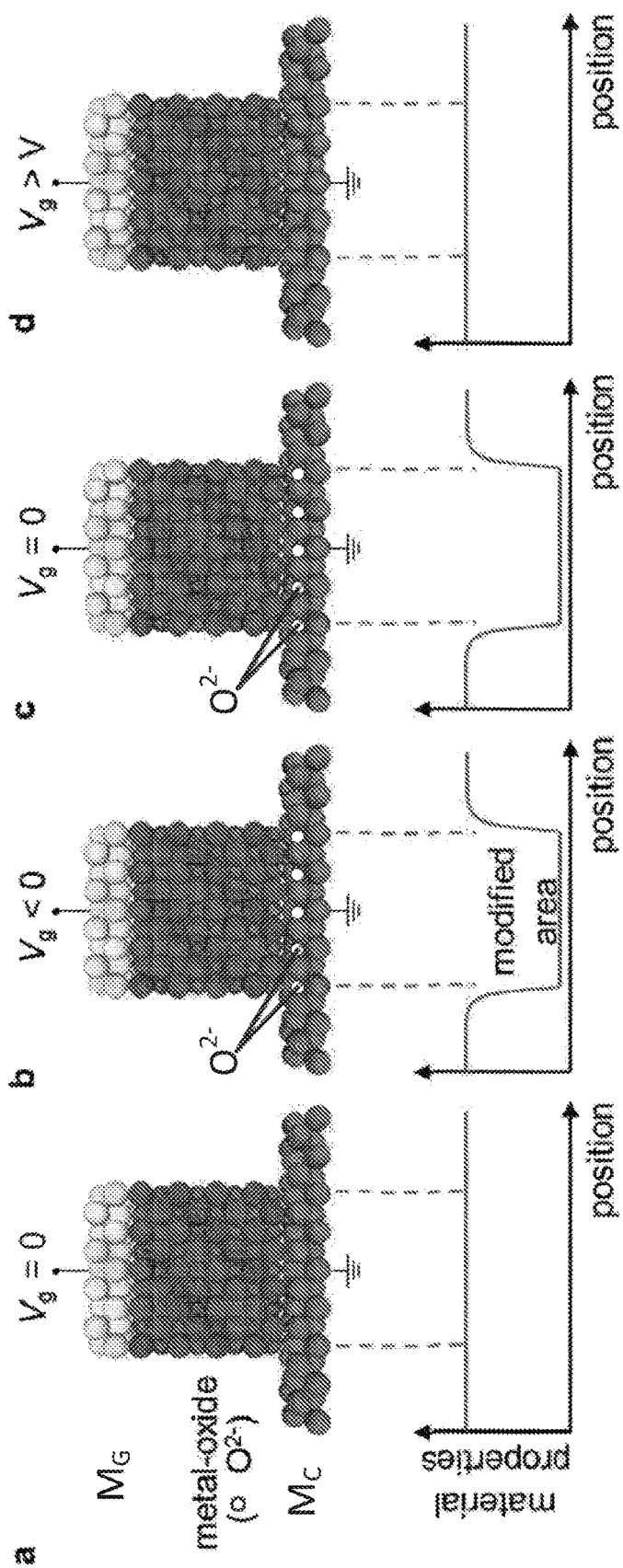
FIGS. 17A-17D shows a schematic illustration of memristive properties of an example device, according to principles of the present disclosure.

The example systems, methods, and apparatus herein provide for voltage control of material properties of example memristive devices through solid-state switching of interface oxygen chemistry. The example memristive devices are layered structures formed of a conductive material layer ($M_C$), a dielectric oxide material layer disposed over the conductive material layer, and a gate electrode ($M_G$) disposed over the dielectric material layer. FIGS. 17A-17D shows a schematic illustration of a metal/oxide/metal device and its material properties in the virgin state (FIG. 17A) and after sequential application of negative bias (FIG. 17B), zero bias (FIG. 17C) and positive bias (FIG. 17D). Under negative bias, oxygen anions move towards the bottom electrode and modify the oxygen stoichiometry at the metal/metal-oxide interface, thereby modifying the properties of the bottom electrode layer underneath the electrode area (FIG. 17B). The changes to the metal/metal-oxide interface and material properties persist at zero bias (FIG. 17C) and only application of a reverse bias return the interface and the material properties back to their initial state (FIG. 17D).

Based on these design principles, it is observed that relatively small changes in temperature and gate voltage can improve device response times by orders of magnitude and that by varying the thickness and morphology of the gate oxide and electrode, the magneto-ionic switching time drops from hundreds of seconds to hundreds of microseconds. Enhancement in performance and functionality may be achieved by using oxides with higher ionic conductivity, or designing gate oxide heterostructures that include separately optimized oxygen storage and ion conducting layers.

Based on magneto-ionic coupling, example systems, methods, and apparatus are provided to reversibly imprint material properties through local activation of ionic migration, which can be used to locally pattern magnetic anisotropy and resistive states. Since the magneto-ionic effect does not rely on maintaining an electrical charge, these anisotropy patterns persist in the power-off state but can be removed on demand by applying a reverse bias. The example systems, methods, and apparatus allow reversible patterning of magnetic microstructures without the need for lithography and materials processing.

Example systems, methods, and apparatus herein demonstrate the ability to reversibly control the interfacial oxygen stoichiometry in metal/metal-oxide bilayers at room temperature (RT) has implications in many different areas. FIGS. 18A-18F show plots of the use of gate voltages for control and programming of properties such as but not limited to magnetic anisotropy, coercivity, saturation magnetization, domain wall motion, lateral electrical resistance, vertical electrical resistance, and chemical composition by gate voltage. This multifunctionality across material properties and technology fields demonstrate the potential of solid state switching of interface oxygen chemistry as a path towards voltage programmable materials.

Example systems, methods, and apparatus herein provide memristive switching devices that can be used for the imaging of memristive switching processes, section by section. By using conductive material layers formed from magnetic layers that differ in their magnetic properties, several magnetic layers could be integrated simultaneously into the same memristive device. As a non-limiting example, a memristive switching device could be formed with two magnetic layers: (i) layer with high coercivity Hc at the bottom electrode/oxide interface, and (ii) a layer with low Hc at the oxide/top electrode interface. Due to the difference in Hc, the two layers and their magnetic properties should be distinguishable in MOKE measurements. From the evolution of the magnetic properties at the two electrodes, it would then be possible to determine at which electrode oxygen vacancies accumulate during electroforming, where filament formation initiates and where filament rupture occurs during SET and RESET of the memristive device. This example memristive device has tremendous potential in the convergence of magneto-electric and memristive switching devices. The capability of imaging memristive switching through magnetic sense layers presents a promising technique to gain additional insight into the microscopic details of memristive switching.

Example systems, methods, and apparatus herein provide memristive switching devices that can exhibit magneto-ionic switching on a faster timescale. Example memristive devices described herein are able to reduce the time required for magneto-ionic switching by 6 orders of magnitude, from hundreds of seconds to hundreds of microseconds. Although microsecond scale switching is sufficient for a wide range of application, for certain memory and logic devices, nanosecond switching is desirable. Since magneto-ionic switching relies on voltage-driven ion migration, further improvements in performance and functionality can likely be achieved by increasing ionic mobility and enhancing ionic exchange.

In some example implementations, the dielectric material layer of the example memristive switching devices could be formed from oxides with higher ionic conductivity, such as but not limited to yttria-stabilized zirconia (YSZ), or gate oxide heterostructures that include separately optimized oxygen storage and ion conducting layers. For example, the Pt/Co/YSZ system can exhibits strong memristive properties.

In some example implementations, the dielectric material layer of the example memristive switching devices could be formed with an optimized concentration of oxygen defects in the oxide layer for maximum ion conductivity. This can be achieved either by doping the oxide, or by carefully controlling the oxygen partial pressure during oxide deposition. Both methods could result in orders of magnitude improvements in magneto-ionic switching times.

Other non-limiting example applications of systems, devices, methods, and apparatus described herein include in security, military, and industrial applications. The example systems, devices, methods, and apparatus described herein can be implemented in spectroscopic applications as well.

In another non-limiting example, systems, devices, methods, and apparatus described herein can be made low-cost and/or disposable.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

In this respect, various aspects of the invention may be embodied at least in part as a computer readable storage medium (or multiple computer readable storage media) (e.g., a computer memory, one or more floppy disks, compact disks, optical disks, magnetic tapes, flash memories, circuit configurations in Field Programmable Gate Arrays or other semiconductor devices, or other tangible computer storage medium or non-transitory medium) encoded with one or more programs that, when executed on one or more computers or other processors, perform methods that implement the various embodiments of the technology discussed above. The computer readable medium or media can be transportable, such that the program or programs stored thereon can be loaded onto one or more different computers or other processors to implement various aspects of the present technology as discussed above.

The terms "program" or "software" are used herein in a generic sense to refer to any type of computer code or set of computer-executable instructions that can be employed to program a computer or other processor to implement various aspects of the present technology as discussed above. Additionally, it should be appreciated that according to one aspect of this embodiment, one or more computer programs that when executed perform methods of the present technology need not reside on a single computer or processor, but may be distributed in a modular fashion amongst a number of different computers or processors to implement various aspects of the present technology.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A memristive element comprising:
   a conductive material layer disposed in a x-y plane, the conductive material layer being configured to reversibly uptake an amount of at least one ionic species;
   a first electrode coupled proximate to a first end of the conductive material layer;
   a second electrode coupled proximate to a second end of the conductive material layer, opposite to the first end;
   a gate dielectric layer disposed over the conductive material layer, the gate dielectric layer being configured to supply to, or receive from, the conductive material layer, an amount of the at least one ionic species; and
   a gate electrode layer disposed over, and in electrical communication with, the gate dielectric material layer;
   an inert metal underlayer disposed in electrical communication with the conductive material layer and coupled to the first electrode and the second electrode to shunt a portion of a current flowing between the first electrode and the second electrode;
   the gate electrode layer, the gate dielectric layer, and the conductive material layer being configured such that:
   a first potential difference applied in a first direction between the gate electrode layer and the conductive material layer modifies a proportionate amount of the at least one ionic species in a portion of the conductive material layer to generate a first memristive state comprising a first lateral resistive state between the first electrode and the second electrode;
   a second potential difference applied in a second direction between the gate electrode layer and the conductive material layer modifies a proportionate amount of the at least one ionic species in a portion of the conductive material layer to generate a second memristive state comprising a second lateral resistive state between the first electrode and the second electrode that is different from the first lateral resistive state; and
   the memristive element persists in the first memristive state or the second memristive state in response to discontinuance of the first potential difference or the second potential difference, respectively.

2. The memristive element of claim 1, wherein the first memristive state further comprises a first vertical resistive state between the conductive material layer and the gate electrode layer, and wherein the second memristive state further comprises a second vertical resistive state between the conductive material layer and the gate electrode layer that is different from the first vertical resistive state.

3. The memristive element of claim 1, wherein the gate dielectric layer is a bilayer comprising an ionic species storage layer disposed over an ionic species transporting layer, and wherein the ionic species transporting layer of the bilayer is disposed over the conductive material layer.

4. The memristive element of claim 1, wherein the conductive material layer has a first lateral dimension in a x-direction, and wherein the gate electrode layer has a second lateral dimension in the x-direction that is smaller than the first lateral dimension.

5. The memristive element of claim 4, wherein the gate dielectric layer has a third lateral dimension in the x-direction that approximates the second lateral dimension.

6. The memristive element of claim 1, wherein the first lateral dimension of the conductive material layer is configured to tune the first memristive state and the second memristive state.

7. The memristive element of claim 1, wherein the thickness in a z-direction of the inert metal underlayer is configured to cause a greater proportion of current applied between a third electrode and a fourth electrode to flow through the inert metal underlayer, thereby modifying the first lateral resistive state and the second lateral resistive state.

8. The memristive element of claim 1, wherein the thickness in a z-direction of the inert metal underlayer is configured to cause a smaller proportion of current applied between the third electrode and the fourth electrode to flow through the inert metal underlayer, thereby modifying the first lateral resistive state and the second lateral resistive state.

9. The memristive element of claim 1, wherein a thickness of the inert metal underlayer in a z-direction is configured to tune the first memristive state and the second memristive state.

10. The memristive element of claim 1, further comprising:
    a third electrode coupled to the first end of the conductive material layer; and
    a fourth electrode coupled to the second end of the conductive material layer,
    wherein a current is applied across the third electrode and the fourth electrode.

11. The memristive element of claim 1, wherein the gate dielectric layer is formed from an oxide, oxynitride, or silicate of a rare earth metal or a transition metal, yttria-stabilized zirconia (YSZ), or a gate oxide heterostructure.

12. The memristive element of claim 1, wherein the conductive material layer has a longitudinal conformation in the x-y plane.

13. The memristive element of claim 12, wherein the conductive material layer comprises at least one nanostrip.

14. The memristive element of claim 13, wherein the at least one nanostrip has a first end, a second end, and a central region, wherein the first lateral dimension of the gate dielectric layer is less than a length of the at least one nanostrip, and wherein the gate dielectric layer is disposed over a portion of the central region of the at least one nanostrip.

15. The memristive element of claim 1, wherein the conductive material layer is disposed over at least one of: an electrically conductive layer, at least one ferromagnetic material layer, at least one oxide dielectric layer, a tunnel barrier layer, and an integrated circuit.

16. The memristive element of claim 1, wherein:
    the gate dielectric layer comprises two or more gate dielectric layers disposed over spaced apart respective regions of the conductive material layer, each having a respective lateral dimension in a x-direction that is smaller than a first lateral dimension in the x-direction of the conductive material layer; and
    the gate electrode layer comprises two or more gate electrode layers, each disposed over, and in electrical communication with, a respective gate dielectric layer of the two or more gate dielectric layers, thereby providing a multi-bit device.

17. The memristive element of claim 16, wherein each respective lateral dimension has a differing value such that a potential difference applied at each respective gate electrode modifies the first memristive state and the second memristive state at each respective region of the memristive element by a preselected fractional amount, thereby providing a multi-bit storage device.

18. The memristive element of claim 16, further comprising an inert metal underlayer disposed in electrical communication with a portion of the conductive material layer proximate to at least one gate dielectric layer of the two or more gate dielectric layers, wherein a thickness of the inert metal underlayer has a predetermined value such that a potential difference applied at each respective gate electrode modifies the first memristive state and the second memristive state at each respective region of the memristive element by a preselected fractional amount, thereby providing a multi-bit storage device.

19. The memristive element of claim 16, wherein all bits of the multi-bit device are addressed simultaneously by probing a resistance state of the conductive material layer.

20. The memristive element of claim 16, wherein the conductive material layer is disposed over at least one of: an electrically conductive layer, at least one ferromagnetic material layer, at least one oxide dielectric layer, a tunnel barrier layer, and an integrated circuit.

21. The memristive element of claim 1, wherein the conductive material layer comprises aluminum, a transition metal, a rare earth metal, or an alloy of any of these materials.

22. An apparatus comprising:
a conductive material layer disposed on a substrate;
an inert metal layer disposed in electrical contact with the conductive material layer;
first and second electrodes disposed in contact with the conductive material layer and coupled to the inert metal layer, the inert metal layer shunting a portion of a current flowing between the first electrode and the second electrode;
a gate dielectric material layer comprising at least one ionic species, the gate dielectric material layer being electrically in contact with the conductive material layer; and
a gate electrode disposed in electrical contact with the gate dielectric material layer.

23. The apparatus of claim 22, wherein the inert metal layer comprises a noble metal.

24. The apparatus of claim 22, wherein first and second electrodes are disposed at opposed ends of the conductive material layer.

25. A method of operating a memristive device, the method comprising:
applying a potential difference at a region of a gate electrode and a transition metal layer of a memristive device, the memristive device comprising:
the transition metal layer disposed in a x-y plane, the transition metal layer having a first lateral dimension in the x-direction and being configured to reversibly uptake an amount of at least one ionic species;
a first electrode coupled proximate to a first end of the transition metal layer;
a second electrode coupled proximate to a second end of the transition metal layer, opposite to the first end;
an inert metal underlayer disposed in electrical communication with the transition metal layer and coupled to the first electrode and the second electrode to shunt a portion of a current flowing between the first electrode and the second electrode;
a gate oxide dielectric layer comprising a rare earth oxide or a transition metal oxide, the gate oxide dielectric layer being disposed over the transition metal layer, the gate oxide dielectric layer having a second lateral dimension in the x-direction that is smaller than the first lateral dimension, and the gate oxide dielectric layer being configured to supply to, or receive from, the transition metal layer an amount of the at least one ionic species; and
the gate electrode layer disposed over, and in electrical communication with, the gate oxide dielectric material layer;
measuring a lateral resistive state between the first electrode and the second electrode;
wherein the gate electrode layer, the gate oxide dielectric layer, and the transition metal layer are configured such that:
the measuring indicates a first vertical resistive state and a first lateral resistive state in response to applying a first potential difference in a first direction; and
the measuring indicates a second vertical resistive state that is different from the first vertical resistive state and a second lateral resistive state that is different from the first lateral resistive state in response to applying a second potential difference in a second direction that is opposite to the first direction.

* * * * *